(12) United States Patent
Szwarcman et al.

(10) Patent No.: US 10,495,917 B2
(45) Date of Patent: Dec. 3, 2019

(54) PROTECTIVE LAYERS PRODUCED BY UV CURING PROCESSES

(71) Applicant: StoreDot Ltd., Herzeliya (IL)

(72) Inventors: Daniel Szwarcman, Pardes-Hanna Karkur (IL); Elad Cohen, Tel Aviv (IL); Mor Shmuel Armon, Ramat-Gan (IL); Evgenia Liel (Jeny) Kuks, Ramat Gan (IL); Rony Schwarz, Kibbutz Ma'anit Menashe (IL); Elena Eisurovich, Hadera (IL); Daniel Aronov, Netanya (IL); Eran Sella, Tel-Aviv (IL)

(73) Assignee: Storedot Ltd., Herzeliya (IL)

( * ) Notice: Subject to any disclaimer, the term of this patent is extended or adjusted under 35 U.S.C. 154(b) by 104 days.

(21) Appl. No.: 15/353,509

(22) Filed: Nov. 16, 2016

(65) Prior Publication Data

US 2017/0139271 A1    May 18, 2017

Related U.S. Application Data

(63) Continuation-in-part of application No. 15/252,492, filed on Aug. 31, 2016, now Pat. No. 9,771,480, and a continuation-in-part of application No. 15/252,597, filed on Aug. 31, 2016, now Pat. No. 10,100,197.

(60) Provisional application No. 62/255,857, filed on Nov. 16, 2015, provisional application No. 62/255,853, filed on Nov. 16, 2015, provisional application No. 62/255,860, filed on Nov. 16, 2015.

(51) Int. Cl.
| | | |
|---|---|---|
| G02F 1/1335 | (2006.01) | |
| G02B 1/14 | (2015.01) | |
| C09K 11/06 | (2006.01) | |
| C09D 163/00 | (2006.01) | |

(52) U.S. Cl.
CPC ..... G02F 1/133514 (2013.01); C09D 163/00 (2013.01); C09K 11/06 (2013.01); G02B 1/14 (2015.01); C09K 2211/1007 (2013.01); C09K 2211/1029 (2013.01); C09K 2211/1088 (2013.01); G02F 2001/133614 (2013.01)

(58) Field of Classification Search
CPC ................................................ G02F 1/133514
See application file for complete search history.

(56) References Cited

U.S. PATENT DOCUMENTS

| | | | |
|---|---|---|---|
| 3,996,192 A | 12/1976 | Hahnke et al. | |
| 5,250,214 A | 10/1993 | Kanemoto et al. | |
| 5,459,268 A | 10/1995 | Haugland et al. | |
| 5,610,932 A | 3/1997 | Kessler et al. | |
| 5,686,261 A | 11/1997 | Zhang et al. | |
| 5,851,621 A | 12/1998 | Wolleb et al. | |
| 6,243,151 B1 | 6/2001 | Nose et al. | |
| 6,576,352 B2 | 6/2003 | Hirari | |
| 7,704,284 B2 | 4/2010 | Eliu et al. | |
| 7,986,087 B2 | 7/2011 | Asano et al. | |
| 8,163,910 B2 | 4/2012 | Lukhtanov | |
| 8,580,579 B2 | 11/2013 | Hell et al. | |
| 8,735,444 B2 | 5/2014 | Hell et al. | |
| 9,105,785 B2 | 8/2015 | Shmueli et al. | |
| 9,618,665 B2 | 4/2017 | Ito et al. | |
| 9,771,480 B2 | 9/2017 | Kuks et al. | |
| 9,868,859 B2 | 1/2018 | Szwarcman et al. | |
| 2004/0135495 A1 | 7/2004 | Wu et al. | |
| 2004/0135502 A1 | 7/2004 | Kobayashi et al. | |
| 2004/0142137 A1 | 7/2004 | Lehmann et al. | |
| 2004/0225037 A1 | 11/2004 | Lam et al. | |
| 2005/0170363 A1 | 8/2005 | Reddington et al. | |
| 2007/0134596 A1 | 6/2007 | Lungu | |
| 2009/0004462 A1 | 1/2009 | Zhang et al. | |
| 2009/0213296 A1 | 8/2009 | Park et al. | |
| 2009/0306277 A1 | 12/2009 | Goenner et al. | |
| 2010/0183805 A1 | 7/2010 | Nieminen | |
| 2010/0330380 A1 | 12/2010 | Colreavy et al. | |
| 2011/0082273 A1 | 4/2011 | Laas et al. | |

(Continued)

FOREIGN PATENT DOCUMENTS

| | | |
|---|---|---|
| EP | 0805441 | 11/1997 |
| EP | 2253635 | 11/2010 |

(Continued)

OTHER PUBLICATIONS

Office Action for U.S. Appl. No. 15/691,776, dated Feb. 27, 2019.
U.S. Appl. No. 15/252,597, filed Aug. 31, 2016, Kuks et al.
U.S. Appl. No. 15/691,774, filed Aug. 31, 2017, Armon et al.
U.S. Appl. No. 15/691,775, filed Aug. 31, 2017, Szwarcman et al.
U.S. Appl. No. 15/691,776, filed Aug. 31, 2017, Kuks et al.
Drexhage, K. H. "Fluorescence efficiency of laser dyes. [Xanthenes, oxazines 7-aminocoumarins]" J. Res. Natl. Bur. Stand., A; 1976 vol. 80:3.
Lakowicz, "Principles of Fluorescence Spectroscopy", Springer, third edition, 2006.

(Continued)

*Primary Examiner* — Joseph R Kosack
(74) *Attorney, Agent, or Firm* — Pearl Cohen Zedek Latzer Baratz LLP

(57) ABSTRACT

Color conversion films for a LCD (liquid crystal display) having RGB (red, green, blue) color filters, as well as such displays, formulations, precursors and methods are provided, which improve display performances with respect to color gamut, energy efficiency, materials and costs. The color conversion films absorb backlight illumination and convert the energy to green and/or red emission at high efficiency, specified wavelength ranges and narrow emission peaks. For example, rhodamine-based fluorescent compounds are used in matrices produced by sol gel processes and/or UV (ultraviolet) curing processes which are configured to stabilize the compounds and extend their lifetime— to provide the required emission specifications of the color conversion films. Film integration and display configurations further enhance the display performance with color conversion films utilizing various color conversion elements.

7 Claims, 22 Drawing Sheets

(56) References Cited

U.S. PATENT DOCUMENTS

| | | |
|---|---|---|
| 2012/0024345 A1 | 2/2012 | Reisfeld et al. |
| 2012/0054345 A1 | 3/2012 | Reisfeld et al. |
| 2012/0135459 A1 | 5/2012 | Hell et al. |
| 2012/0138124 A1 | 6/2012 | Shmueli et al. |
| 2014/0118814 A1 | 5/2014 | Uhm et al. |
| 2014/0186679 A1 | 7/2014 | Archer et al. |
| 2014/0208978 A1 | 7/2014 | Sunder et al. |
| 2016/0146987 A1 | 5/2016 | Ito et al. |
| 2016/0251516 A1 | 9/2016 | Sorenden et al. |
| 2017/0037259 A1 | 2/2017 | Wang |
| 2017/0137626 A1 | 5/2017 | Kuks et al. |
| 2017/0137627 A1 | 5/2017 | Szwarcman et al. |
| 2017/0137628 A1 | 5/2017 | Szwarcman et al. |
| 2017/0137630 A1 | 5/2017 | Szwarcman et al. |
| 2017/0137705 A1 | 5/2017 | Szwarcman et al. |
| 2017/0139270 A1 | 5/2017 | Szwarcman et al. |
| 2017/0139271 A1 | 5/2017 | Szwarcman et al. |
| 2017/0139277 A1 | 5/2017 | Szwarcman et al. |
| 2017/0283616 A1 | 10/2017 | Kuks et al. |
| 2018/0051174 A1 | 2/2018 | Szwarcman et al. |
| 2018/0057689 A1 | 3/2018 | Kuks et al. |
| 2018/0105696 A1 | 4/2018 | Kuks et al. |
| 2018/0208839 A1 | 7/2018 | Szwarcman et al. |

FOREIGN PATENT DOCUMENTS

| | | |
|---|---|---|
| EP | 2305691 | 4/2011 |
| EP | 2752464 | 7/2014 |
| JP | 62278570 | 12/1987 |
| JP | 2005002290 | 1/2005 |
| JP | 2006306933 | 11/2006 |
| JP | 2012/233151 | 11/2012 |
| JP | 2017125123 | 7/2017 |
| WO | WO-2004/101709 | 11/2004 |
| WO | WO 2008/111949 | 9/2008 |
| WO | WO 2010/149190 | 12/2010 |
| WO | WO-2011/123820 | 10/2011 |
| WO | WO-2013/056720 | 4/2013 |
| WO | WO 2013/103156 | 7/2013 |
| WO | WO-2015/016175 | 2/2015 |
| WO | WO 2015/097262 A1 | 7/2015 |
| WO | WO 2016/121194 | 8/2016 |
| WO | WO-2017085720 | 5/2017 |

OTHER PUBLICATIONS

Sinel'Nikov et al. "Fluorescence of the lactone form of rhodamine B", Russian Journal of Physical Chemistry A Aug. 2013, vol. 87, Issue 8, pp. 1409-1416.
Belov et al. "Rhodamine spiroamides for multicolor single-molecule switching fluorescent nanoscopy", Chemistry. Oct. 19, 2009;15(41):10762-76.
Kobayashi et al. "LCD Backlights", Wiley, 2009.
"Rhodamine Dyes", IUPAC Gold Book, 1995, accessed Aug. 7, 2017.
Office Action of U.S. Appl. No. 15/415,886 dated Aug. 11, 2017.
Geffroy et al."Organic light-emitting diode (OLED) technology: materials, devices and display technologies", Polymer International, 2006, vol. 55, pp. 572-582.
Liu et al. "Manipulation of exciton distribution for high-performance fluorescent/phosphorescent hybrid white organic light-emitting diodes", Journal of Materials Chemistry C, 2017, vol. 5, pp. 7668-7683.
Reineke et al. "White organic light-emitting diodes: Status and perspective", Reviews of Modern Physics, Jul. 30, 2013, vol. 85, No. 3, pp. 1245-1293.
Jbeily et al. "Synthesis of fluorinated rhodamines and application for confocal laser scanning microscopy" Department of Chemistry, Martin Luther University Halle-Wittenberg, D-06099 Halle (Saale), Germany, Journal of Fluorine Chemistry 189 (2016) pp. 70-78.
Polyakova et al. "New GM1 Ganglioside Derivatives for Selective Single and Double Labelling of the Natural Glycosphingolipid Skeleton" European Journal of Organic Chemistry, 2009 (30), pp. 5162-5177.
Lueder "Liquid Crystal Displays" University of Stuttgart, Germany and Electro-Optical Consultancy, LLC, USA, This edition first published 2010, John Wiley & Sons, Ltd.
Peter Edman et al."Extended Förster theory of donor-donor energy migration in bifluorophoric macromolecules. Part II. Method for determining intramolecular distances with experimental validation using mono and bifluorophoric systems" Physical Chemistry Chemical Physics, pp. 2795-2801, May 25, 2000.
Chemical Abstracts Service 2018 American Chemical Society Registry Excerpts p. 1.
US Office Action for U.S. Appl. No. 15/691,776, dated Feb. 14, 2018.
SciFinder 2018, American Chemical Society (ACS) Registry Excerpts, 24 pages.
US Office Action for U.S. Appl. No. 15/353,294, dated Apr. 2, 2018.
US Notice of Allowance for U.S. Appl. No. 15/691,774, dated Apr. 3, 2018.
US Office Action for U.S. Appl. No. 15/785,443, dated May 3, 2018.
Madsen et al. "Synthesis of Rhodamine 6G-Based Compounds for the ATRP Biocompatible polymers", Biomacromolecules, Jun. 13, 2011, vol. 12, No. 6, pp. 2225-2234.
International Search Report of PCT Application No. PCT/IL2016/050955 dated Nov. 23, 2016.
International Search Report of PCT Application No. PCT/IL2016/050951 dated Nov. 25, 2016.
Nguyen et al., "Practical Synthetic Route to Functionalized Rhodamine Dyes", Organic Letters, Sep. 1, 2003, vol. 5, No. 18, pp. 3245-3248.
Kolmakov et al. "Polar Red-Emitting Rhodamine Dyes with Reactive Groups: Synthesis, Photophysical Properies, and Two-Color STED Nanoscopy Applications", Chemistry—A European Journal, Dec. 11, 2013, vol. 20, No. 1, pp. 146-157.
Gyuzel et al. "Functionalization of the meso-phenyl Ring of Rhodamine Dyes Trough S N Ar with Sulfur Nuclephiles: Synthesis, Biophysical Characterization, and Comprehensive NMR Analysis", European Journal of Organic Chemistry, Jan. 1, 2015, vol. 2015, No. 2, pp. 337-349.
Uddin et al. "Synthesis of 5- and 6-Carboxy-X-rhodamines", Organic Letters, Nov. 6, 2008, vol. 10, No. 21, pp. 4799-4801.
Reisfeld et al. "Solid-state lasers based on inorganic-organic hybrid materials obtained by combined sol-gel polymer technology", Polym. Adv. Technol., May 19, 2004, vol. 15, No. 6, pp. 291-301.
Reisfeld, "Doped polymeric systems produced by sol-gel technology: optical properties and potential industrial applications", Polimery, Jan. 2006, vol. 51, No. 2, pp. 95-103.
Kazes et al. "Organic-Inorganic Sol-Gel Composites Incorporating Semiconductor Nanocrystals for Optical Gain Applications", Advanced Materials, May 4, 2009, vol. 21, No. 17, pp. 1716-1720.
Kazes et al. "Blue laser dye spectroscopic properties in solgel inorganic-organic hybrid films", Optics Letters, Feb. 1, 2006, vol. 31, No. 3, pp. 356-358.
Deshpande et al. "Efficient lasing acting from Rhodamine-110 (RH-110) impregnated sol-gel silica samples prepared by dip method", Journal of Luminescence, May 2010, vol. 130, No. 5, pp. 839-844.
Yariv et al. "Efficiency and photostabilty of dye-doped solid-state lasers in different hosts" Optical Materials, Feb. 2001, vol. 16. No. 1-2, pp. 29-38.
U.S. Appl. No. 15/959,329, filed Apr. 23, 2018, Szwarcman et al.
U.S. Appl. No. 16/005,730, filed Jun. 12, 2018, Schwarz et al.
US Office Action for U.S. Appl. No. 15/661,151, dated Jul. 3, 2018.
Office Action for U.S. Appl. No. 15/841,347, dated Dec. 27, 2018.
Notice of Allowance for U.S. Appl. No. 15/661,151, dated Dec. 27, 2018.
Young-Noon Ahn et al. "Combinatorial Rosamine Library and Application to in Vivo Glutathione Probe" J. Am. Chem. Soc., Mar. 23, 2007, 129 (15), pp. 4510-4511.
Young-Hoon Ahn et al. "Combinatorial Rosamine Library and Application to in Vivo Glutathione Probe"J. Am. Chem. Soc., Mar. 23, 2007, 129 (15), Supporting Information pp. S1-S15.
Siang Hui Lim, et al. "Rosamines Targeting the Cancer Oxidative Phosphorylation Pathway" PLoS One. Mar. 12, 2014; 9(3): e82934.
Database Registry Chemical Abstracts Service, Columbus Ohio, accesses via SCIFINDER, Dec. 18, 2018, pp. 1-2.

(56) References Cited

OTHER PUBLICATIONS

International Search Report for PCT application No. PCT/IL2016/051234, dated Mar. 14, 2017.
Inoue et al. "Development of Color Resists Containing Novel Dyes for Liquid Crystal Displays" translated from R&D Report, "Sumitomo Kagaku", Nov. 35, 2013, pp. 1-7.
Non-final office action of U.S. Appl. No. 15/353,015, dated Apr. 6, 2017.
Office Action of U.S. Appl. No. 15/252,492, dated Jan. 17, 2017.
Zhang et al. "Fluorescence lifetimes and quantum yields of ten rhodamine derivatives: Structural effect on emission mechanism in different solvents", Journal of Luminescence vol. 145, Jan. 2014, pp. 448-453.
Mitronova et al. "New fluorinated rhodamines for optical microscopy and nanoscopy", Chemistry, Apr. 19, 2010; vol. 16, No. 15, pp. 4477-4488.
Soibinet et al. "Rhod-5N as a fluorescent molecular sensor of cadmium(II) ion", J Fluoresc. Nov. 2008; vol. 18, No. 6, pp. 1077-1082.
Pal et al. "Spectroscopic and photophysical properties of some new rhodamine derivatives in cationic, anionic and neutral micelles", Journal of Photochemistry and Photobiology A: Chemistry, vol. 98, Issues 1-2, Aug. 2, 1996, pp. 65-72.
Mottram et al. "Hydrophobic analogues of rhodamine B and rhodamine 101: potent fluorescent probes of mitochondria in living C. elegans", Beilstein J Org Chem. 2012, vol. 8, pp. 2156-2165.
Kim et al. "Sol-Gel Derived Transparent Zirconium-Phenyl Siloxane Hybrid for Robust High Refractive Index LED Encapsulant" ACS Applied Materials & Interfaces, Feb. 24, 2014, vol. 6, No. 5, pp. 3115-3121.
Ross et al. "Facile Synthesis of Rhodamine Esters using Acetyl Chloride in Alcohol Solution" Journal Synthetic Communications, vol. 36, No. 12, 2006, pp. 1745-1750.
Office action of U.S. Appl. No. 15/691,775, dated May 7, 2019.
Notice of Allowance of U.S. Appl. No. 15/841,347, dated May 16, 2019.
Viktoria Levchenko et al. "Enhancement of luminescence of Rhodamine B by gold nanoparticles in thin films on glass for active optical materials applications" vol. 34, Issue 2, Dec. 2011, pp. 360-364.
Office Action for U.S. Appl. No. 15/924,302, dated Jul. 25, 2019.

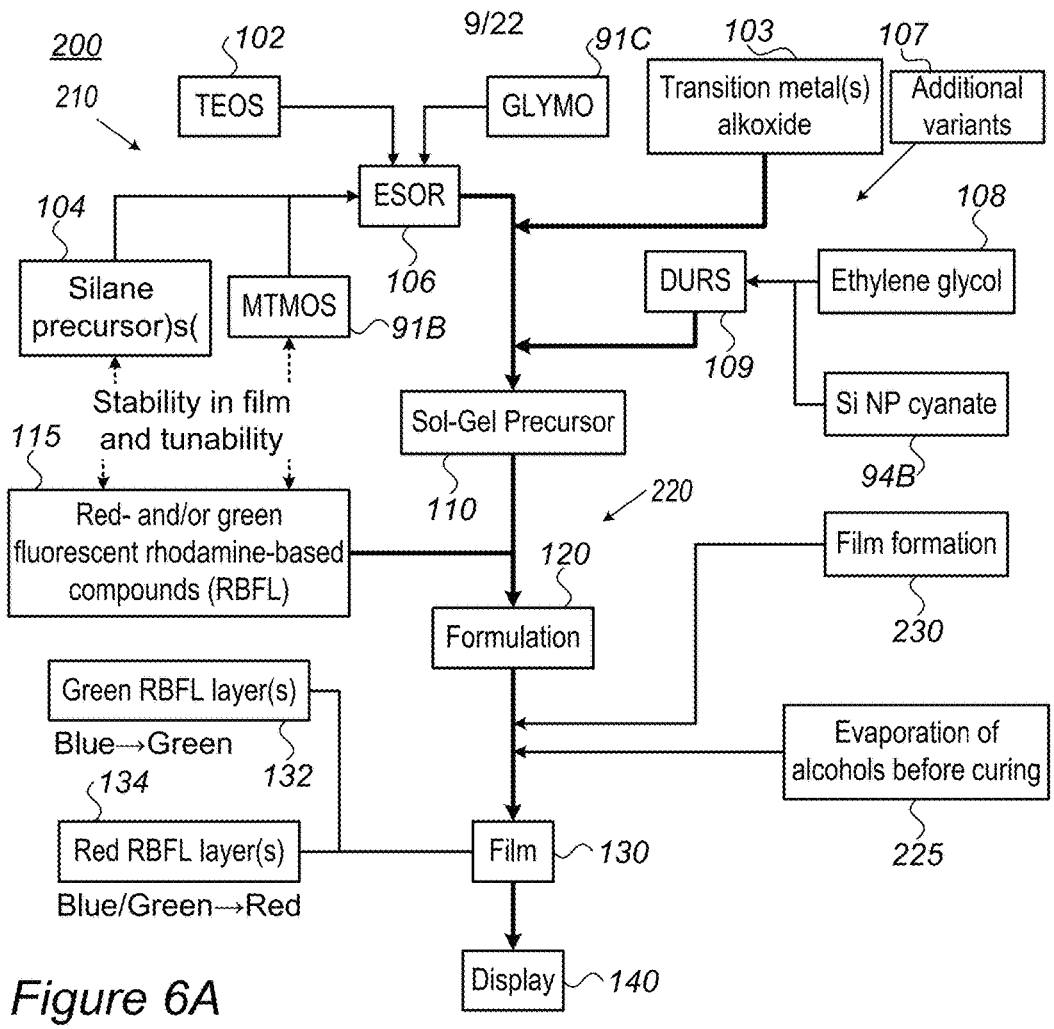
*Figure 6A*
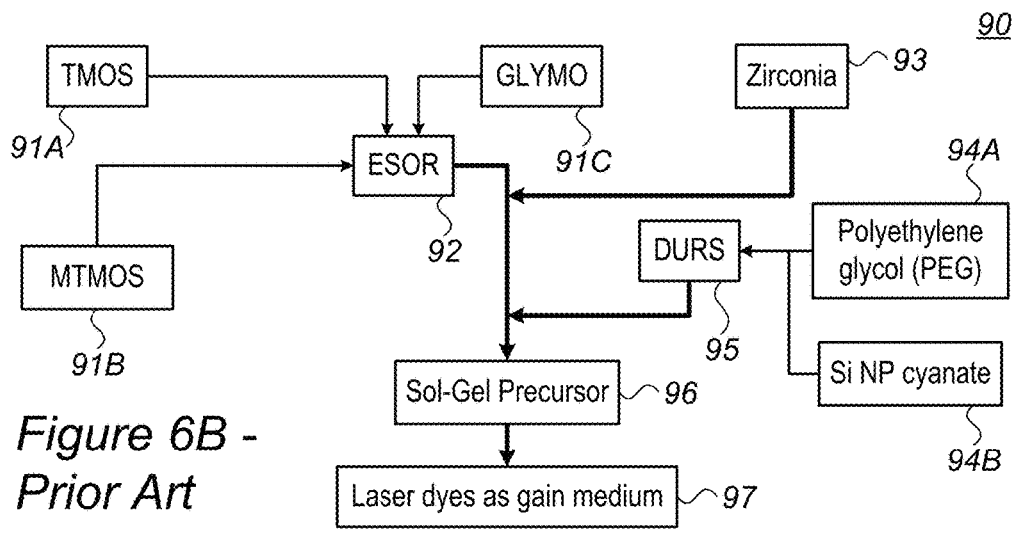
*Figure 6B - Prior Art*

```
                                              105
                                               |                                    ┌─ 200
                ┌──────────────────────────────┴──────────────────────────────────┐/
                │ Preparing a hybrid sol-gel precursor formulation of ESOR, DURS and metal(s) alkoxide │
                │ matrix, using TEOS and optionally TMOS derivative(s) in the ESOR and ethylene glycol │
                │                              in the DURS                                             │
                └──────────────────────────────┬──────────────────────────────────┘
                  ) 210                        │
                                  ┌────────────┴─────────────────────┐
                                  │ Preparing the formulation under acidic conditions │─── 212
                                  └────────────┬─────────────────────┘
                                  ┌────────────┴─────────────────────────────────┐
                                  │ Adjusting types and amounts of the TMOS derivatives │─── 215
                                  │  to tune emission wavelengths of the fluorophores    │
                                  └────────────┬─────────────────────────────────┘
                                  ┌────────────┴─────────────────────────────────┐
                                  │ Mixing the prepared hybrid sol-gel precursor with   │─── 220
                                  │ rhodamine-based photo fluorescent (RBF) compound(s) │
                                  └────────────┬─────────────────────────────────┘
                                  ┌────────────┴──────────────────┐
                                  │ Evaporating alcohols from the mixture │─── 225
                                  └────────────┬──────────────────┘
                        ┌────────────────────┴────────────────────────────────┐
                        │ Spreading and drying the mixture to form a film (e.g., by bar coating) │─── 230
                        └────────────────────┬────────────────────────────────┘
                        ┌────────────────────┴────────────────────────────┐
                        │ Drying the mixture by heating, evaporating and/or IR radiation │─── 240
                        └────────────────────┬────────────────────────────┘
                                                                                      ┌─ 300
                ┌──────────────────────────────┴─────────────────────────────────┐   /
                │ Preparing a formulation from 65-70% monomers, 25-30% oligomers, 5% photointiator │
                │                           and RBF compound(s)                                    │
                └──────────────────────────────┬─────────────────────────────────┘
                  ) 310                        │
                                  ┌────────────┴──────────────┐
                                  │ Spreading the formulation to form a film │─── 330
                                  └────────────┬──────────────┘
                                  ┌────────────┴──────────┐
                                  │ UV curing the formulation │─── 340
                                  └────────────┬──────────┘
                          ┌──────────────────┴──────────────────────────────┐
                          │ Determining UV curing parameters to avoid damage to the │─── 345
                          │                  RBF compound(s)                        │
                          └──────────────────┬──────────────────────────────┘
                                             ▼
```

*Figure 14 (Continued, 1.)*

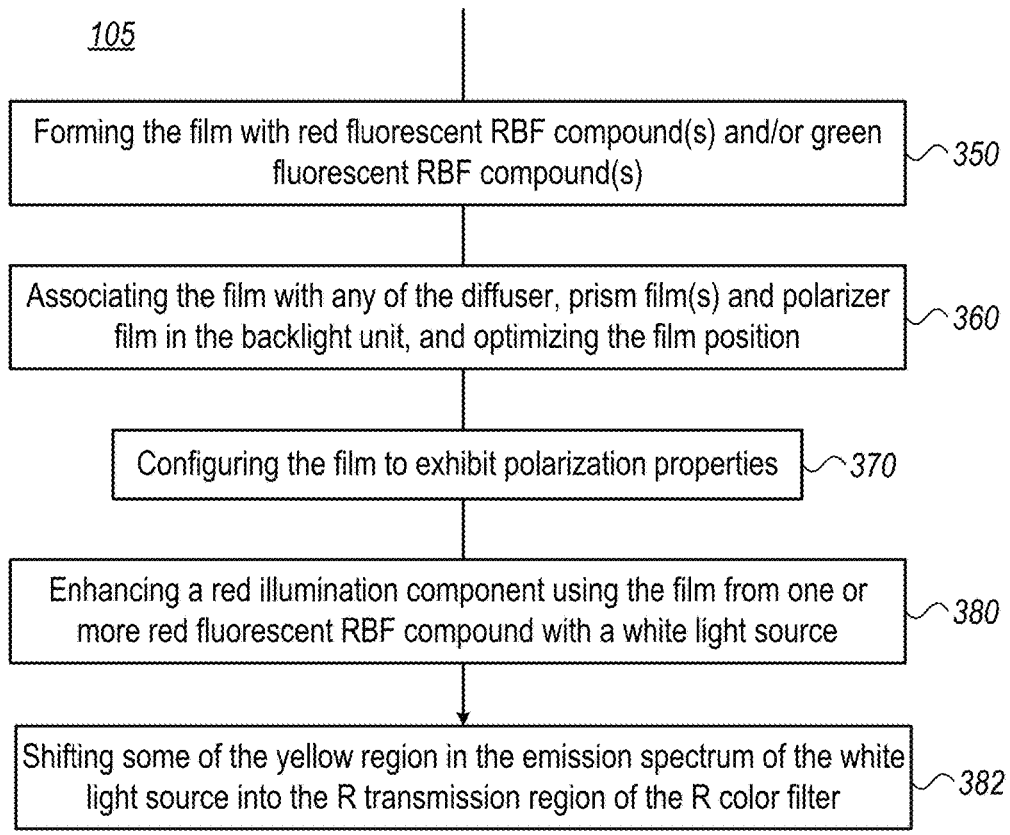
Figure 14 (Continued, 2.)

PROTECTIVE LAYERS PRODUCED BY UV CURING PROCESSES

CROSS REFERENCE TO RELATED APPLICATIONS

This application is a continuation-in-part of U.S. application Ser. No. 15/252,597, filed on Aug. 31, 2016; and a continuation-in-part of U.S. application Ser. No. 15/252,492, filed on Aug. 31, 2016, which claims the benefit of U.S. Provisional Application No. 62/255,853 filed on Nov. 16, 2015; and this application further claims the benefit of U.S. Provisional Application Nos. 62/255,853, 62/255,857 and 62/255,860, all filed on Nov. 16, 2015. All these applications are hereby incorporated by reference in their entirety.

BACKGROUND OF THE INVENTION

1. Technical Field

The present invention relates to the field of color conversion films in displays, and more particularly, to color conversion films with fluorescent compounds.

2. Discussion of Related Art

Improving displays with respect to their energy efficiency and color gamut performance is an ongoing challenge in the industry. While color conversion films are available which use quantum dots to enhance display performance, it is particularly challenging to achieve comparable goals in ways that do not involve heavy metals such as toxic cadmium used in quantum dots.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides a color conversion film for a LCD (liquid crystal display) having RGB (red, green, blue) color filters, the color conversion film comprising color conversions elements selected to absorb illumination from a backlight source of the LCD and have at least one of a R emission peak and a G emission peak.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIG. 6A is a high level schematic illustration of precursors, formulations, films and displays, according to some embodiments of the invention. FIG. 6B illustrates schematically prior art methods according to Reisfeld 2006.

DETAILED DESCRIPTION OF THE INVENTION

Figure 1:
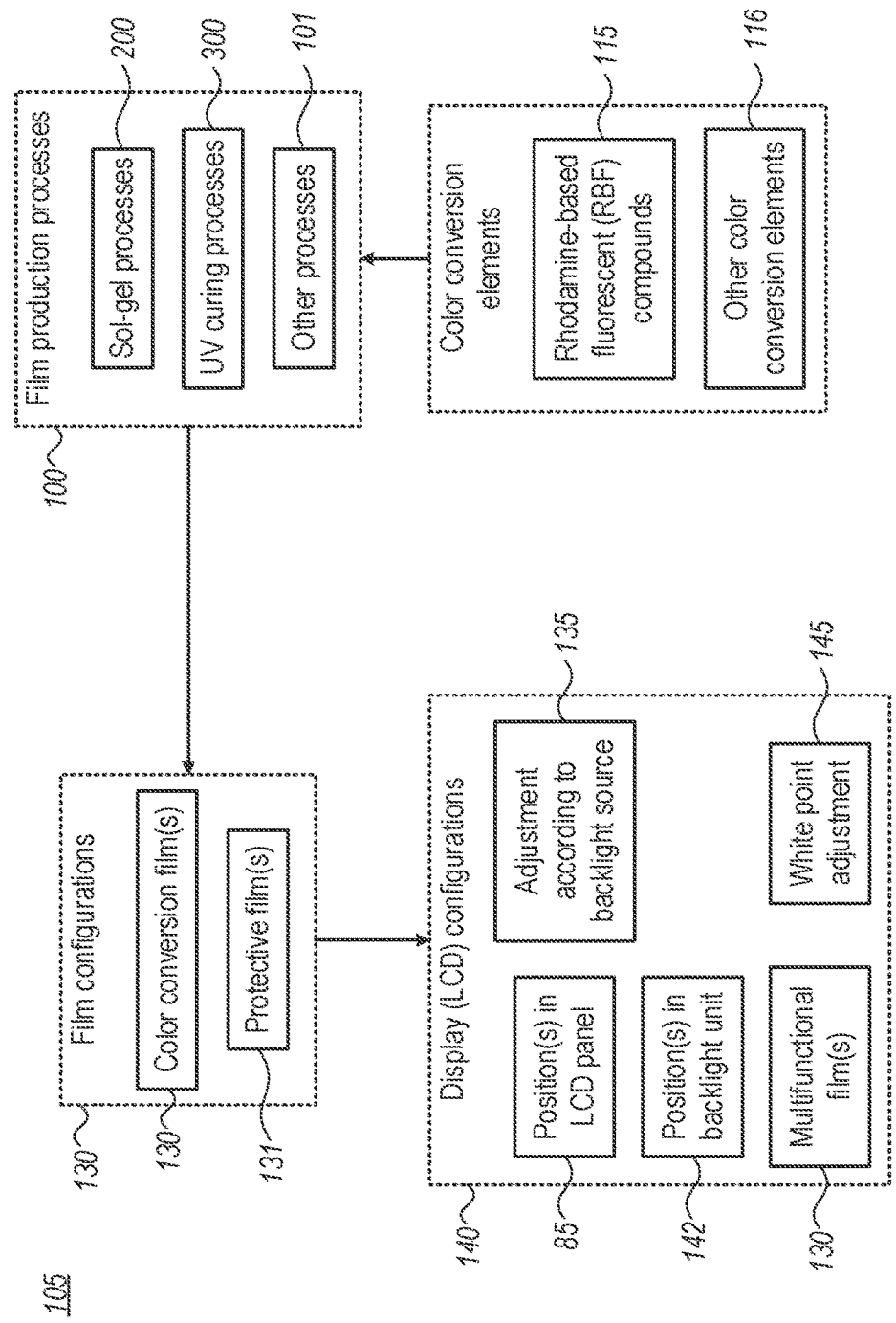
FIG. 1 is a high level schematic overview illustration of disclosed film production processes, film configurations and display configurations, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein is for the purpose of description and should not be regarded as limiting.

Facing the challenge of improving the efficiency and color performance of displays without having to rely on compounds involved in displays containing quantum-dot-based technologies (e.g., in color filters, color conversion materials etc.), the inventors have discovered ways of using organic molecules to significantly improve display properties. In the following, display configurations are presented with respect to the use of color conversion films and then sol-gel and UV (ultraviolet) technologies are disclosed for preparing color conversion films as well as for preparing associated protective films or coatings for the color conversion films.

Color conversion films for a LCD (liquid crystal display) having RGB (red, green, blue) color filters, as well as such displays, formulations, precursors and methods are provided, which improve display performances with respect to color gamut, energy efficiency, materials and costs. The color conversion films absorb backlight illumination and convert the energy to green and/or red emission at high efficiency, specified wavelength ranges and narrow emission peaks. For example, rhodamine-based fluorescent compounds are used in matrices produced by sol gel processes and/or UV (ultraviolet) curing processes which are configured to stabilize the compounds and extend their lifetime—to provide the required emission specifications of the color conversion films. Film integration and display configurations further enhance the display performance with color conversion films utilizing various color conversion elements.

FIG. 1 is a high level schematic overview illustration of disclosed film production processes 100, film configurations 130 and display configurations 140, according to some embodiments of the invention. Embodiments combine color conversion elements (such as rhodamine-based fluorescent (RBF) compounds 115 and/or other color conversion elements 116 such as fluorescent organic and/or inorganic compounds, quantum dots etc.) into films 130 by various film production processes 100 (such as sol gel processes 200, UV curing processes 300 and/or other processes 101) to yield a variety of film configurations 130 such as color conversion films 130 and/or protective films 131 (which may be also color conversion films 130), which are then used in a variety of display configurations 140. Films 130, 131 prepared by as sol gel processes 200 and UV curing processes 300 may be combined to form film 130. Film(s) 130 may be used in display(s) 140 in one or more ways, such as any of: positioned in one or more locations in a backlight unit 142 and/or in LCD panel 85 and used as multifunctional films 130 (e.g., configured to function as any of: color conversions films, protective films, diffusers, polarizers etc.). Further display configurations 140 may comprise adjusting film(s) 130 according to the backlight source 135 (see e.g., red enhancement below, possibly also green enhancement) and/or adjusting the display white point 145, adjustment which may be carried out by modifying any of the color conversion elements, film production processes 100 and/or film configurations 130. Some embodiments provide integrative approaches to display configuration, which take into account multiple factors at all illustrated levels, as exemplified below.

Display Configurations
Film Positions

FIGS. 2A-2E and 3A-3E are high level schematic illustrations of configurations of digital display 140 with color conversion film(s) 130, according to some embodiments of the invention. Digital displays 140 are illustrated schematically as comprising a backlight unit 142 and a LCD panel 85, the former providing RGB illumination 84A to the latter. Backlight unit 142 is illustrated schematically in FIG. 2A in a non-limiting manner as comprising a backlight source 80 (e.g., white LEDs 80B or blue LEDs 80A), a waveguide with reflector 82 (the latter for side-lit waveguides), a diffuser 144, prism film(s) 146 (e.g., brightness enhancement film (BEF), dual BDF (DBEF), etc.) and polarizer film(s) 148, which may be configured in various ways. Films 130 may be applied at various positions in backlight unit 142 such as on either side (130A, 130B) of diffuser 144, on either side (130C, 130D) of at least one of prism film(s) 146, on either side (130E, 130F) of at least one polarizer film(s) 148, etc. In certain embodiments, film 120 may be deposited on any of the film in back light unit 142.

In certain embodiments, films 130 may be used to replace diffuser 144 and/or polarizer film 148 (and possibly prism film(s) 146), once appropriate optical characteristics are provided in films 130 as explained herein.

The location of film(s) 130 may be optimized with respect to radiation propagation in backlight unit 142, in both forwards (84A) and backward (84B) directions due to reflections in backlight unit 142. For example, optimization considerations may comprise fluorescence efficiency, energy efficiency, stability of rhodamine-based fluorescent (RBF) compounds 115 or other color conversion elements in film(s) 130, and so forth. As a non-limiting example, in the position of the lower film 130A, B (e.g., on diffuser 144) more radiation is expected to excite RBF compounds 115—increasing its conversion efficiency but increasing losses and reducing the durability of RBF compounds 115. In the position of the higher film 130E, F (e.g., on polarizer film 148) less radiation is expected to excite RBF compounds 115—reducing its conversion efficiency but reducing losses and increasing the durability of RBF compounds 115 and/or other color conversion elements in film(s) 130.

Some embodiments of displays 140 comprise a blue light source 80A (such as blue LEDs—light emitting diodes) with film(s) 130 configured to provide red and green components in RGB illumination 84A, e.g., by using red-fluorescent RBF compound(s) (e.g., with silane precursor(s) such as PhTMOS (trimethoxyphenylsilane) and/or TMOS (trimethoxysilane) with fluorine substituents—see below) and green-fluorescent RBF compound(s) (e.g., with silane precursor(s) such as $F_1TMOS$ (trimethoxy(3,3,3-trifluoropropyl)silane)—see below). It is emphasized that various silane precursor(s) 104 may be used with either red-fluorescent or green-fluorescent RBF compounds 115 as disclosed below.

The red and green fluorescent RBF compound(s) may be provided in a single film layer 133 or in multiple film layers 134, 132. The process may be optimize to provide required absorption and emission characteristics of RBF compounds in film 130, while maintaining stability thereof during operation of display 140. Similarly, film(s) 130 with other one or more color conversion elements (e.g., other fluorescent compounds, organic or inorganic, quantum dots etc.) may be integrated in display 140 in a similar way an according to respective considerations. In the following any of the mentioned RBF compound(s) may, in some embodiments, be replaced or augmented by other color conversion elements (e.g., other fluorescent compounds, organic or inorganic, quantum dots etc.).

Some embodiments of displays 140 comprise a white light source 80B (such as white LEDs) with film(s) 130 configured to provide red and green components in RGB illumination 84A, e.g., by using red-fluorescent RBF compound(s) (e.g., with PhTMOS and/or TMOS with fluorine substituents as silane precursor(s)). The red fluorescent RBF compound(s) may be provided in a single film layer or in multiple film layers 134. The process may be optimize to provide required absorption and emission characteristics of RBF compounds in film 130, while maintaining stability thereof during operation of display 140. Red-fluorescent RBF compound(s) may be used to shift some of the yellow region in the emission spectrum of white light source 80B into the red region, to reduce illumination losses in LCD panel 85 while maintaining the balance between B and R+G in RGB illumination 84A.

Figure 2A:
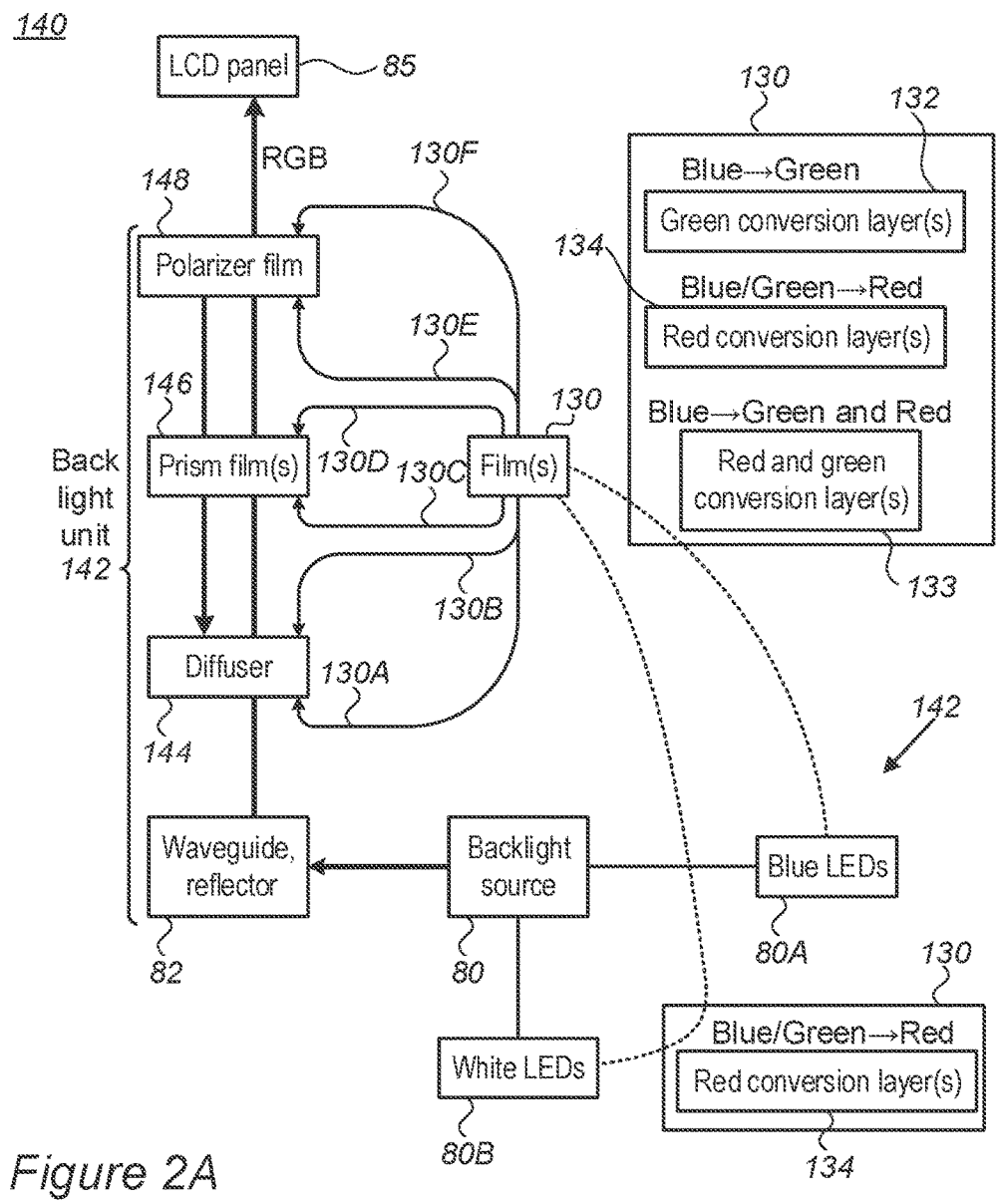
FIGS. 2A-2E and 3A-3E are high level schematic illustrations of configurations of digital displays with color conversion film(s), according to some embodiments of the invention.
Figure 2B:
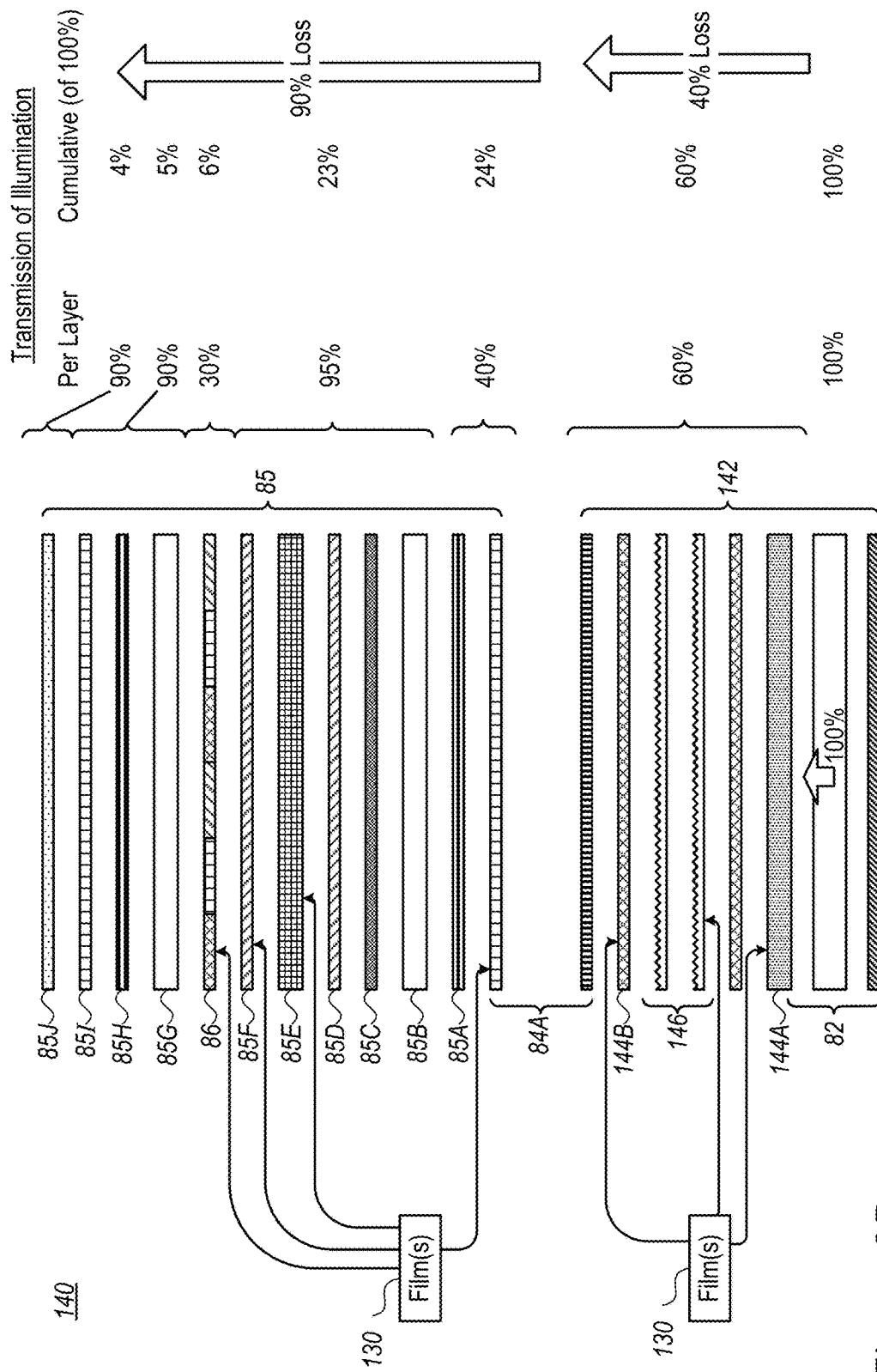

FIG. 2B illustrates in more details various films and elements in display 140 to which film 130 may be associated or which may be replaced by film 130 in some embodiments. LCD panel 85 is shown to include compensation films 85A, 85H, glass layers 85B, 85G, thin film transistors (TFT) 85C, ITO (indium tin oxide) layers 85D, 85F, liquid crystal cell (LC) 85E, RGB color filters 86, polarizer film 85I and protective film 85J (e.g., anti-glare, anti-reflection). FIG. 2B further illustrates typical illumination transmission in each layer and cumulatively, indicating ca. 40% loss in backlight unit 142 and 90% loss in LCD panel 85, the latter mainly resulting from RGB color filters 86 and polarizers 84A in LCD panel 85 and backlight unit 142. One or more film(s) 130 may be attached to or replace any of various layers in backlight unit 142 and/or in LCD panel 85, depending on considerations of minimizing further illumination losses, film performance and lifetime of the fluorescent dyes (RBF compounds 115). As non-limiting examples, FIG. 2B illustrates schematically associating on or more films 130 with any of diffuser 144A and/or light guide 82, prism layer(s) 146, diffuser 144B, polarizer 84A (in either or both backlight unit 142 and LCD panel 85), LC 85E, ITO 85F and/or color filters 86. It is emphasized that FIG. 2B merely provides a non-limiting example of a display configuration, and films 130 may be applied at various positions and any display configuration.

In some embodiments, similar considerations may be used with respect to positioning of any type of color conversion film 130, which may comprise color conversion elements other than RBF compounds 115, such as organic (non-rhodamine-based) or inorganic fluorescent compounds, quantum dots etc. Various display 140 configurations may be provided, which optimize illumination loss with film parameters and lifetime of the color converting elements.

Figure 2E:
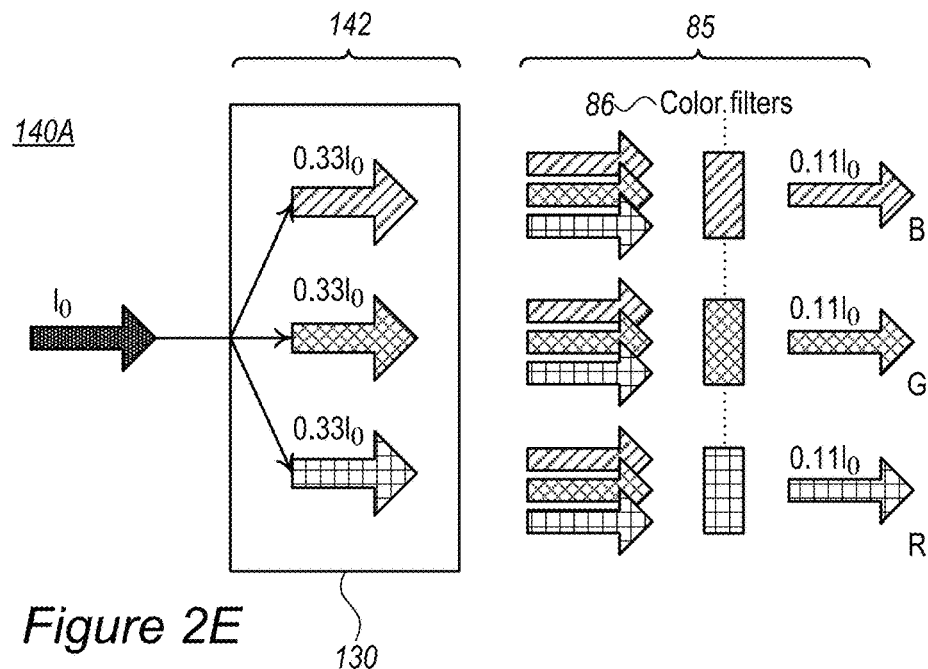
Figure 2C:
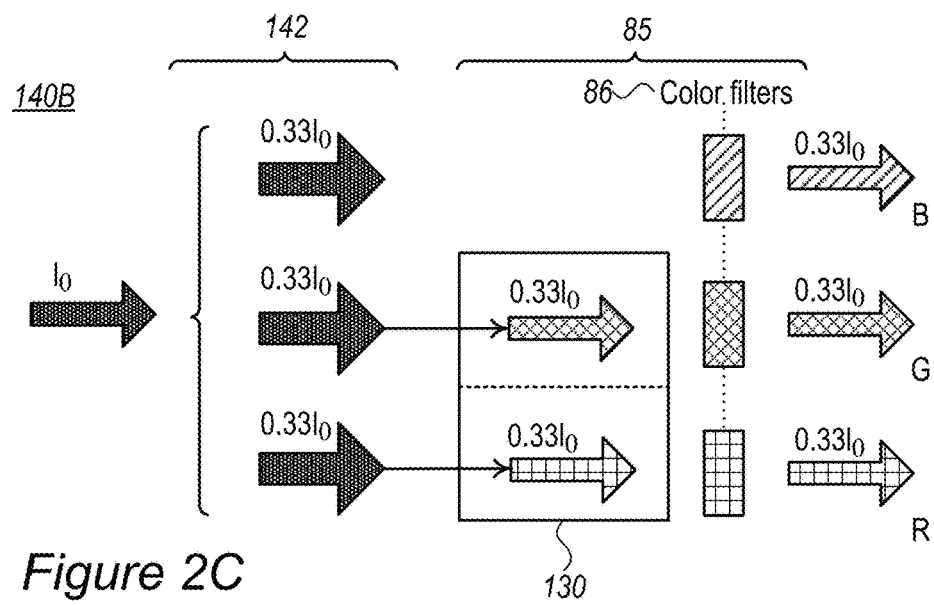
Figure 2D:
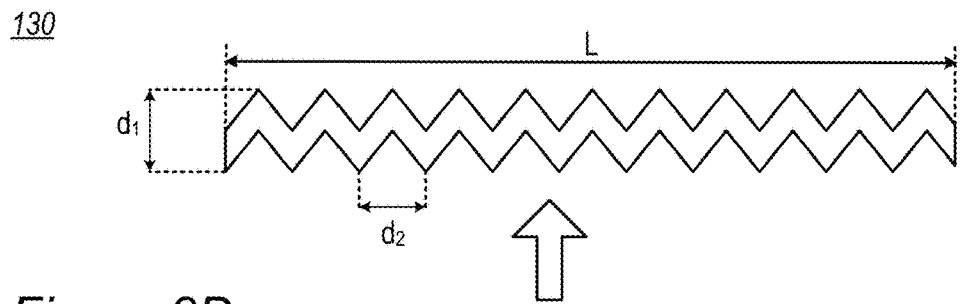

FIG. 2D illustrates and example for configuration of film 130 folded into a zig-zag form, characterized by an overall length L, overall thickness $d_1$ and step $d_2$ between folds. Film 130 may be folded to increase the film thickness through which the illumination passes, without increasing the actual thickness of film 130 (formulated otherwise—to reduce the light flux per area of film 130). The folding may increase the lifetime of RBF compounds 115 in film or of any other comprise color conversion elements on which film 130 may be based, such as organic (non-rhodamine-based) or inorganic fluorescent compounds, quantum dots etc.

FIGS. 2C and 2E schematically illustrate some of the above considerations, by comparing display 140B with color conversion film 130 in LCD panel 85 versus display 140A (FIG. 2E) with color conversion film 130 in backlight unit 142. The schematic illustrations depict the illumination intensity as $I_0$, and illumination components R, G, B as they are produced in the respective display. In display 140A, color conversion film 130 in backlight unit 142 provides illumination at RGB, assuming in a non-limiting manner no loss on the conversion. In LCD panel 85, color filters 86 remove two of the three illumination components, leaving ca. 10% of the original illumination at each color component (see also FIG. 2B, illustrating a more realistic lower rate of less than 5% per color component). When placing color conversion film 130 in LCD panel 85 (e.g., as a patterned film 130), as illustrated for display 140B (FIG. 2C, assuming blue LED illumination), a blue component may be delivered directly to blue color filter 86 without color conversion or filtering, while R and G may be converted from corresponding blue component just before filters 86, so that that filters 86 pass most or all of the illumination they receive, which is wavelength-adjusted just before entering color filters 86—resulting in a much higher efficiency than in display 140A of ca. 30% of the original illumination at each color component (corresponding to 10-15% per color component in terms of FIG. 2B).

Such gain in efficiency may be achieved by some embodiments having any type of color conversion film 130, which may comprise color conversion elements other than RBF compounds 115, such as organic (non-rhodamine-based) or inorganic fluorescent compounds, quantum dots etc. Various display configurations may be provided which increase illumination use efficiency by positioning respective color conversion film 130 in LCD panel 85, before color filters 86. Some embodiments comprise respective LCD panels 85 having color conversion film 130 integrated therein and positioned before color filters 86 thereof, as well as corresponding displays 140.

Figure 3A:
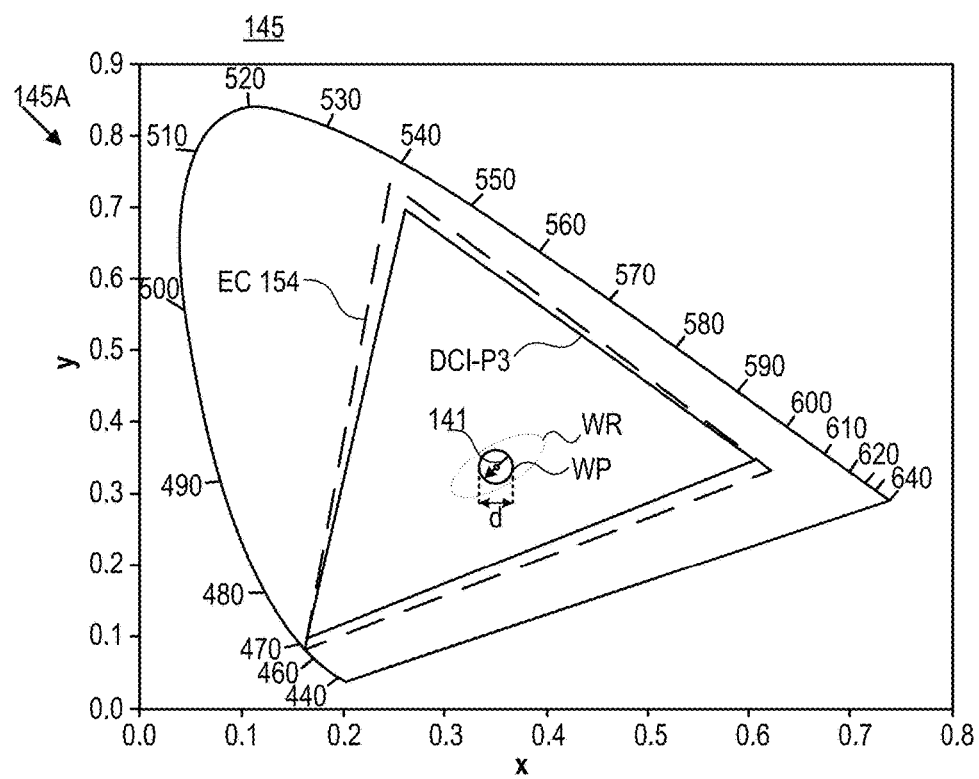
Figure 3B:
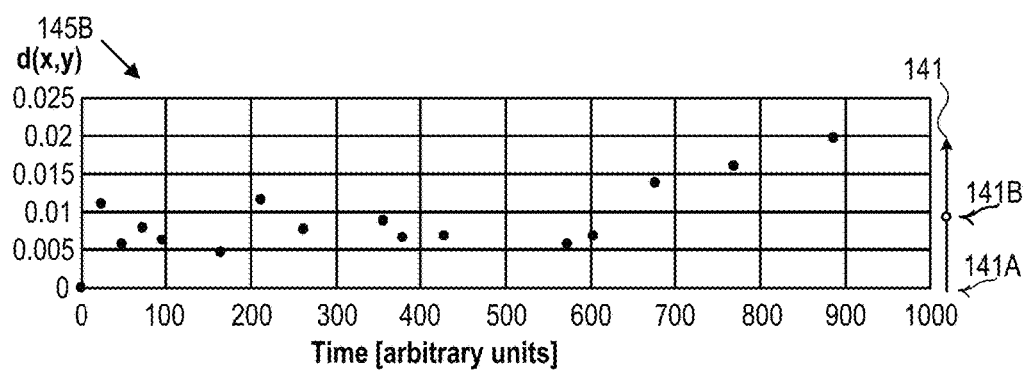
Figure 3C:
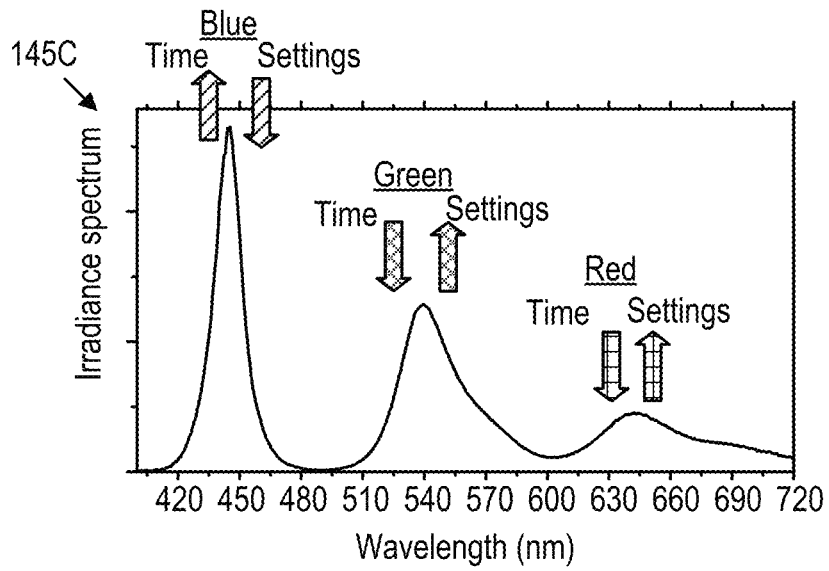
Figure 3D:
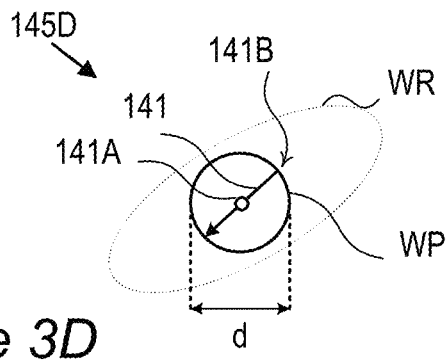
Figure 3E:
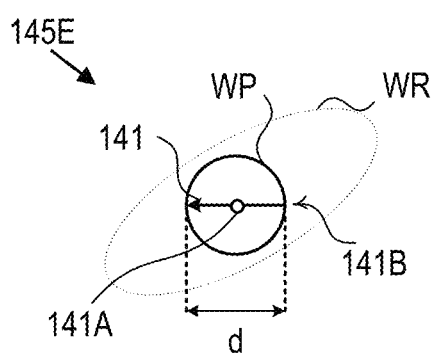

FIGS. 3A-E schematically illustrates white point adjustment 145 that extends a display lifetime of display 140, according to some embodiments of the invention. Illustration 145A (FIG. 3A) shows an example for EC-154 ($Z_3$ with JK-71+$Z_2$ with ES-61, see line 9 in Table 1 below) sample color gamut compared to DCI (digital cinema initiatives) P3 cinema standard color gamut over the CIE 1931 color space with a white region indicated by WR and a white point denoted by WP, having a diameter which is denoted by d and may be e.g., 0.01 in the diagram's x coordinates. The region WP denotes the range within which display 140 is considered to be within the specifications with respect to its color performance. Once the actual white point of display 140 is outside region WP, even when it remains within a possibly larger region WR corresponding to white color, display 140 is considered over its lifetime and not operating according to specifications. In a typical setting, films 130 are configured to provide a white point 141A at the center of the region WP and as with time RBF compounds 115 or other color conversion elements degrade 141 (indicated in graph 145C, FIG. 3C, showing the emission spectrum of film 130 by arrows which are denoted Time) white point 141A moves until it exits region WP and the display is considered over its lifetime. The degradation in terms of the distance on color diagram 145A is illustrated in graph 145B (FIG. 3B) using non-limiting experimental data of the distance from point 141A over the operation time (in arbitrary units, a.u., scaled to 1000) of the display. In some embodiments of display 140 however, film(s) 130 may be fine-tuned to have the exact white point within region WP but at a point 141B on the edge of it which is opposite to the direction of degradation marked by arrow 141 (illustrations 145D, 145E in FIGS. 3D and 3E, respectively, show an enlarged view of white region WR). Such fine tuning to white point 141A enables the display characteristics to be changed to ca. double as much as with white point 141A while staying within the specified region WP, and as a result ca. double the lifetime of display 140. The semi-quantitative example in graph 145B illustrates an increase in display lifetime, from ca. 600 a.u. to ca. 900 a.u., when changing the white-point from 141A to 141B. As a result of the change, instead of display starting exactly white and becoming somewhat colder white (see graph 145C, the green and red components decrease with time and correspondingly the blue component increases), display 140 starts a bit warmer, goes through the exact white point and ends a bit colder, with a longer lifetime overall. Setting a higher concentration of RBF compounds 115 or other color conversion elements in film 130 thus enables effective lengthening of the lifetime of display 140. Examples for increased dye concentrations may be up to 20% for green dyes and up to 40% for red dyes. Some embodiments comprising raising the concentration of one or more types of dyes (such as red-fluorescent and green-fluorescent RBF compounds 115), to fine tune the exact white point of display 140. The increased concentration of dyes may result in a somewhat warmer white within specified region WP. Illustrations 145D and 145E (FIGS. 3D, 3E) emphasize that white point 141B may be selected according to known degradation 141 of color conversion film 130 with respect to specified white point WP, for any type of film 130, including films using organic (non-rhodamine-based) or inorganic fluorescent compounds, quantum dots etc.

Polarization

Film 130 may comprise at least one layer 134 with red fluorescent RBF compound, or at least one layer 134 with red fluorescent RBF compound and thereupon at least one layer 132 with green fluorescent RBF compound. At least one of the layers of film 130 may be configured to exhibit polarization properties.

Figure 4:
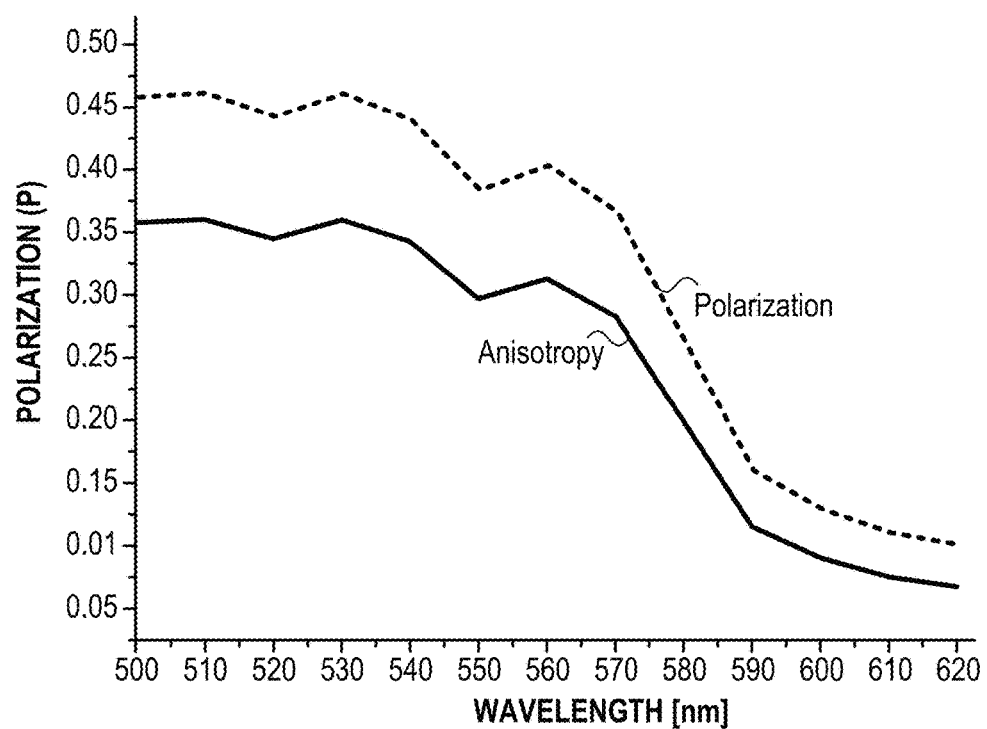
FIG. 4 is an illustration example of polarization anisotropy of film(s) with RBF (rhodamine-based fluorescent) compound(s), according to some embodiments of the invention.

FIG. 4 is an illustration example of polarization anisotropy of film(s) 130 with RBF compound(s) 115, according to some embodiments of the invention. The inventors have found out that in certain cases, during the embedding of RBF compound(s) 115 in film 130, the molecules self-assemble to affect light polarization, providing at least partially polarized light emission. Process parameters may be adjusted to enhance the degree of polarization of light emitted from film 130, e.g., by providing conditions that cause self-assembly to occur to a larger extent. Without being bound by theory, the inventors suggest that the polarized emission of fluorescence is related to the limitations on rotational motions of the macromolecular fluorophores during the lifetime of the excitation state (limitations relating to their size, shape, degree of aggregation and binding, and local environment parameters such as solvent, local viscosity and phase transition). The inventors have further found out that these limitations may be at least partially controlled by the preparation process of film 130 which may thus be used to enhance illumination polarization in display 140.

For example, FIG. 4 illustrates polarization and anisotropy measurement of films 130 prepared with red and green fluorescent compounds (specifically, green coumarin 6 dye and rhodamine 101 red molecular dyes, using the sol gel process). In the example, the anisotropy values range between 0.3-0.5 at the emission wavelengths.

Films 130 having different red and/or green fluorescent RBF compound 115, as well as films 130 prepared by UV curing also present polarization properties and may be used in device 140 to enhance or at least partially replace polarizer films (e.g., 84A, 851 etc. see FIGS. 2A and 2B).

Some embodiments comprise any type of color conversion film 130, which may comprise color conversion elements other than RBF compounds 115, such as organic (non-rhodamine-based) or inorganic fluorescent compounds, quantum dots etc.—configured to provide polarize fluorescent radiation as disclosed above. Such films 130 may be used to enhance or at least partially replace polarizer films in respective displays 140.

Red Enhancement

Figure 5A:
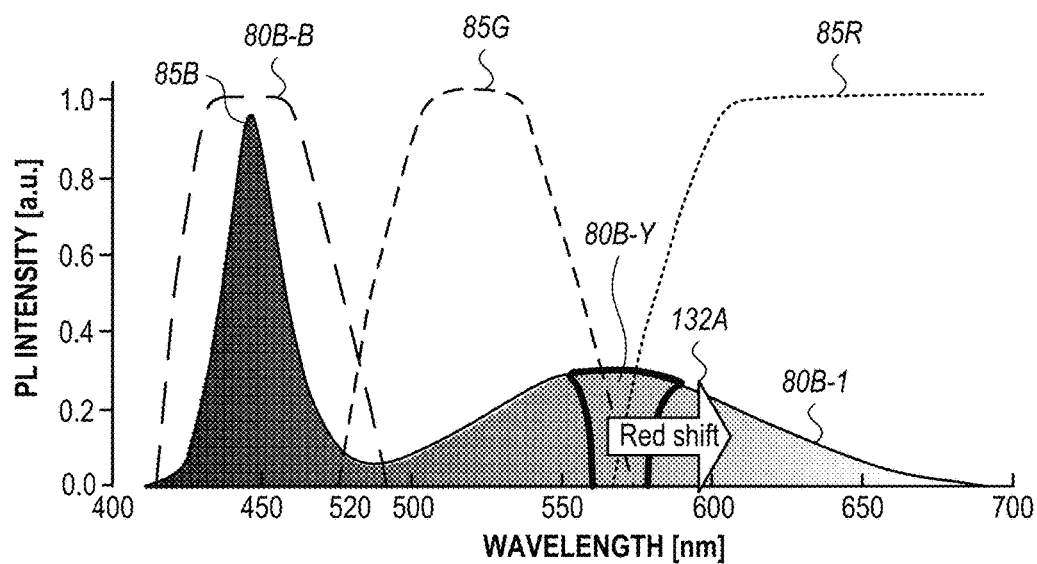
FIG. 5A is a high level schematic illustration of red (R) enhancement in devices with white illumination, according to some embodiments of the invention.

FIG. 5A is a high level schematic illustration of red (R) enhancement in devices with white illumination, according to some embodiments of the invention. FIG. 5A schematically illustrates a typical white light spectrum 80B-1 (of white illumination source 80B), optimized to provide RGB illumination 84A in prior art backlight units, and typical ranges (85R, 85G, 85B) of RGB filters 86 in LCD panel 85 (see FIGS. 2B, 2C and 2E). The inventors have noticed that while white light spectrum 80B-1 is optimized with respect to the ratio between its blue section (80B-B) and its yellow section (80B-Y), it is deficient with respect to the relative position of the yellow region (80B-Y) and G and R ranges 85G, 85R, respectively (corresponding, for example, to B, G, R denoted in FIGS. 2C and 2E). Indeed, much of the illumination energy in yellow region 80B-Y is filtered out and thus wasted in the operation of the display and moreover, color cross talk (part of the yellow orange might go to the green filter and some of the green-yellow to the red filter) which degrades the color gamut. The inventors have further found out that using film(s) 130 with red-fluorescent RBF compound(s) 115 (layer(s) 134) shifts 132A at least some of the illumination energy in yellow region 80B-Y into red region 85R which is passed by the R (red) filter in LCD panel 85, and is therefore not wasted. Using film(s) 130 thus increases the energy efficiency of display 140 and possibly improves its color gamut.

Figure 5B:
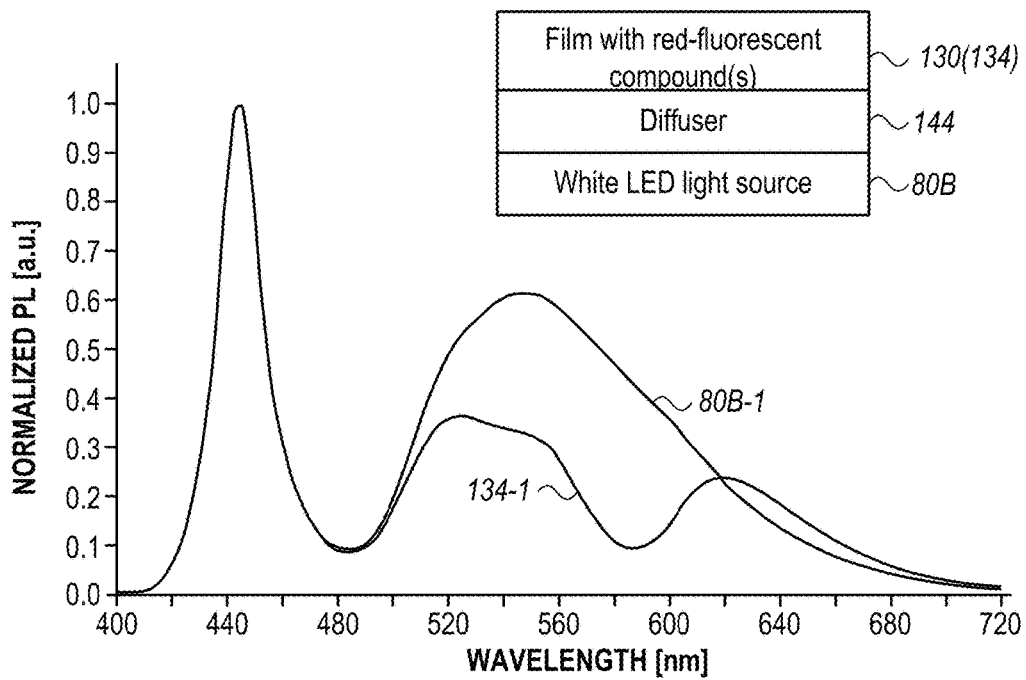
FIG. 5B illustrates an example for the improvement in an RGB spectrum provided by backlight unit using the film(s), according to some embodiments of the invention.

FIG. 5B illustrates an example for the improvement in RGB spectrum 84B provided by backlight unit 84 using film(s) 130, according to some embodiments of the invention. In this specific non-limiting example, films 130 were produced by UV curing process 300. White light spectrum 80B-1 is somewhat different from the one illustrated in FIG. 5A due to the difference in white light source 80B, yet also exhibits a peak in the yellow region. In contrast, emission spectrum 134-1 of film 130 (made of layer(s) 134—specifically—one to three layers with JK32 (0.02-0.3 mg/ml for each layer, spectra shown without LCD color filter effects) in backlight unit 142 splits the yellow peak of white light spectrum 80B-1 into a green and a red peak, each within the range of the corresponding G and R filters, thereby increasing the efficiency, reducing the color cross talk and improving the gamut of display 140, e.g., by providing a more saturated (narrower FWHM, full width at half maximum) red and at longer red wavelength. In the example, the characteristics of the green and red peaks of emission spectrum 134-1 of film 130 were 618±5 nm peak with FWHM of ca. 60 nm for the red peak and 518±5 nm peak with FWHM of ca. 50 nm for the green peak; with the quantum yield of film 130 being between 70-90% and the lifetime at device level being between 20,000-50,000 hour for multiple repeats.

Some embodiments comprise any type of color conversion film 130, which may comprise color conversion elements other than RBF compounds 115, such as organic (non-rhodamine-based) or inorganic fluorescent compounds, quantum dots etc.—configured to provide polarize fluorescent radiation as disclosed above. Such films 130 may be used to RGB spectra 84B by providing shifts 132A of yellow illumination 80B-Y into the red region of corresponding R color filters 86 in respective displays 140.

In some embodiments, films 130 may be configured to provide green enhancement, using only or mostly green-fluorescent compounds.

Rhodamine-Based Fluorescent Molecules

A wide range of fluorescent organic molecules may be incorporated in films 130, such as materials of the xanthene dye family like fluorescein, rhodamine derivatives and coumarin family dyes, as well as various inorganic fluorescent materials. In the following, explicit examples of rhodamine-based derivatives, RBF compounds 115, are presented in detail, in a non-limiting manner.

Red-Fluorescent RBF Compounds

Some embodiments of red-fluorescent RBF compounds 115 are defined by Formula 1.

Formula 1

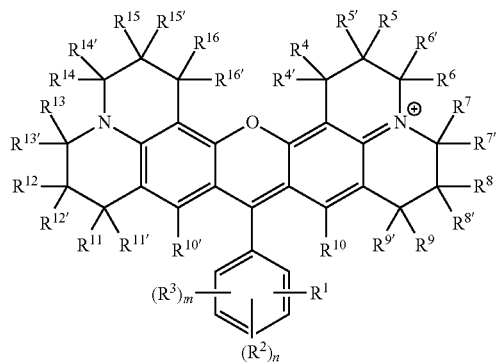

wherein $R^1$ is COOR, $NO_2$, COR, COSR, CO(N-heterocycle), $CON(R)_2$, or CN;

$R^2$ each is independently selected from H, halide, $N(R)_2$, COR, CN, $CON(R)_2$, CO(N-heterocycle), NCO, NCS, OR, SR, $SO_3H$, $SO_3M$ and COOR;

$R^3$ each is independently selected from H, halide, $N(R)_2$, COR, CN, $CON(R)_2$, CO(N-heterocycle), NCO, NCS, OR, SR, $SO_3H$, $SO_3M$ and COOR;

$R^4$-$R^{16}$ and $R^{4'}$-$R^{16'}$ are each independently selected from H, alkyl, haloalkyl, cycloalkyl, heterocycloalkyl, alkenyl, alkynyl, aryl, benzyl, halide, $NO_2$, OR, $N(R)_2$, COR, CN, $CON(R)_2$, CO(N-Heterocycle) and COOR;

R is H, alkyl, cycloalkyl, heterocycloalkyl, alkenyl, alkynyl, aryl, benzyl, —$(CH_2CH_2O)_rCH_2CH_2OH$,—$(CH_2)_p$ $OC(O)NH(CH_2)_qSi(Oalkyl)_3$, —$(CH_2)_pOC(O)CH=CH_2$ or —$(CH_2)_pSi(Oalkyl)_3$;

n and m are each independently an integer between 1-4;
p and q are each independently an integer between 1-6;
r is an integer between 0-10;
M is a monovalent cation; and
X: is an anion.

The positions of $R^1$, $(R^2)_n$ and $(R^3)_m$ may be selected to be any feasible position with respect to the indicated ring. Any of $R^1$, $(R^2)_n$ and $(R^3)_m$ may be positioned at ortho, meta or para positions with respect to the rest of the molecule, as long as the resulting structure is chemically feasible. Precursors 110 and formulation 120 may be adapted to accommodate and support embodiments of the selected red-fluorescent RBF compound(s) according to the principles disclosed herein.

Specific, non-limiting, examples of red-fluorescent RBF compounds 115 which were tested below include compounds denoted ES61, JK32 (shown as JK-32A and/or JK-32B), RS56 (shown as RS56A and/or RS56B), RS106 and RS130.

ES61

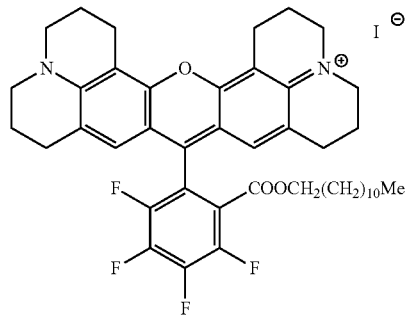

RS56A

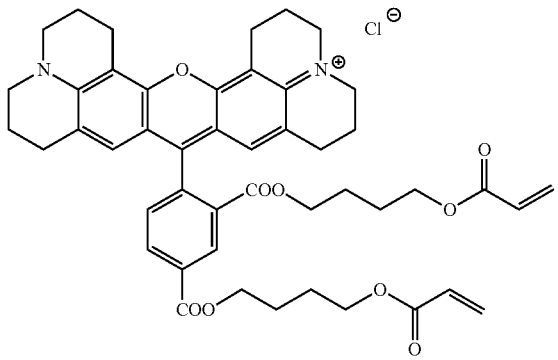

RS56B

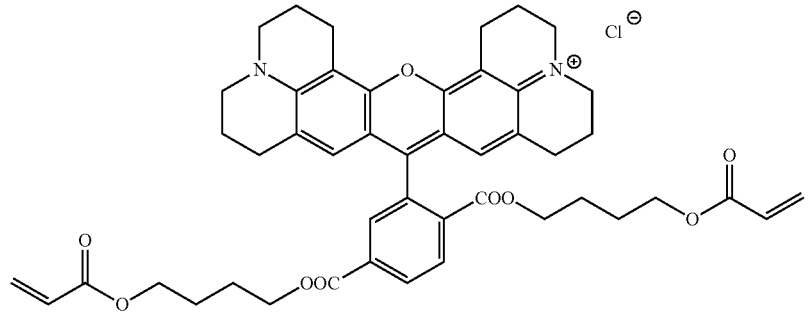

RS106
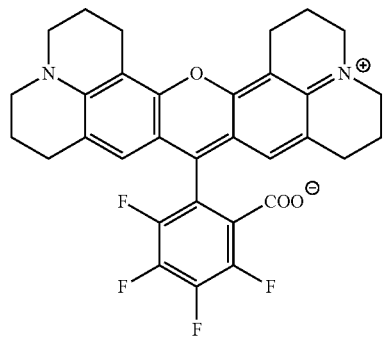
RS130
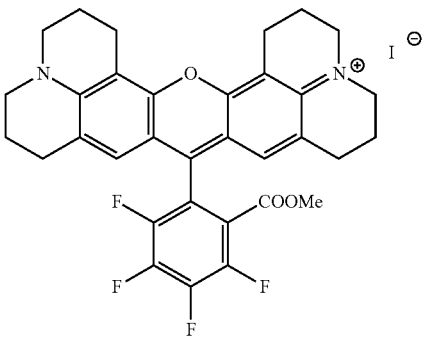
Some embodiments of red-fluorescent RBF compounds are presented in more detail in U.S. patent application Ser. No. 15/252,492 and are considered likewise part of the present disclosure. Non-limiting examples are provided in the following variants, numbered 1-1, 1-2, 1-3, 1-4, 1-5, 1-6, 1-7, 1-8, 1-9, 1-10, 1-11, 1-9A, 1-10a and 1-11a.
1-1
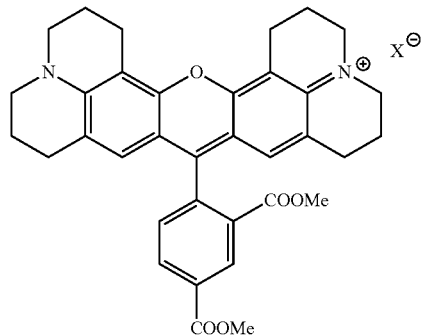
1-2
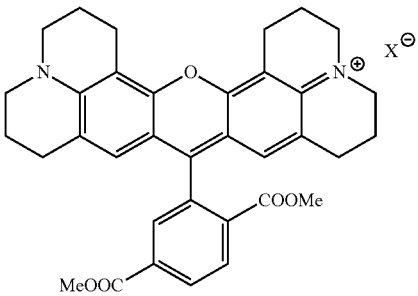
1-3
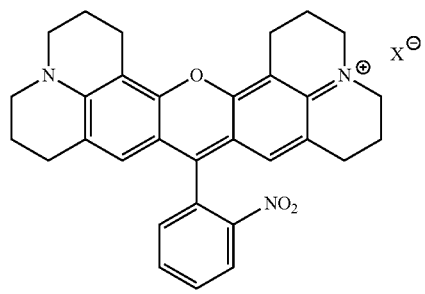
1-4
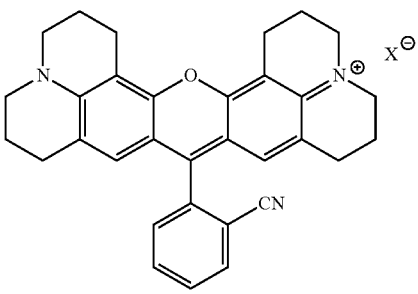
1-5
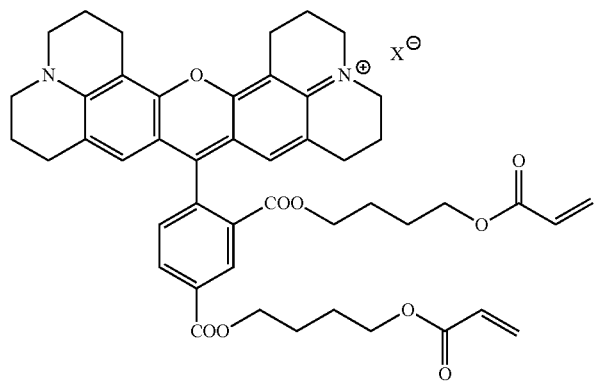

1-6
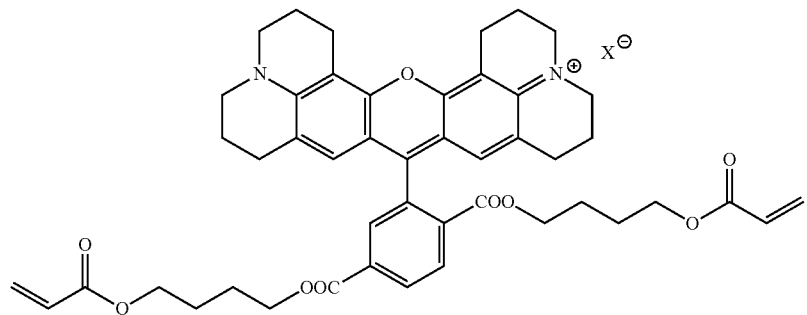
1-7
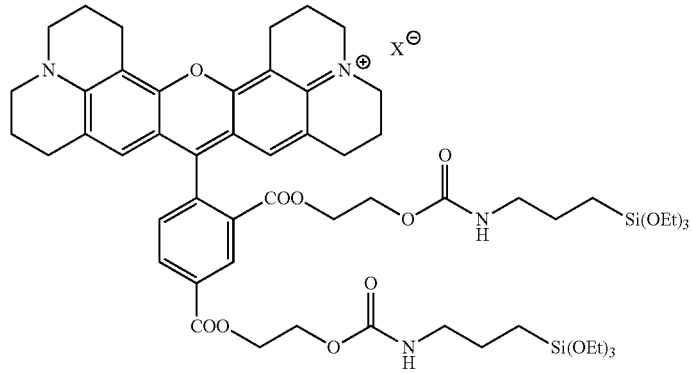
1-8
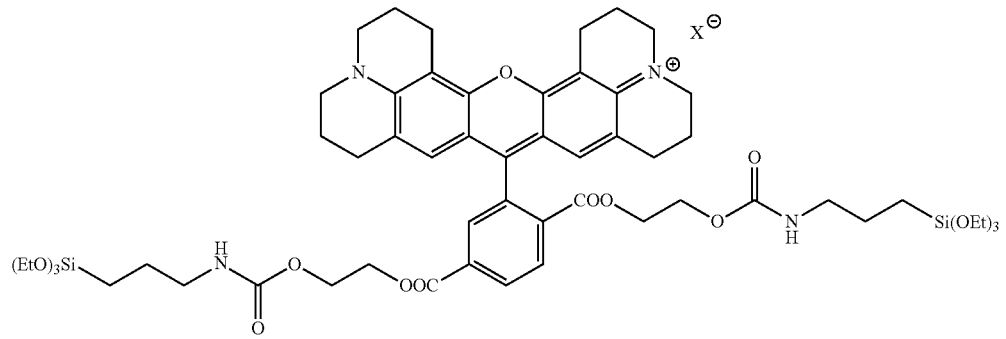
1-9
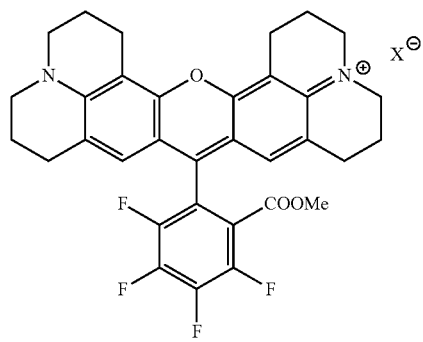
1-9a
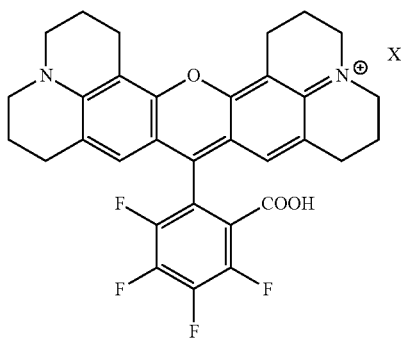

-continued

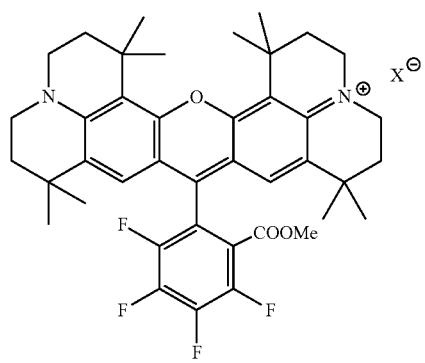
1-10

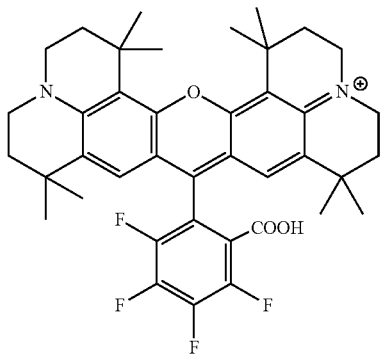
1-10a

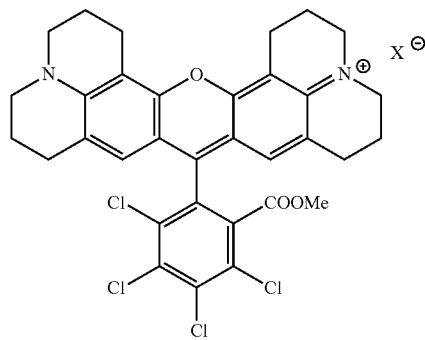
1-11

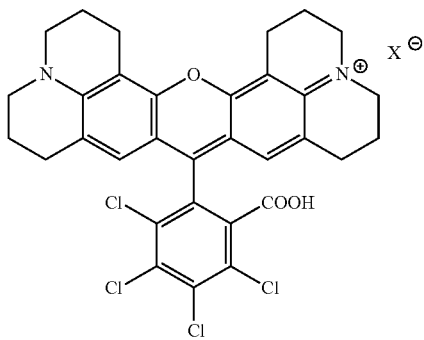
1-11a

Green-Fluorescent RBF Compounds

Some embodiments of green-fluorescent RBF compounds are defined by Formulas 2 and 3.

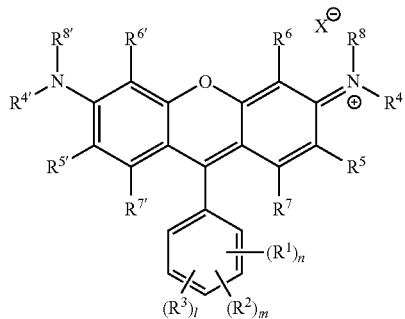
Formula 2

Wherein:

$R^1$ each is independently H, $Q^1$, $OQ^1$, $CF_3$, $C(O)Q^1$, $NQ^1Q^2$, $NO_2$, CN, $SQ^1$, —$NQ^1Q^2CONQ^3Q^4$, NCO, NCS, —OC(O)$OQ^1$ or halide;

$R^2$ each is independently H, $Q^1$, $OQ^1$, $CF_3$, $C(O)Q^1$, $NQ^1Q^2$, $NO_2$, CN, $SQ^1$, —$NQ^1Q^2CONQ^3Q^4$, NCO, NCS, —OC(O)$OQ^1$ or halide;

$R^3$ each is independently H, $Q^1$, $OQ^1$, $CF_3$, $C(O)Q^1$, $NQ^1Q^2$, $NO_2$, CN, $SQ^1$, —$NQ^1Q^2CONQ^3Q^4$, NCO, NCS, —OC(O)$OQ^1$ or halide;

$R^4$, $R^{4'}$, $R^8$ and $R^{8'}$ are each independently selected from H, alkyl, haloalkyl, heterocycloalkyl, cycloalkyl, aryl and benzyl;

$R^5$ and $R^{5'}$ are each independently selected from Z, $OQ^1$, $CF_3$, $C(O)Q^1$, $COOQ^1$, $CON(Q^1)_2$, $NQ^1Q^2$, $NO_2$, CN, $SO_3^-$, $SO_3M$, $SO_3H$, $SQ^1$, —$NQ^1Q^2CONQ^3Q^4$, NCO, NCS, alkenyl, alkynyl, epoxide, alkylated epoxide, azide and halide;

$R^6$, $R^{6'}$, $R^7$ and $R^{7'}$ are each independently selected from H, $Q^1$, $OQ^1$, $CF_3$, $C(O)Q^1$, $COOQ^1$, $CON(Q^1)_2$, $NQ^1Q^2$, $NO_2$, CN, $SO_3^-$, $SO_3M$, $SO_3H$, $SQ^1$, —$NQ^1Q^2CONQ^3Q^4$, NCO, NCS, alkenyl, alkynyl, epoxide, alkylated epoxide, azide and halide; or $R^4$ and $R^5$ or $R^{4'}$ and $R^{5'}$ form together a N-heterocyclic ring wherein said ring is optionally substituted;

$Q^1$ and $Q^2$ are each independently selected from H, alkyl, haloalkyl, heterocycloalkyl, cycloalkyl, aryl, benzyl, —$(CH_2)_pOC(O)NH(CH_2)_qSi(Oalkyl)_3$, —$(CH_2)_pOC(O)CH=CH_2$, —$(CH_2)_pSi(Oalkyl)_3$, —OC(O)N(H)$Q^4$, —OC(S)N(H)$Q^4$, —N(H)C(O)N($Q^3$)$_2$ and —N(H)C(S)N($Q^3$)$_2$;

Z is selected from alkyl, haloalkyl, heterocycloalkyl, cycloalkyl, aryl, benzyl, —$(CH_2)_pOC(O)NH(CH_2)_qSi(Oalkyl)_3$, —$(CH_2)_pOC(O)CH=CH_2$, —$(CH_2)_pSi$ (Oalkyl)$_3$, —OC(O)N(H)Q$^4$, —OC(S)N(H)Q$^4$, —N(H)C(O)N(Q$^3$)$_2$ and —N(H)C(S)N(Q$^3$)$_2$;

Q$^3$ and Q$^4$ are each independently selected from H, alkyl, haloalkyl, heterocycloalkyl, cycloalkyl, aryl and benzyl;

M is a monovalent cation;

n, m and l are independently an integer between 1-5;

p and q are independently an integer between 1-6; and

X is an anion;

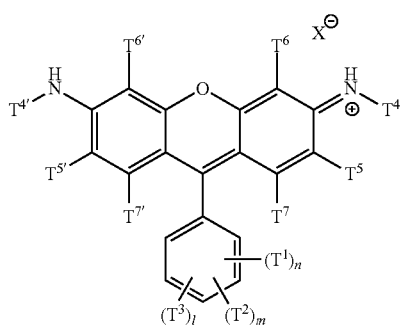

Formula 3 wherein

T$^1$ each is independently H, Q$^1$, OQ$^1$, CF$_3$, C(O)Q$^1$, NQ$^1$Q$^2$, NO$_2$, CN, SQ$^1$, —NQ$^1$Q$^2$CONQ$^3$Q$^4$, NCO, NCS, —OC(O)OQ$^1$ or halide;

T$^2$ each is independently H, Q$^1$, OQ$^1$, CF$_3$, C(O)Q$^1$, NQ$^1$Q$^2$, NO$_2$, CN, SQ$^1$, —NQ$^1$Q$^2$CONQ$^3$Q$^4$, NCO, NCS, —OC(O)OQ$^1$ or halide;

T$^3$ each is independently H, Q$^1$, OQ$^1$, CF$_3$, C(O)Q$^1$, NQ$^1$Q$^2$, NO$_2$, CN, SQ$^1$, —NQ$^1$Q$^2$CONQ$^3$Q$^4$, NCO, NCS, —OC(O)OQ$^1$ or halide;

T$^4$ and T$^{4'}$ are each independently selected from alkyl, haloalkyl, heterocycloalkyl, cycloalkyl, aryl and benzyl;

T$^5$ and T$^{5'}$ are each independently selected from H, Q$^1$, OQ$^1$, CF$_3$, C(O)Q$^1$, COOQ$^1$, CON(Q$^1$)$_2$, NQ$^1$Q$^2$, NO$_2$, CN, SO$_3^-$, SO$_3$M, SO$_3$H, SQ$^1$, —NQ$^1$Q$^2$CONQ$^3$Q$^4$, NCO, NCS, alkenyl, alkynyl, epoxide, alkylated epoxide, azide and halide;

T$^6$, T$^{6'}$, T$^7$ and T$^{7'}$ are each independently selected from H, Q$^1$, OQ$^1$, CF$_3$, C(O)Q$^1$, COOQ$^1$, CON(Q$^1$)$_2$, NQ$^1$Q$^2$, NO$_2$, CN, SO$_3^-$, SO$_3$M, SO$_3$H, SQ$^1$, —NQ$^1$Q$^2$CONQ$^3$Q$^4$, NCO, NCS, alkenyl, alkynyl, epoxide, alkylated epoxide, azide and halide; or T$^4$ and T$^5$ or T$^{4'}$ and T$^{5'}$ form together a N-heterocyclic ring wherein said ring is optionally substituted;

Q$^1$ and Q$^2$ are each independently selected from H, alkyl, haloalkyl, heterocycloalkyl, cycloalkyl, aryl, benzyl, —(CH$_2$)$_p$OC(O)NH(CH$_2$)$_q$Si(Oalkyl)$_3$, —(CH$_2$)$_p$OC(O)CH=CH$_2$, —(CH$_2$)$_p$Si(Oalkyl)$_3$, —OC(O)N(H)Q$^4$, —OC(S)N(H)Q$^4$, —N(H)C(O)N(Q$^3$)$_2$ and —N(H)C(S)N(Q$^3$)$_2$;

Q$^3$ and Q$^4$ are each independently selected from H, alkyl, haloalkyl, heterocycloalkyl, cycloalkyl, aryl and benzyl;

M is a monovalent cation;

n, m and l are independently an integer between 1-5;

p and q are independently an integer between 1-6; and

X is an anion.

The positions of (R$^1$)$_m$, (R$^2$)$_n$ and (R$^3$)$_l$ and of (T$^1$)$_m$, (T$^2$)$_n$ and (T$^3$)$_l$ may be selected to be any feasible position with respect to the indicated ring. Any of (R$^1$)$_m$, (R$^2$)$_n$ and (R$^3$)$_l$ and any of (T$^1$)$_m$, (T$^2$)$_n$ and (T$^3$)$_l$ may be positioned at ortho, meta or para positions with respect to the rest of the molecule, as long as the resulting structure is chemically feasible. Precursors 110 and formulation 120 may be adapted to accommodate and support embodiments of the selected green-fluorescent RBF compound(s) according to the principles disclosed herein.

Some embodiments of green-fluorescent RBF compounds are defined by Formula 4.

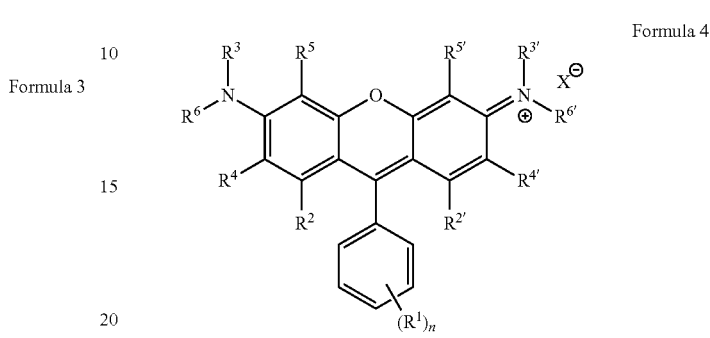

Formula 4 wherein:

R$^1$ each is independently H, Q$^1$, OQ$^1$, CF$_3$, C(O)OQ$^1$, C(O)NQ$^1$Q$^2$, NHC(O)Q$^1$, C(O)Q$^1$, NQ$^1$Q$^2$, NO$_2$, CN, SQ$^1$, —NQ$^1$Q$^2$CONQ$^3$Q$^4$, NCO, NCS, —OC(O)OQ$^1$, SO$_3$—, SO$_3$Q$^1$, or halide;

n is an integer between 1-5;

R$^3$, R$^{3'}$, R$^6$ and R$^{6'}$ are each independently selected from H, CF$_3$, alkyl, alkenyl, alkynyl, haloalkyl, heterocycloalkyl, cycloalkyl, aryl and benzyl;

R$^2$, R$^{2'}$, R$^4$, R4', R$^5$ and R$^{5'}$ are each independently selected from H, Q$^1$, OQ$^1$, CF$_3$, NQ$^1$Q$^2$, NO$_2$, CN, SO$_3^-$, SO$_3$Q$^1$ and halide;

Q$^1$ and Q$^2$ are each independently selected from H, substituted or unsubstituted alkyl, substituted or unsubstituted alkenyl, substituted or unsubstituted alkynyl, azide, haloalkyl, heterocycloalkyl, cycloalkyl, aryl, benzyl, —(CH$_2$)$_p$OC(O)NH(CH$_2$)$_q$Si(Oalkyl)$_3$, —(CH$_2$)$_p$OC(O)CH=CH$_2$, —(CH$_2$)$_p$Si(Oalkyl)$_3$, —OC(O)N(H)Q$^4$, —OC(S)N(H)Q$^4$, —N(H)C(O)N(Q$^3$)$_2$ and —N(H)C(S)N(Q$^3$)$_2$;

Q$^3$ and Q$^4$ are each independently selected from H, alkyl, haloalkyl, heterocycloalkyl, cycloalkyl, aryl and benzyl;

X is an anion.

An "alkyl" group refers, in one embodiment, to a saturated aliphatic hydrocarbon, including straight-chain or branched-chain. In one embodiment, the alkyl group has 1-20 carbons. In another embodiment, the alkyl group has 1-8 carbons. In another embodiment, the alkyl group has 1-7 carbons. In another embodiment, the alkyl group has 1-6 carbons. Non limiting examples of alkyl groups include methyl, ethyl, propyl, isobutyl, butyl, pentyl or hexyl. In another embodiment, the alkyl group has 1-4 carbons. In another embodiment, the alkyl group may be optionally substituted by one or more groups selected from halide, hydroxy, alkoxy, carboxylic acid, aldehyde, carbonyl, amido, cyano, nitro, amino, alkenyl, alkynyl, aryl, azide, epoxide, ester, acyl chloride and thiol.

A "cycloalkyl" group refers, in one embodiment, to a ring structure comprising carbon atoms as ring atoms, which are saturated, substituted or unsubstituted. In another embodiment the cycloalkyl is a 3-12 membered ring. In another embodiment the cycloalkyl is a 6 membered ring. In another embodiment the cycloalkyl is a 5-7 membered ring. In another embodiment the cycloalkyl is a 3-8 membered ring. In another embodiment, the cycloalkyl group may be unsubstituted or substituted by a halide, alkyl, haloalkyl, hydroxyl, alkoxy, carbonyl, amido, alkylamido, dialkylamido, cyano, nitro, CO$_2$H, amino, alkylamino, dialkylamino, carboxyl, thio and/or thioalkyl. In another embodiment, the cycloalkyl ring may be fused to another saturated or unsaturated 3-8 membered ring. In another embodiment, the cycloalkyl ring is an unsaturated ring. Non limiting examples of a cycloalkyl group comprise cyclohexyl, cyclohexenyl, cyclopropyl, cyclopropenyl, cyclopentyl, cyclopentenyl, cyclobutyl, cyclobutenyl, cyclooctyl, cyclooctadienyl (COD), cyclooctaene (COE) etc.

A "heterocycloalkyl" group refers in one embodiment, to a ring structure of a cycloalkyl as described herein comprising in addition to carbon atoms, sulfur, oxygen, nitrogen or any combination thereof, as part of the ring. In one embodiment, non-limiting examples of heterocycloalkyl include pyrrolidine, pyrrole, tetrahydrofuran, furan, thiolane, thiophene, imidazole, pyrazole, pyrazolidine, oxazolidine, oxazole, isoxazole, thiazole, isothiazole, thiazolidine, dioxolane, dithiolane, triazole, furazan, oxadiazole, thiadiazole, dithiazole, tetrazole, piperidine, oxane, epoxide, thiane, pyridine, pyran, thiopyran, piperazine, morpholine, thiomorpholine, dioxane, dithiane, diazine, oxazine, thiazine, dioxine, triazine, and trioxane.

As used herein, the term "aryl" refers to any aromatic ring that is directly bonded to another group and can be either substituted or unsubstituted. The aryl group can be a sole substituent, or the aryl group can be a component of a larger substituent, such as in an arylalkyl, arylamino, arylamido, etc. Exemplary aryl groups include, without limitation, phenyl, tolyl, xylyl, furanyl, naphthyl, pyridinyl, pyrimidinyl, pyridazinyl, pyrazinyl, triazinyl, thiazolyl, oxazolyl, isooxazolyl, pyrazolyl, imidazolyl, thiophene-yl, pyrrolyl, phenylmethyl, phenylethyl, phenylamino, phenylamido, etc. Substitutions include but are not limited to: F, Cl, Br, I, C$_1$-C$_5$ linear or branched alkyl, C$_1$-C$_5$ linear or branched haloalkyl, C$_1$-C$_5$ linear or branched alkoxy, C$_1$-C$_5$ linear or branched haloalkoxy, aryl, heterocycloalkyl, CF$_3$, CN, NO$_2$, —CH$_2$CN, NH$_2$, NH-alkyl, N(alkyl)$_2$, hydroxyl, —OC(O)CF$_3$, —OCH$_2$Ph, —NHCO-alkyl, COOH, —C(O)Ph, C(O)O-alkyl, C(O)H, or — or —C(O)NH$_2$.

In one embodiment, the term "halide" used herein refers to any substituent of the halogen group (group 17). In another embodiment, halide is flouride, chloride, bromide or iodide. In another embodiment, halide is fluoride. In another embodiment, halide is chloride. In another embodiment, halide is bromide. In another embodiment, halide is iodide.

In one embodiment, the term haloalkyl used herein refers to alkyl, or cycloalkyl substituted with one or more halide atoms. In another embodiment haloalkyl is perhalogenated (completely halogenated, no C—H bonds). In another embodiment, haloalkyl is CH$_2$CF$_3$. In another embodiment. haloalkyl is CH$_2$CCl$_3$. In another embodiment, haloalkyl is CH$_2$CBr$_3$. In another embodiment, haloalkyl is CH$_2$Cl$_3$. In another embodiment, haloalkyl is CF$_2$CF$_3$. In another embodiment, haloalkyl is CH$_2$CH$_2$CF$_3$. In another embodiment, haloalkyl is CH$_2$CF$_2$CF$_3$. In another embodiment, haloalkyl is CF$_2$CF$_2$CF$_3$.

A specific, non-limiting, example of green-fluorescent RBF compounds 115 which were tested below include compounds denoted JK-71.

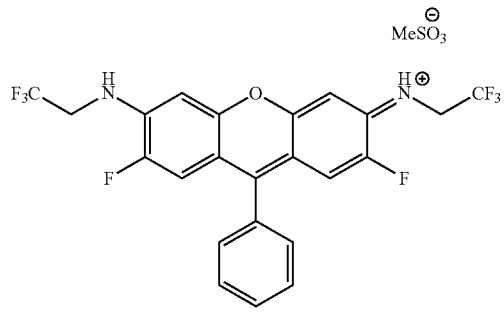

JK-71

(Z)—N-(2,7-difluoro-9-phenyl-6-((2,2,2-trifluoroethyl)amino)-3H-xanthen-3-ylidene)-2,2,2-trifluoroethan-1-aminium methanesulfonate Some embodiments of green-fluorescent RBF compounds are presented in more detail in U.S. patent application Ser. No. 15/252,597 and are considered likewise part of the present disclosure. Non-limiting examples are provided in the following variants, numbered 2-8, 2-9, 2-10, 2-11, 2-12, 2-15 and 2-16.

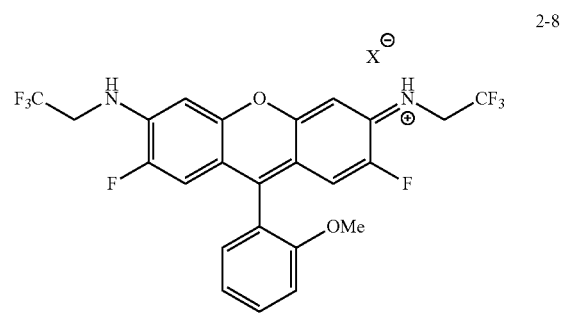

2-8

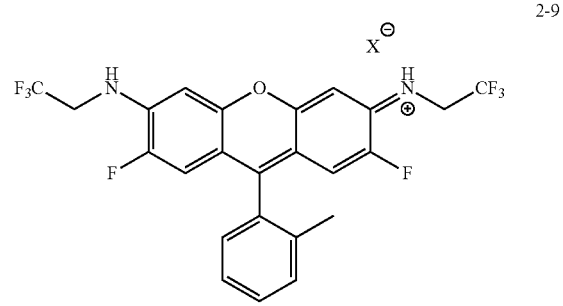

2-9

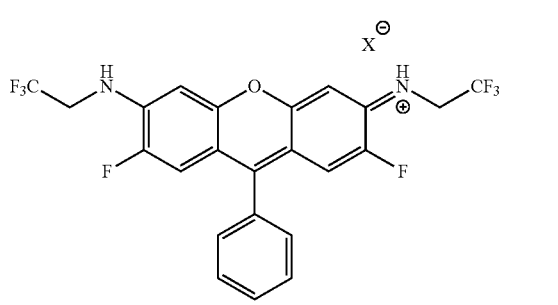

2-10

-continued 2-11
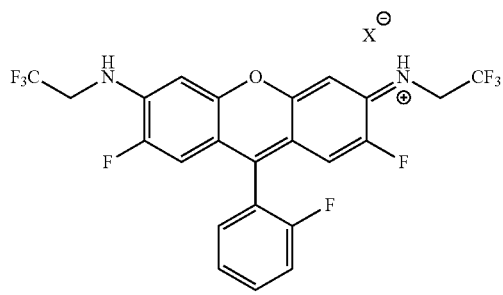

2-12
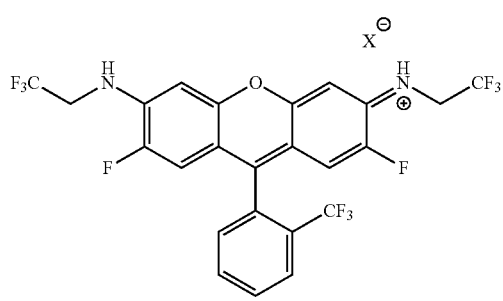

2-15
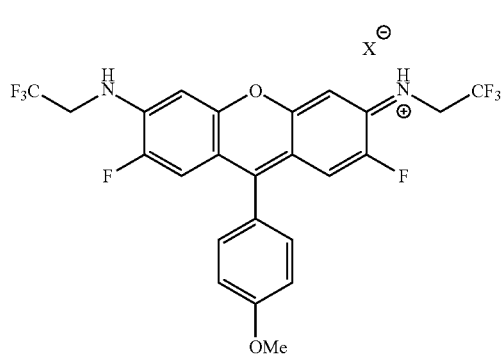

2-16
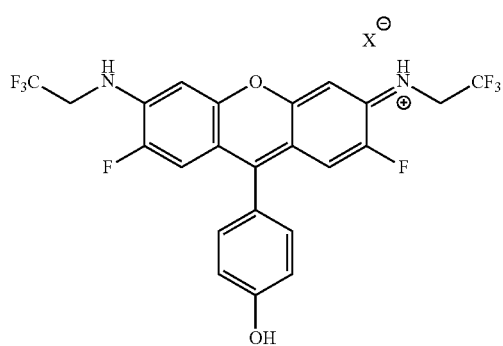

Referring back to FIGS. 1 and 2A, some embodiments comprise color conversion films 130 for LCD's 140 having RGB color filters 86 which comprise color conversion element(s) such as RBF compound(s) 115 or other compounds 116 selected to absorb illumination from backlight source 80 of LCD 140 and have a R emission peak and/or a G emission peak (see non-limiting examples below). For example, color conversion films 130 for LCD's with backlight source 80 providing blue illumination may comprise both R and G peaks provided by corresponding RBF compounds having Formula 1 and Formula 2. In another example, color conversion films 130 for LCD's with backlight source 80 providing white illumination may comprise R peak provided by corresponding RBF compound(s) having Formula 1. Color conversion film(s) 130 may be set in either or both backlight unit 142 and LCD panel 85; and may be attached to other film(s) in LCD 140 or replace other film(s) in LCD 140, e.g. being multifunctional as both color conversion films and polarizers, diffusers, etc., as demonstrated above. Color conversion film(s) 130 may be produced by various methods, such as sol gel and/or UV curing processes, may include respective dyes at the same or different layers, and may be protected by any of a protective film, a protective coating and/or protective components in the respective sol gel or UV cured matrices which may convey enhanced flexibility, mechanical strength and/or less susceptibility to humidity and cracking. Color conversion film(s) 130 may comprise various color conversion elements such as organic or inorganic fluorescent molecules, quantum dots and so forth.

Sol-Gel Processes

Some embodiments of fluorescent film production 100 were developed on the basis of sol gel technology in a different field of laser dyes. Reisfeld 2006 (Doped polymeric systems produced by sol-gel technology: optical properties and potential industrial applications, Polimery 2006, 51(2): 95-103) reviews sol-gel technology based on hydrolysis and subsequent polycondensation of precursors, such as organosilicon alkoxides, leading to formation of amorphous and porous glass. The matrices for incorporation of organically active dopants are the glass/polymer composites, organically modified silicates (ORMOSIL) or hybrid materials zirconia—silica—polyurethane (ZSUR). However, the matrices taught by Reisfeld 2006 do not yield films with photo-stable fluorescent compounds that are necessary for color conversion films.

Starting from Reisfeld 2006, the inventors have found out that sol gel technology may be modified and adapted for producing films of fluorescent optical compounds which may be used in displays, with surprisingly good performance with respect to emission spectra and stability of the fluorescent compounds. The inventors have found out that multiple modifications to technologies discussed in Reisfeld 2006 enable using them in a completely different field of implementation and moreover, enable to enhance the stability of the fluorescent compounds and to tune their emission spectra (e.g., peak wavelengths and widths of peaks to enable wide color gamut illuminance from the display backlight) using process parameters. Hybrid sol-gel precursor formulations, formulations with rhodamine-based fluorescent compounds, films, displays and methods are provided, in which the fluorescent compounds are stabilized and tuned to modify display backlight illumination in a manner that increases the display's efficiency and widens its color gamut. Silane precursors are used with silica nanoparticles and zirconia to provide fluorescent films that may be applied in various ways in the backlight unit and/or in the LCD panel and improve the display's performance. The sol-gel precursor and film forming procedures may be optimized and adjusted to provide a high photostability of the fluorescent compounds and narrow emission peaks of the backlight unit.

FIG. 6A is a high level schematic illustration of precursors 110, formulations 120, films 130 and displays 140 according to some embodiments of the invention. FIG. 6B illustrates schematically prior art methods 90 according to Reisfeld 2006. Disclosed processes and methods 200 overarch compounds and processing steps for formulations 110, 120 and film 130 as well as integration steps of films 130 in display 140.

Hybrid sol-gel precursor formulations 110 comprise an ESOR 106 prepared from TEOS (tetraethyl orthosilicate) 102, at least one silane precursor 104 and/or MTMOS (methyltrimethoxysilane) 91B, and GLYMO 91C; a DURS powder 109 prepared from isocyanate-functionalized silica nanoparticles 94B and ethylene glycol 108; and a transition metal(s) alkoxide matrix solution 103 (based on e.g., zirconia, titania or other transition metal(s) alkoxides). The ratios (wt/vol/vol (mg/ml/ml)) of DURS/ESOR/transition metal(s) alkoxide matrix solution may be in the range 15-25/1-3/1, with each of the components possibly deviating by up to 50% from the stated proportions. Additional variants 107 are provided below; FIG. 6A presents non-limiting examples of process 200.

In a non-limiting example, the ESOR and the transition metal(s) alkoxide matrix solution may be mixed at ratio of between 1:1 and 3:1 (e.g., 2:1) followed by adding the DURS at a concentration of 5-10 mg/1 ml mixed (e.g., ESOR and zirconia) solution—resulting in ratios (wt/vol/vol (mg/ml/ml)) of DURS/ESOR/transition metal(s) alkoxide matrix solution of 15-30/2/1 in the non-limiting example, wherein any of the components may deviate by up to ±50% from the stated proportions. The solution may then be mixed (e.g., for one hour) and then filtered (e.g., using a syringe with a 1 μm filter). The fluorophore may then be added to form formulation 120 from precursor 110, and the mixing may be continued for another hour. Formulation 120 then be evaporated and heated (e.g., in a non-limiting example, using a rotovap under pressure of 60-100 mbar and temperature of 40-60° C.) to achieve increased photo-stability as found out by the inventors and explained below.

ESOR—Epoxy Silica Ormosil Solution

Specifically, compared to process 90 of Reisfeld 2006, the inventors have found out that replacing TMOS 91A by TEOS 102 and using different silane precursors 104 provide ESOR 106 which enables association of rhodamine-based fluorescent (RBF) compounds 115 in resulting films 130 which are usable in displays 140, which prior art ESOR 92 does not enable. In particular, the inventors have used various silane precursors 104 to enhance stability of, and provide emission spectrum tunability to RBF compounds 115 in produced film 130, as shown in detail below.

For example, silane precursors 104 may comprise any of MTMOS (methyltrimethoxysilane), PhTMOS, a TMOS with fluorine substituents, e.g., $F_1$TMOS (trimethoxy(3,3,3-trifluoropropyl)silane), $F_0$TEOS (Fluorotriethoxysilane) or $F_2$TMOS (tridecafluoro-1,1,2,2-tetrahydrooctyl)trimethoxysilane, 1,2-bis(triethoxysilyl) ethane, trimethoxy(propyl) silane, octadecyltrimethoxysilane, fluorotriethoxysilane, and ammonium(propyl)trimethoxysilane. The first three options are illustrated below.

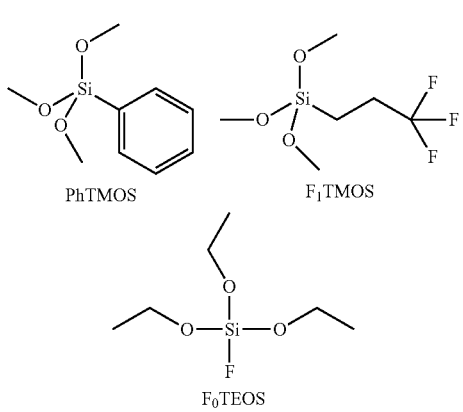

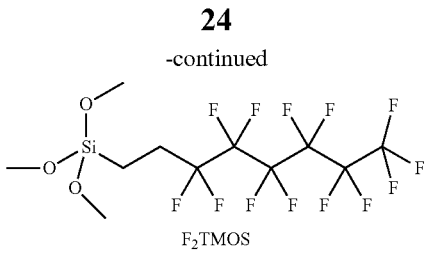

F$_2$TMOS

In certain embodiments, Silane precursors 104 may comprise any alkoxysilane, with $R^1$, $R^2$, $R^3$ typically consisting of methyl or ethyl groups (e.g., $R^4$—OSi(Me)$_3$), and $R^4$ may consist of a branched or unbranched carbon chain, possibly with any number of halogen substituents, as illustrated below.

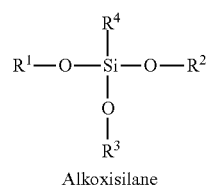

Alkoxisilane

In certain embodiments, silane precursors 104 may comprise any of: tetraalkoxysilane (e.g., tetraethoxysilane), alkyltrialkoxysilane, aryltrialkoxysilane, haloalkyltrialkoxysilane, heterocycloalkyltrialkoxysilane, N-heterocycletrialkoxysilane, (3-Glycidyloxypropyl)trialkoxysilane, haloalkyltrialkoxysilane, heterocycloalkyltrialkoxysilane, N-heterocycletrialkoxysilane, and cyclo alkyltrialkoxysilane.

In certain embodiments, silane precursors 104 may be selected from any of the following structures:

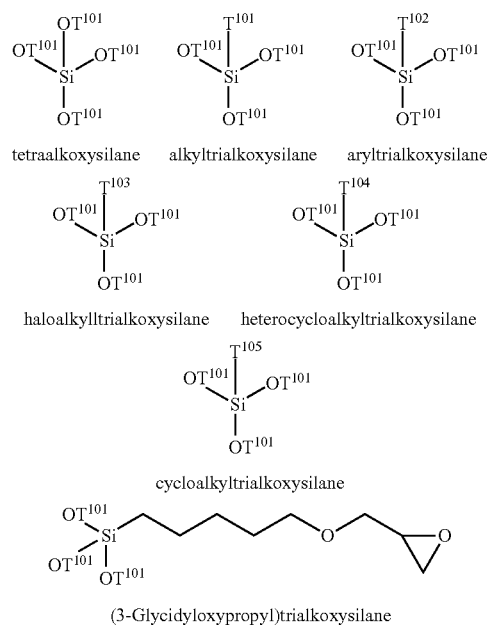

-continued

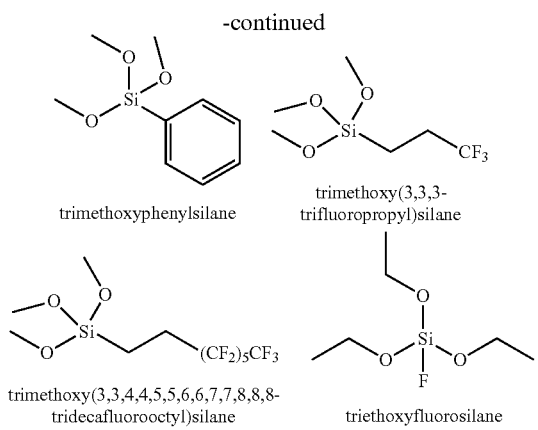

trimethoxyphenylsilane trimethoxy(3,3,3-trifluoropropyl)silane trimethoxy(3,3,4,4,5,5,6,6,7,7,8,8,8-tridecafluorooctyl)silane triethoxyfluorosilane wherein T101 is an alkyl, T102 an aryl, T103 an haloalkyl, T104 an heterocycloalkyl (including a N-heterocycle) and T105 an cycloalkyl, as defined herein.

In certain embodiments, ESOR may be prepared by first mixing the TEOS and the at least one silane precursor(s) under acidic conditions and then adding the GLYMO. The acidic conditions may be adjusted by adding acetic acid, and be followed by adding water and alcohol(s) such as ethanol, propanol, 2-propanol or butanol.

In certain embodiments, the volumetric ratio between TEOS:MTMOS or other silane precursor(s):GLYMO may be between 1:1:1.5-2; and the volumetric ratio between TEOS:silane precursor(s):acetic acid:alcohol:water may be between 1:1:0.01-1:1-10:4-8. ESOR mixing time may be reduced to five minutes. Any of the components may deviate by up to ±50% from the stated proportions.

In some embodiments (e.g., additional variants 107), ethanol and/or water are not used, to simplify the process. For example, diphenylsilanediol (DPSD) may be used to provide a water-free matrix, avoiding the first hydrolysis step in the condensation.

In some embodiments (e.g., additional variants 107), citric acid and/or ascorbic acid may replace or be added to the acetic acid.

DURS (Diurethane Siloxane)—Nanoparticles Powder

The inventors have found out that using ethylene glycol 108 for DURS 109 instead of polyethylene glycol 94A for DURS 95 (as in Reisfeld 2006) enables better control of the film production and better films 130 than prior art sol-gel precursors 96, as explained below.

The isocyanate-functionalized silica nanoparticles (Si NP) may comprise (isocyanato)alkylfunctionalized silica nanoparticles and/or 3-(isocyanato)propyl-functionalized silica nanoparticles, which may be prepared from precursors (isocyanato)alkylfunctionalized trialkoxysilane and/or 3-(isocyanato)propyltriethoxysilane, respectively.

The DURS may be prepared by mixing and refluxing the silicon and glycolated precursors. In some embodiments, the ethylene glycol may be added in excess. In some embodiments, the reflux may be followed by cooling and filtration steps. In some embodiments, chlorobenzene ($C_6H_5Cl$) may be added to the mixture before the reflux step. In some embodiments, the chlorobenzene ($C_6H_5Cl$) may be evaporated prior to the cooling step. In an example, DURS was prepared by refluxing 3-isocyanatopropyl functionalized nanoparticles and ethylene glycol. In one embodiment, about 50-150 mg of 3-isocyanatopropyl functionalized silica nanoparticles (with 200-400 mesh, 1.2 mmol/g loading) and 16-320 μl of ethylene glycol were refluxed in chlorobenzene for about 2-6 hours. The functionalized silica nanoparticles were then separated from the chlorobenzene by a rotary evaporator.

In some embodiments (e.g., additional variants 107), DURS is not used, to simplify the process.

Transition Metal(s) Alkoxide Matrix Solution

Transition metalalkoxide matrix solution may comprise alkoxides of one or more transition metals. For example, a zirconia ($ZrO_2$) matrix solution may be prepared from zirconium tetraalkoxide, e.g., $Zr(OPr)_4$ and/or zirconium, mixed with alcohol (e.g., propanol) under acidic conditions (e.g., in the presence of acetic acid, citric acid and/or ascorbic acid). Various transition metals alkoxides may be used in place or in addition to zirconia.

In certain embodiments, the ESOR may be mixed with the zirconia matrix solution at a 2:1 volumetric ratio, and the DURS may then be added to the mixture to provide, after mixing (e.g., for 1-5 hours) and filtering, hybrid sol-gel precursor formulations. The zirconia matrix solution may be configured to catalyze the epoxy polymerization of the ESOR. In some embodiments, the zirconia matrix solution may be added to the ESOR after e.g., 15, 30, 45 minutes. The subsequent mixing time may be decreased down to 10 minutes.

In some embodiments, other metal oxide matrix may be used instead or in addition to zirconia matrix during the sol-gel process, such as titania using titanium isopropoxide or boron oxide using boric acid. Zirconia and/or alkoxides from transition metals such as boron alkoxide 103 may be used in preparing sol-gel precursor 110.

Formulation

Formulations 120 comprise hybrid sol-gel precursor formulations 110 and at least one RBF compound 115 such as red-fluorescent RBF compound(s) and green-fluorescent RBF compound(s) which may be configured to emit the R and G components of the required RGB illumination, provided by the display's backlight unit (red-fluorescent RBF compounds emit radiation with an emission peak in the red region while green-fluorescent RBF compounds emit radiation with an emission peak in the green region). It is emphasized that formulations 120 are very different from prior art laser dye formulation 97 as laser dye usage as gain medium is very different from the operation of fluorescent films in the backlight unit, e.g., concerning stability, emission spectra and additional performance requirement as well as operation conditions.

Stages of methods 200—namely preparing hybrid sol-gel precursor formulation 110 (stage 210), mixing in RBF compound(s) 115 to form formulation 120 (stage 220), forming film 130 (stage 230) and optionally evaporating alcohols prior to film formation (stage 225)—are shown schematically and explained in more detail below.

The mixture of the hybrid sol-gel precursor formulation and the RBF compound(s) may be stirred and then evaporated and heated (e.g., in a non-limiting example, stirred for between 20 minutes and three hours, evaporated at 60-100 mbar and heated to 40-60° C.) to increase the photo-stability of the RBF compound(s) (see additional process details below). Process parameters may be adjusted to avoid damage to the fluorescent dyes, control parameters of the sol gel process and optimize the productivity in the process.

The concentration of the RBF compound(s) may be adjusted to determine the final peak emission intensity excited by the chosen backlight unit and may range e.g., between 0.005-0.5 mg/ml. It is noted that multiple fluorescent molecules having different emission peaks may be used in a single formulation 120. The processes may be optimized to achieve required relations between the RBF compound(s) and the other components of the film, e.g., to achieve any of supramolecular encapsulation of the RBF compound(s) in the sol gel matrix, covalent embedding of the RBF compound(s) in the sol gel matrix (e.g., via siloxane bonds), and/or incorporation of the RBF compound(s) in the sol gel matrix.

Silane precursors 104 may be selected according to the used RBF compound. For example, the inventors have found out that PhTMOS may be used to stabilize red-fluorescent RBF compounds. In another example, the inventors have found out that TMOS with fluorine substituents may be used to stabilize red-fluorescent RBF compounds. Modifying and adjusting parameters of the substituents was found to enable control of the photostability and emission characteristics of the fluorescent compounds. In yet another example, the inventors have found out that $F_1$TMOS may be used to stabilize green-fluorescent RBF compounds. These and more findings are presented below in detail.

Optimizing the Silane Precursors in the ESOR to Stabilize and Tune the Fluorescent Molecules Films 130 prepared from formulation 120 may comprise ESOR 106 prepared from TEOS 102, at least one silane precursor 104 (and/or MTMOS 91B), and GLYMO 91C; DURS powder 109 prepared from isocyanate-functionalized silica nanoparticles 94B and ethylene glycol 108; a transition metal(s) alkoxide matrix solution 103; and at least one RBF compound 115, selected to emit green and/or red light and being supramolecularly encapsulated and/or covalently embedded within film 130. Silane precursors 104 may comprise any of MTMOS, PhTMOS, a TMOS with fluorine substituents, $F_1$TMOS, $F_2$TMOS (tridecafluoro-1,1,2,2-tetrahydrooctyl)trimethoxysilane, 1,2-bis(triethoxysilyl)ethane, trimethoxy(propyl)silane, octadecyltrimethoxysilane, fluorotriethoxysilane, and ammonium(propyl)trimethoxysilane. For example, for film 130 and/or film layer 134 with red-fluorescent RBF compound, silane precursor 104 may comprise PhTMOS and/or a TMOS with fluorine substituents. In another example, for film 130 and/or film layer 132 with green-fluorescent RBF compound, silane precursor 104 may comprise $F_1$TMOS.

Examples are provided below for four matrix compositions ($Z_1$, $Z_2$, $Z_3$, $Z_4$) for mixtures of ESOR and zirconia matrix solution having the components $Zr(PrO)_4$: GLYMO: TEOS: silane precursor at n=0.011:0.022:0.013:0.021 (moles), with the silane precursor being MTMOS in $Z_1$, PhTMOS in $Z_2$, $F_1$TMOS in $Z_3$, and $F_2$TMOS in $Z_4$, as illustrated below.

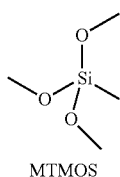

MTMOS  $Z_1$

PhTMOS  $Z_2$ $F_1$TMOS  $Z_3$ $F_2$TMOS  $Z_4$

These matrices were mixed with several dyes and tested, as corresponding films 130, for quantum yield and lifetime, as presented in detail below, with results presented in Table 1. All but the rows marked by the asterisk employ evaporation of alcohols prior to film formation (stage 225). The lifetime was defined as a reduction to 80% of the initial emission intensity (measured by a fluorimeter) or up to 3 nm change in wavelength peak position, was measured in accelerated procedures and is shown as a relative value (factor) relative to the reference sample $Z_1$ (MTMOS) in the first line. RBF compounds ES-61 and RS-130 are red-fluorescent, RBF compound JK-71 is green-fluorescent, and their structures are provided above. The emission peak wavelengths in lines 1-4 and 9 vary according to the concentration of the fluorophore and the thickness of the sol-gel layer. The data was measured with a blue light flux of 100 mW/cm² and temperature of 60° C. for the green RBF compounds and with a white light flux of 20 mW/cm² and temperature of 60° C. for the red RBF compounds.

TABLE 1

Optimization of the silane precursors

| # | Matrix (silane precursor) | Fluorescent compound (see above) | FWHM (full width at half maximum, nm) | Emission peak wavelength (nm) | Quantum yield | Lifetime multiplier (factor) |
|---|---|---|---|---|---|---|
| 1 | $Z_1$ (MTMOS)* | Green (JK-71) | 35-40 | 535-550 | 55-75 | Reference |
| 2 | $Z_3$ ($F_1$TMOS) | Green (JK-71) |  | 525-540 | 80-90 | ×3 |
| 3 | $Z_1$ (MTMOS)* | Red (ES-61) | 40-45 | 625-635 | 70-75 | ×3 |
| 4 | $Z_2$ (PhTMOS) | Red (ES-61) |  | 625-635 | 70-75 | ×8 |
| 5 | $Z_3$ ($F_1$TMOS) | Green (JK-71) | 42 | 535 |  |  |
| 6 | 1:3 $Z_2$:$Z_3$ | Green (JK-71) |  | 538 |  |  |
| 7 | 1:1 $Z_2$:$Z_3$ | Green (JK-71) |  | 540 |  |  |

TABLE 1-continued

Optimization of the silane precursors

| # | Matrix (silane precursor) | Fluorescent compound (see above) | FWHM (full width at half maximum, nm) | Emission peak wavelength (nm) | Quantum yield | Lifetime multiplier (factor) |
|---|---|---|---|---|---|---|
| 8 | $Z_2$ (PhTMOS) | Green (JK-71) | | 543 | | |
| 9 | $Z_3$ with JK-71 + $Z_2$ with ES-61 denoted EC-154 | | Green 30-35 Red 45-50 | 535-543 633-642 | | |

| # | Matrix (silane precursor) | Fluorescent compound (see above) | Approximate concentration in the film (mg/mL) | Film thickness (μm) | | Quantum yield | Lifetime multiplier (factor) |
|---|---|---|---|---|---|---|---|
| 10 | $Z_1$ (MTMOS)* | Red (RS-130) | 0.06 | 10 | | 70% | ×3 |
| 11 | $Z_1$ (MTMOS) | Red (RS-130) | 0.06 | 10 | | 73% | ×8 |
| 12 | $Z_2$ (PhTMOS) | Red (RS-130) | 0.03 | 10 | | 72% | ×9 |
| 13 | $Z_2$ (PhTMOS) | Red (ES-61) | 0.06 | 10 | | 72% | ×16 |
| 14 | $Z_2$ (PhTMOS) | Green (JK-71) | 0.075 | | 538 | 85% | same |
| 15 | $Z_3$ ($F_1$TMOS) | Green (JK-71) | 0.15 | 80 | 535 | 88% | ×3 |
| 16 | $Z_4$ ($F_2$TMOS) | Green (JK-71) | 0.15 | | 522 | 80% | same |
| 17 | $Z_2$ (PhTMOS) | Red (RS-130) | 0.03 | | 623 | 72% | ×9 |
| 18 | $Z_3$ ($F_1$TMOS) | Red (RS-130) | 0.06 | | 618 | 67% | ×4 |
| 19 | $Z_4$ ($F_2$TMOS) | Red (RS-130) | 0.06 | | 616 | 73% | ×10 |

*No evaporation of alcohols prior to film formation

Table 1 demonstrates the capabilities of the disclosed technology to increase the lifetime of RBF compound(s) in film 130 multiple times over (eight fold—line 4 vs. line 1, fivefold—line 13 vs. line 10), reach high quantum yields (above 80%—lines 2, 14 15), tune the emission peak wavelength of the RBF compound(s) significantly (lines 5-8, 14-16, 17-19) and provide tuned multi-layered films 130 (line 9). Specifically, intercalating the red fluorescent compound(s) in the $Z_2$ matrix resulted in increased photo-stability, intercalating the green fluorescent compound(s) in the $Z_3$ matrix resulted in increased photo-stability and improved the QY (quantum yield) compare to the $Z_1$ matrix. When combining the precursor of $Z_2$ and $Z_3$ together, changing the PhTMOS:$F_1$TMOS ratio can provide tuning of the green wavelength (lines 5-8).

The inventors have also found out that the length of the carbon chain of the silane precursor(s) may contribute to the stability of the red-fluorescent RBF compounds; in certain embodiments the carbon chain may consist of 8, 9, 10, 12 or more carbon atoms, possibly with corresponding fluorine atom as hydrogen substituents. In certain embodiments, some or all fluorine atoms may be replaced by another halogen such as chlorine. Moreover, the inventors have found out that modifying the length and hydrophobic\hydrophilic degree of the chain may be used to further tune and adjust the emission peak (beyond the data exemplified above), according to requirements.

Figure 7A:
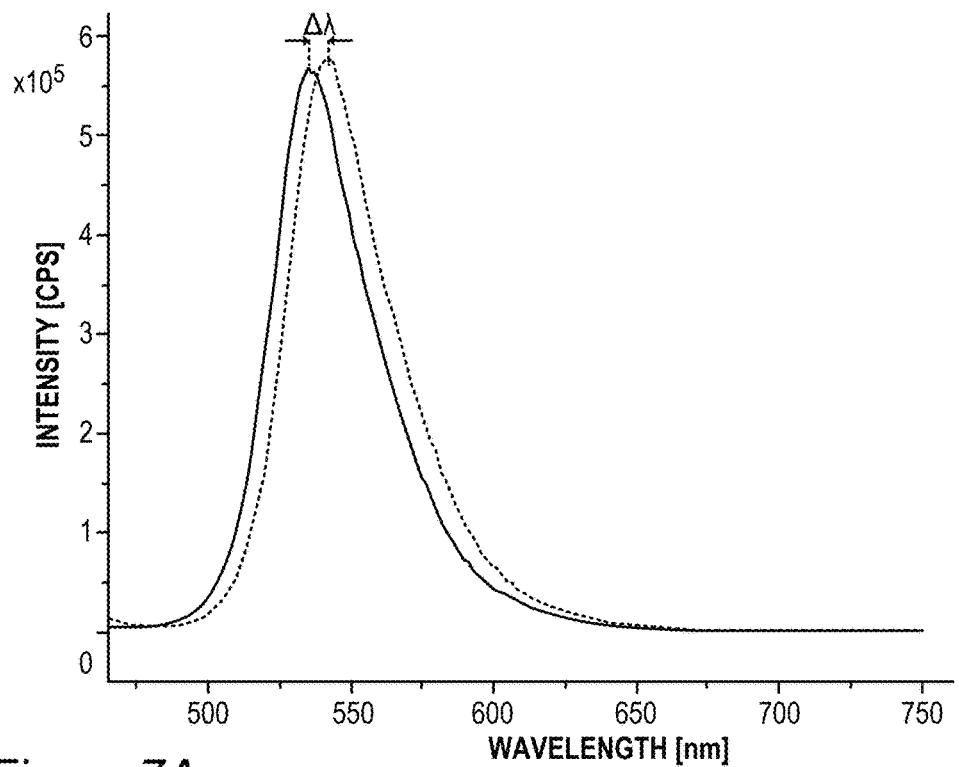
FIGS. 7A and 7B are examples for illustrations of characteristics of formulations and films, according to some embodiments of the invention.
Figure 7B:
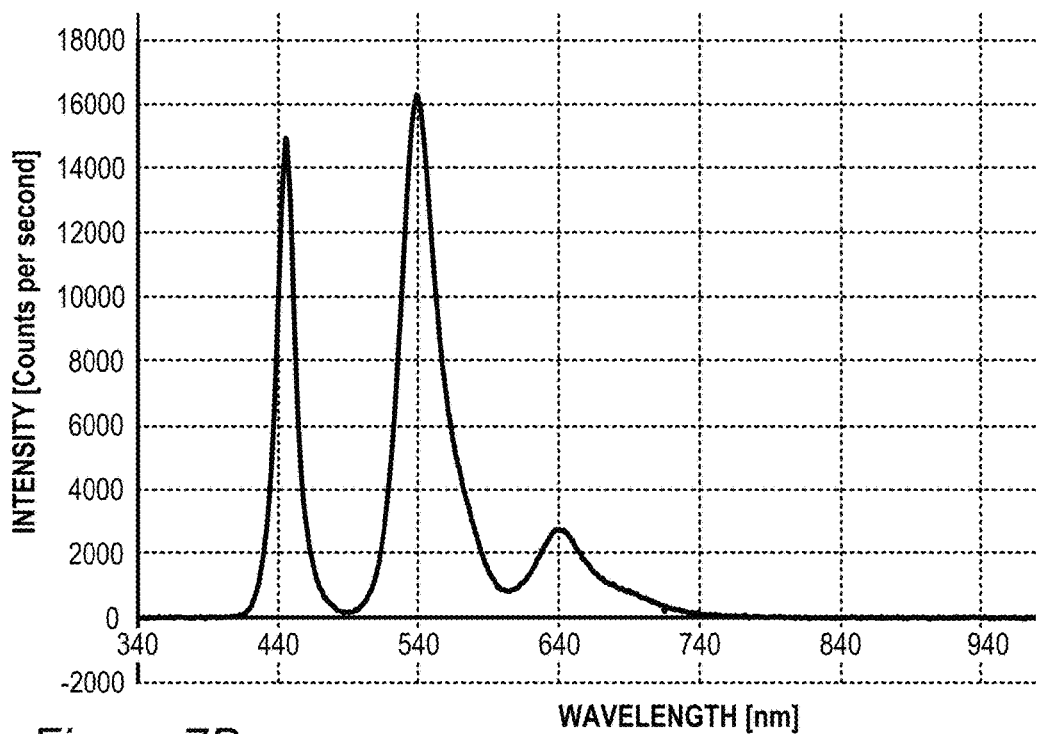

FIGS. 7A and 7B are examples for illustrations of characteristics of formulations and films according to some embodiments of the invention. FIG. 7A exemplifies the tuning of the emission spectrum (tuning of the emission peak is indicated by Δλ) by adjusting formulation 120, the illustrated cases corresponding to line 15 (JK-71 in Z3 with peak at 535 nm) and line 8 (JK-71 in Z2 with peak at 543 nm) in Table 1. FIG. 7B exemplifies the implementation of formulation 120 with two fluorescent compounds and different respective precursors indicated in line 9 in Table 1 ($Z_3$ with JK-71+$Z_2$ with ES-61) providing two different emission peaks.

In certain embodiments, silane precursors 104 may comprise, in addition or in place of silane precursor 104 disclosed above, at least one of: 1,2-bis(triethoxysilyl)ethane, trimethoxy(propyl)silane, octadecyltrimethoxysilane, fluorotriethoxysilane, ammonium(propyl)trimethoxysilane (illustrated below) and any further varieties of any of disclosed silane precursor 104.

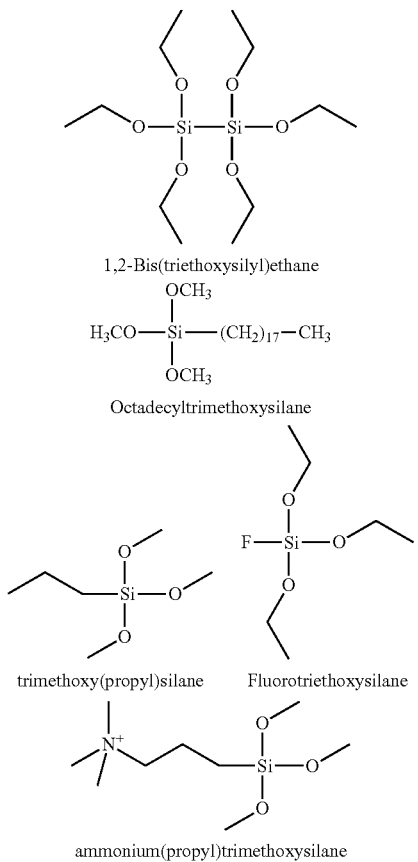

Film Preparation

Films 130 may be prepared from formulations 120 using a transparent substrate (e.g., glass, polyethylene terephthalate (PET), polycarbonate, poly-methyl-methacrylate (PMMA) etc.) or as stand-alone films (after solidification), and be used as color-conversion films in backlight units of displays. The substrate may be scrubbed to increase the surface roughness or be laminated to provide diffuser properties—in order to increase scattering or diffusing of blue light from the backlight unit.

Spreading formulation 120 may be carried out by any of manual coating (blade or spiral bar), automatic coting (blade or spiral bar), spin coating, deep coating, spray coating or molding; and the coatings may be applied on either side or both sides of the transparent substrate. Multiple layers of formulation 120 may be applied consecutively to film 130 (film thickness may range between 10-100 μm).

Concerning the drying, or curing process of formulation 120, it may be a two-step process comprising an initial short term curing at a high reaction rate for determining the formation of the sol-gel matrix and a long term curing at a lower reaction rate for determining the completion of the reaction (the temperature and duration of this step may be set to determine and adjust the reaction results). The initial short term curing (drying) maybe carried out by a hot plate, an oven, a drier and/or an IR (infrared) lamp. In a non-limiting example, film 130 on glass may be placed on top of a hot plate or in an oven and undergo the heating profile: constant temperature (e.g., 60-100° C. for 1-3 hours) followed by step-wise temperature increments (e.g., 3-5 steps of 20-40° C. increase during 15-90 minutes each). In another non-limiting example, filmed may be cured by a drier or an IR lamp, e.g., being set on a conveyor (moving e.g., in 0.1-5 m/min) and heated to temperatures between 60-100° C. The curing may be configured to avoid film annealing and provide a required mesh size, while maintaining and promoting the stability of the RBF compound(s) 115. Curing parameters may be optimized with respect to a tradeoff between photostability and brightness, which relate to the film density resulting from the curing. In case of films with multiple layers (e.g., up to twenty layers), additional curing may be carried out between layer depositions (e.g., 50-90° C. for 1-3 hours) and a final curing may be applied after deposition of the last layer (e.g., 100-200° C. for 2-72 hours). In some embodiments, lower curing temperatures may be applied for longer times, e.g., the curing may be carried out for a week in 50° C. In some embodiments, curing temperatures may be raised stepwise, possibly with variable durations, e.g., the curing may be carried out stepwise at 30° C., 60° C., 90° C., two hours at each step. Optionally a final curing stage (e.g., at 130° C.) may be applied.

For example, green-fluorescent RBF compound in $Z_3$ ($F_1$TMOS) matrix was cured under different heat transport regimes: IR only (IR intensity 10%; 25 min on the conveyor moving at 0.1 m/min) dryer only (at consecutive 15 min steps of 30° C., 50° C., 70° C., 90° C., 110° C.) and a combination of IR followed by dryer, with a final curing of 24$h$ in an oven at 130° C. The samples maintained their emission peaks, FWHM (full width at half maximum) and QY, and exhibited the following reduction of emission intensity after eight days with respect to the initial intensity (measured by a fluorimeter): IR only—54%, dryer only—79%, IR and dryer—73%, showing the efficiency of the latter two methods.

The process may be further adjusted to yield encapsulation or bonding of the RBF compound(s) 115 in the matrix which narrows the FWHM of the emission band by adjusting the micro-environment of the fluorescent molecules. The process may be monitored and optimized using any of quantum yield measurements, fluorescent measurements, photometric measurements, photostability (lifetime) testing and others.

Concerning display properties, it is noted that emission peaks may be related to the display hue property and the FWHM may be related to the display saturation property. The adjustment of the hue and saturation properties may be carried out by corresponding adjustments in one or more components of formulation 120 and/or in the film production process described above. It is further noted that additional display properties such as intensity/lightness and brightness/LED power may be adjusted with respect to the designed film properties.

Preparation and Measurement Details—Examples

The following illustrates some experimental procedures used to derive the results presented above (see FIG. 6A for overview). These procedures are not limiting the application of the disclosed invention.

Figure 8A:
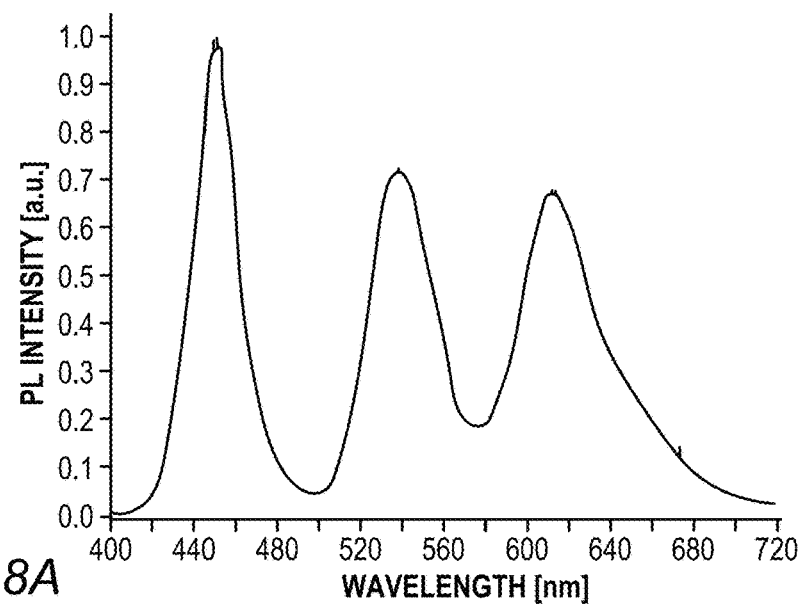
FIGS. 8A-8E illustrate examples of emission results of films produced by sol gel processes, according to some embodiments of the invention.
Figure 8B:
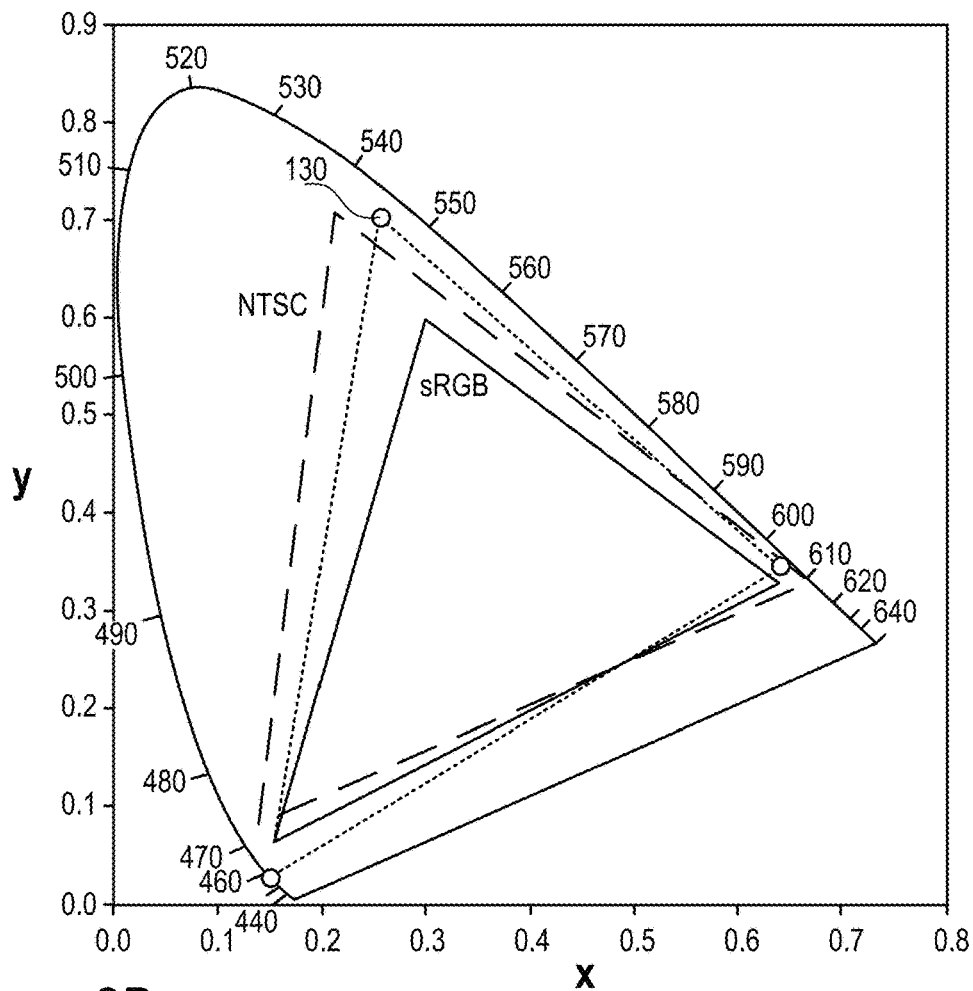

In a first example, film 130 was prepared by applying ten layers of formulation 120 with green-fluorescent RBF compound at a concentration of 0.1 mg/ml in the formulation, layer by layer, onto a transparent substrate and then applying two layers of formulation 120 with red-fluorescent RBF compound at a concentration of 0.05 mg/ml in the formulation, layer by layer, onto the former, green emitting layers. The inventors later found out that the multiple green-fluorescent layers may be replaced by fewer or even a single layer when evaporation of the alcohols is carried out prior to the layer application. FIG. 8A illustrates the resulting spectrum, having a first emission peak at 617±3 nm (red) and a FWHM of around 50 nm; and a second emission peak at 540±3 nm (green) and a FWHM of around 45 nm, according to some embodiments of the invention. The quantum yield of the film was measured by a fluorimeter having an integrating sphere to be around 70-90% depending on the RBF compound and the lifetime at the device level was estimated to be in the range of 20,000 to 50,000 hours. FIG. 8B illustrates the CIE 1931 color gamut diagram for the film, compared to NTSC and sRGB standards, according to some embodiments of the invention. As seen in the diagram, the color gamut range of film 130 in display 140 is larger than the standard LCD (sRGB) gamut and is in the range of the NTSC standard gamut.

Figure 8C:
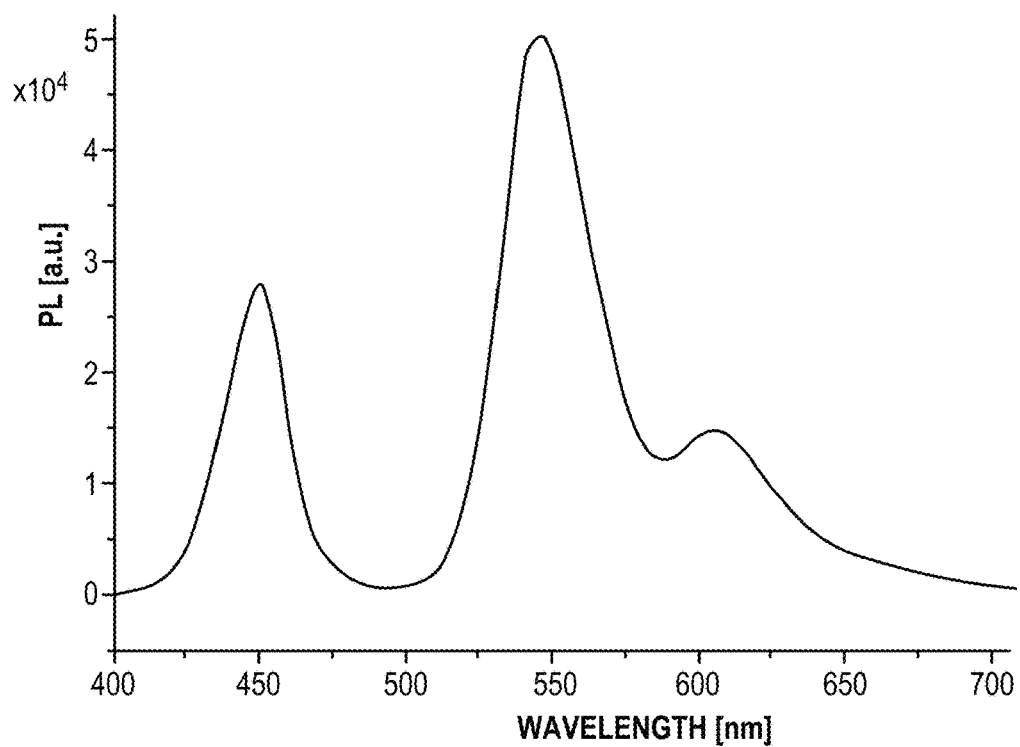

In a second example, thirteen layers of green-fluorescent formulation were applied instead of ten layers as in the first example. FIG. 8C illustrates the resulting emission spectrum, according to some embodiments of the invention. The resulting change of spectrum is illustrated by comparing FIG. 8A for the film prepared in the first example with FIG. 8C for the film prepared in the second example. The relative intensity of the peak at around 550 nm attributed to the green light is higher in FIG. 8C in comparison to the relative intensity of the corresponding peak in FIG. 8A and thus demonstrates that the white point position may be tuned as desired by changing the structure of film 130, e.g., by adjusting the number of layers and/or concentration in formulation 120 of either RBF compound.

Figure 8D:
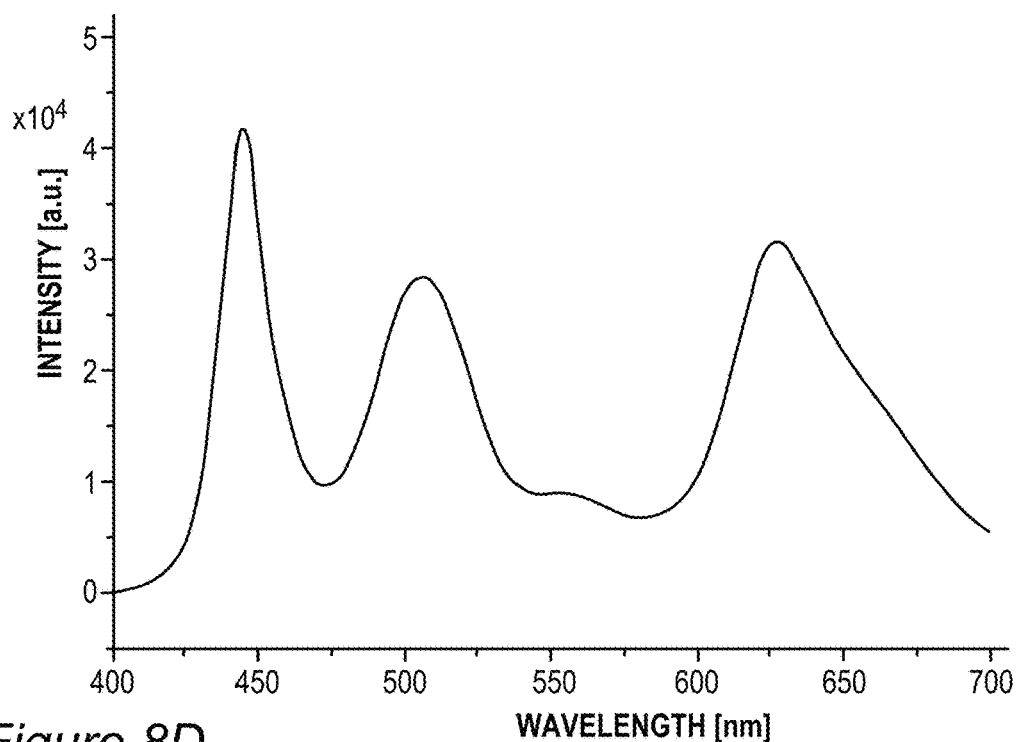

In a third example, consecutive layers of sol-gel formulation 120 were applied directly on light source 80 (in the non-limiting example, on blue light source 80A which emits at a wavelength range of about 400-480 nm) or in close proximity thereto. In the example, both green-fluorescent and red-fluorescent RBF compounds were mixed in formulation 120 and applied as film 130 comprising ten layers to blue LED light source 80A. Correspondingly, FIG. 8D illustrates the resulting emission spectrum, having a first emission peak at 621 nm (red) and a second emission peak at 512 nm (green), both peaks exhibiting a FWHM in the range of 40-50 nm (the peak at 450 nm corresponds to the light source blue emission), according to some embodiments of the invention.

In a third example, some embodiments of used red-fluorescent RBF compounds 115 were 5- and 6-Carboxy X-rhodamine-Silylated illustrated below. The illustrated derivative of RS-130 red RBF compound is a non-limiting example, similar covalent binding of RBF compounds 115 to the sol gel matrix may be achieved with other RBF compounds in similar ways.

5- and 6-Carboxy X-rhodamine-Silylated

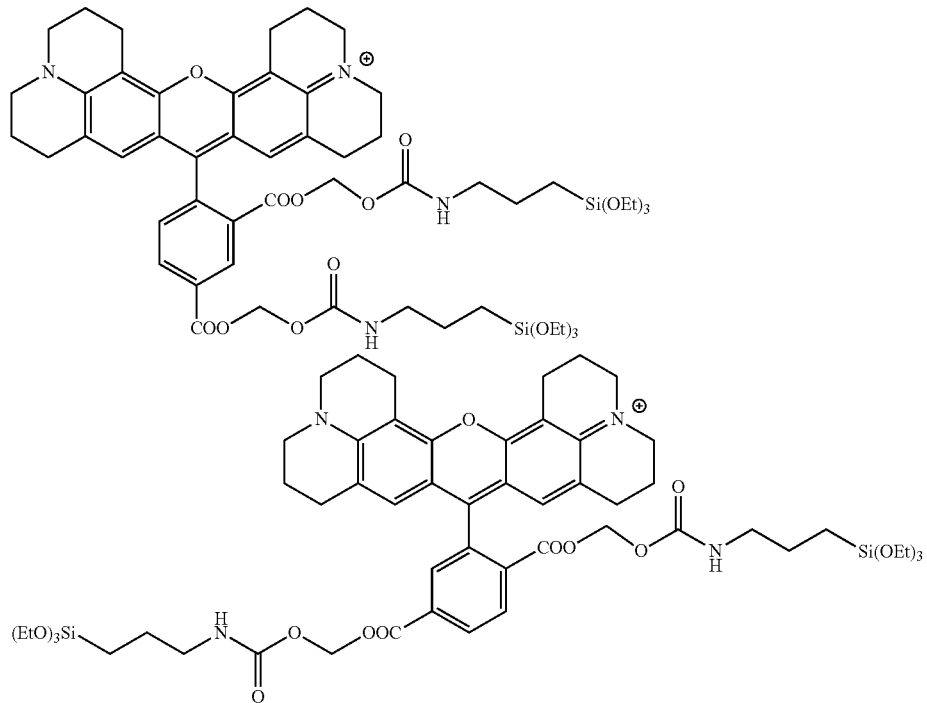

Figure 8E:
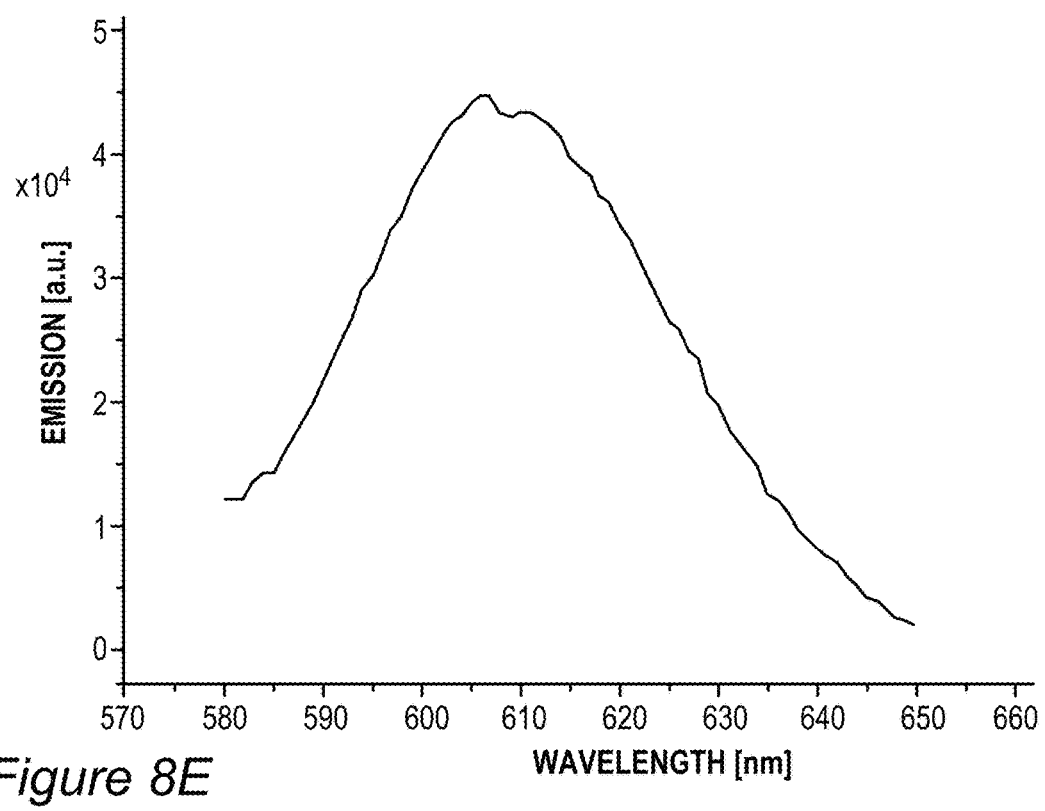

In the example, precursor 110 was configured to covalently bind the RBF compounds to the sol-gel matrix. ESOR 106 was prepared by stirred over-night 3 mg of a mixture of the RBF compounds, 10 ml of ethanol and 3.6 ml of $H_2O$ to yield the ESOR. On the next day 3 ml of TEOS and 3 ml of MTMOS and 250 µl of acetic acid were added to the ESOR mixture, which was then stirred for 10-15 minutes. Finally, 4.8 ml of GLYMO were added to the mixture and stirred for two hours. Zirconia 93 (as a non-limiting example for transition metal(s) alkoxide matrix solution 103) was prepared by stirring together 10 ml of zirconium n-tetrapropoxide in propanol and 3 ml of acetic acid for 10 minutes. 3.3 ml of acetic acid in $H_2O$ (1:1 ratio) and 20 ml of isopropanol were added to the mixture and stirred for another 10 minutes. DURS 109 was prepared by refluxing of 90 mg of 3-isocyanato propyl functionalized silica nanoparticles and 32 µl of ethylene-glycol in chlorobenzene for two hours. The ethylene glycol functionalized nanoparticles were separated from the chlorobenzene by an evaporator. Precursor 110 was prepared by mixing the DURS nanoparticles with 8 ml of the ESOR and 4 ml of $ZrO_2$ solution. The final concentration of the (red-fluorescent) RBF compounds in formulation 120 was 0.08 mg/ml. The mixture is stirred for over one hour and then filtrated. Film 130 was prepared from formulation 120 and its measured emission peak was 610±5 nm with FWHM of 50±5 nm, with the emission curve illustrated in FIG. 8E.

In a forth example, some embodiment of used red-fluorescent RBF compounds 115 were 5- and 6-Carboxy X-rhodamine-Silylated, illustrated above. In the example, precursor 110 was configured to covalently bind the RBF compounds to the sol-gel matrix. ESOR 106 was prepared under either acidic or basic conditions, the former proving to be a better alternative. Under acidic conditions, 4.9 mg of a mixture of the RBF compounds, 10 ml of ethanol, 3.6 ml of $H_2O$ and 125 µl of acetic acid were stirred over-night to yield the ESOR. Alternatively, under basic conditions, 9.6 mg of the RBF compounds, 10 ml of ethanol, 3.41 ml of $H_2O$ and 242 µl of ammonium hydroxide 28% were stirred over-night to yield the ESOR, and on the next day, 125 µl of acetic acid were added to counteract the ammonium hydroxide. In either case, on the next day 3 ml of TEOS and 3 ml of MTMOS and 125 µl of acetic acid were added to the ESOR mixture, which was then stirred for 10-15 minutes. Finally, 4.8 ml of GLYMO were added to the mixture and stirred for two hours. Zirconia 93 (as a non-limiting example for transition metal(s) alkoxide matrix solution 103) was prepared by stirring together 10 ml of zirconium n-tetrapropoxide in propanol and 3 ml of acetic acid for 10 minutes. 3.3 ml of acetic acid in $H_2O$ (1:1 ratio) and 20 ml of isopropanol were added to the mixture and stirred for another 10 minutes. DURS 109 was prepared by refluxing of 90 mg of 3-isocyanato propyl functionalized silica nanoparticles and 32 µl of ethylene-glycol in chlorobenzene for two hours. The ethylene glycol functionalized nanoparticles were separated from the chlorobenzene by an evaporator. Precursor 110 was prepared by mixing the DURS nanoparticles with 8 ml of the ESOR and 4 ml of ZrO$_2$ solution. The final concentration of the RBF compounds in formulation 120 was 0.13 mg/ml when prepared under acidic conditions and 0.46 mg/ml when prepared under basic conditions. The mixture was stirred for over one hour and then filtrated.

Cross-Linking with PMMA

Some embodiments comprise fluorescent compounds which are bonded to PMMA and have Si linkers to bond the PMMA-bonded compounds to the sol-gel matrix.

The following non-limiting examples illustrate binding RBF compounds to PMMA by showing the preparation of RBF compound ES-87 and cross-linking it with PMMA and linker of Si to be bonded to the sol-gel matrix. ES-86 was prepared as a precursor by dissolving 3-bromopropanol (0.65 ml, 7.19 mmol, 1 eq) in dry DCM (dichloromethane) under N$_2$ atmosphere. NEt$_3$ (0.58 ml, 7.91 mmol, 1.1 eq) was added and the mixture was cooled to 0° C. Acryloyl chloride (1.1 ml, 7.19 mmol, 1 eq) was added dropwise and the mixture was heated to room temperature and stirred at this temperature for 2 h. Upon completion, the mixture was quenched with 0.4 ml MeOH, diluted with DCM and was washed with saturated NaHCO$_3$. The organic layer was separated, dried with Na$_2$SO$_4$, filtered and the solvent was removed under reduced pressure. The crude product was purified by column chromatography (SiO$_2$, 10% EtOAc/Hex) to give the product as a colorless oil (943 mg, 68% yield).

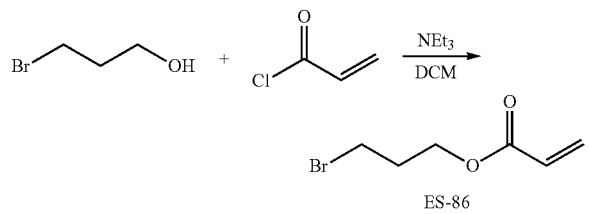

ES-86

ES-87 was then prepared by dissolving RS-106 (see below, 150 mg, 0.26 mmol, 1 eq) in 3 ml dry DMF (dimethylformamide) under N$_2$ atmosphere. K$_2$CO$_3$ (55 mg, 0.4 mmol, 1.5 eq) was added and the mixture was stirred for 5 min before ES-86 (154 mg, 0.8 mmol, 3 eq) was added. The mixture was stirred for 3 hours at room temperature. Upon completion, the mixture was diluted with DCM and was washed with brine. The organic layer was separated, dried with Na$_2$SO$_4$, filtered and the solvents were removed under reduced pressure. The crude product was purified by column chromatography (SiO$_2$, DCM to 10% MeOH/DCM) to give the product as a blue powder (147 mg, 75% yield).

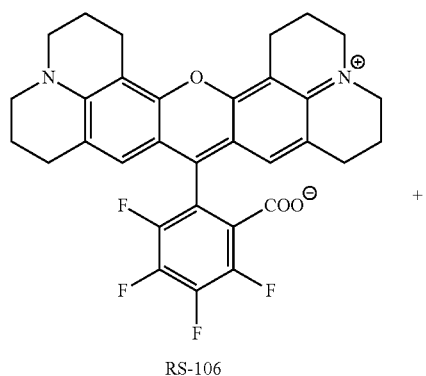

RS-106

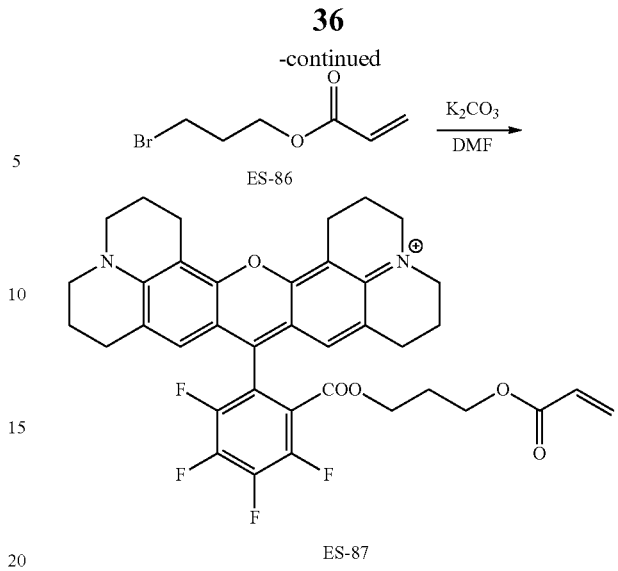

ES-87

ES-87 was used to prepare cross-linked dyes as explained below in three non-limiting examples.

ES-91 was prepared by charging a 50 ml round-bottom flask with dry EtOH (9 ml) and N$_2$ was bubbled through for 20 min. Methyl methacrylate (0.3 ml, 2.8 mmol, 1 eq), ES-87 (4 mg, 0.0056 mmol, 0.002 eq) and AIBN (azobisisobutyronitrile, 10 mg, 0.056 mmol, 0.02 eq) were added and N$_2$ was bubbled through for 10 min. The reaction mixture was heated to reflux under N$_2$ atmosphere for 24 h. Upon completion, the mixture was cooled to room temperature and was evaporated to dryness under reduced pressure. The crude product was dissolved in 3 ml of DCM and then was added dropwise to 50 ml of Hex. The precipitate was filtered and the purification process was repeated again to give the product as a blue powder.

ES-99 was prepared by charging a 50 ml round-bottomed flask with dry EtOH (9 ml) and N$_2$ was bubbled through for 20 min. Methyl methacrylate (0.3 ml, 2.8 mmol, 1 eq), 3-methacryloxypropyl trimethoxysilane (34 µl, 0.14 mmol, 0.05 eq), ES-87 (8 mg, 0.01 mmol, 0.002 eq) and AIBN (10 mg, 0.056 mmol, 0.02 eq) were added and N$_2$ was bubbled through for 10 min. The reaction mixture was heated to reflux under N$_2$ atmosphere for 24 h. Upon completion, the mixture was cooled to room temperature and was evaporated to dryness under reduced pressure. The crude product was dissolved in 3 ml of DCM and then was added dropwise to 50 ml of Hex. The precipitate was filtered and the purification process was repeated again to give the product as a blue powder.

Figure 9:
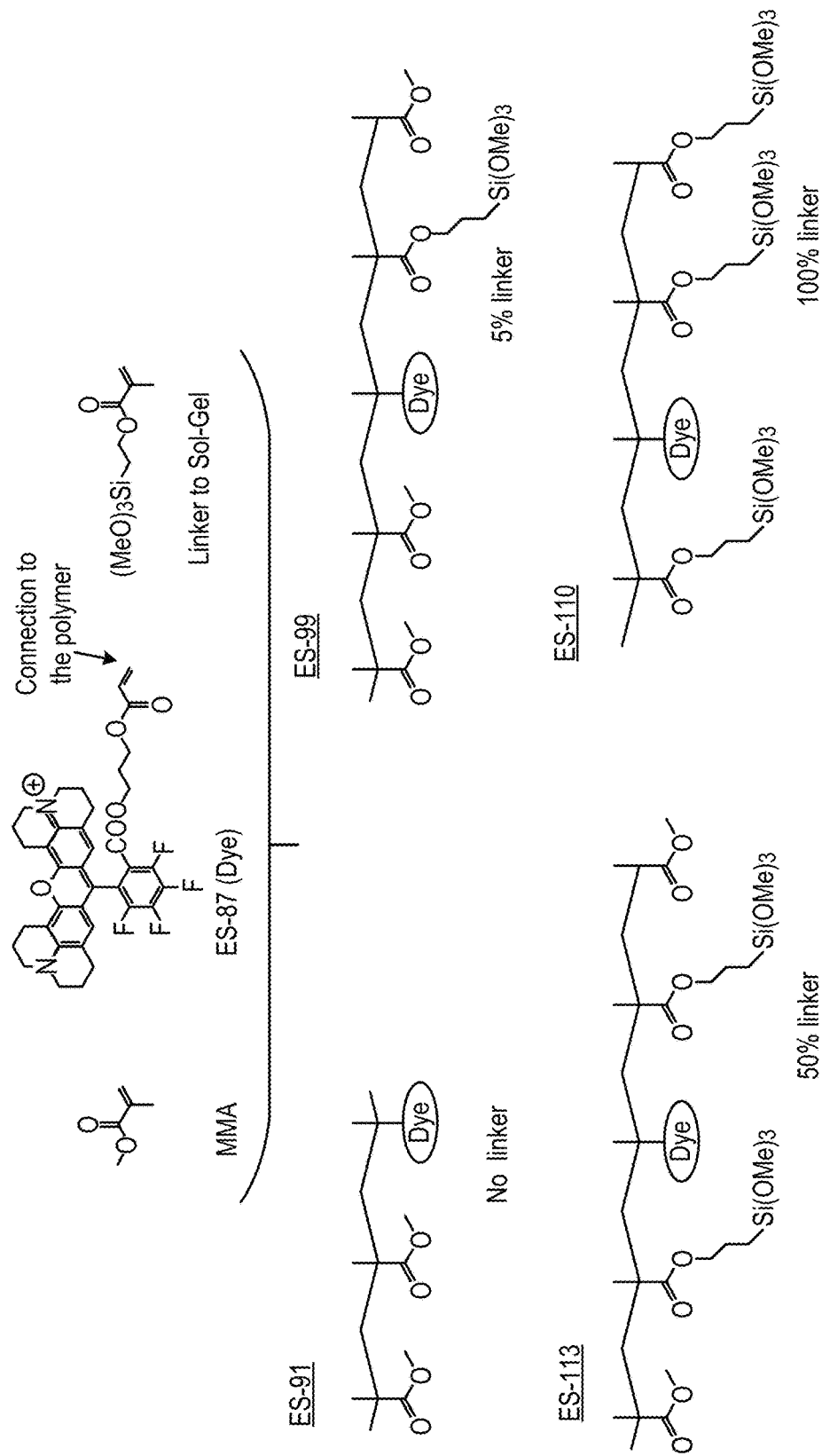
FIG. 9 schematically illustrates some embodiments of PMMA (poly-methyl-methacrylate) cross-linked dyes, according to some embodiments of the invention.
Figure 10A:
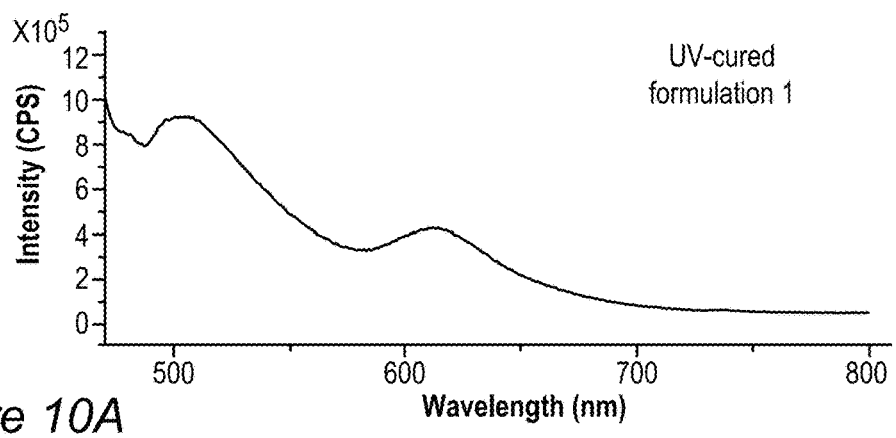
FIGS. 10A-10D, 11A-B, 12A-C, and 13A-D illustrate examples of emission results of films produced by UV curing processes, according to some embodiments of the invention.
Figure 10B:
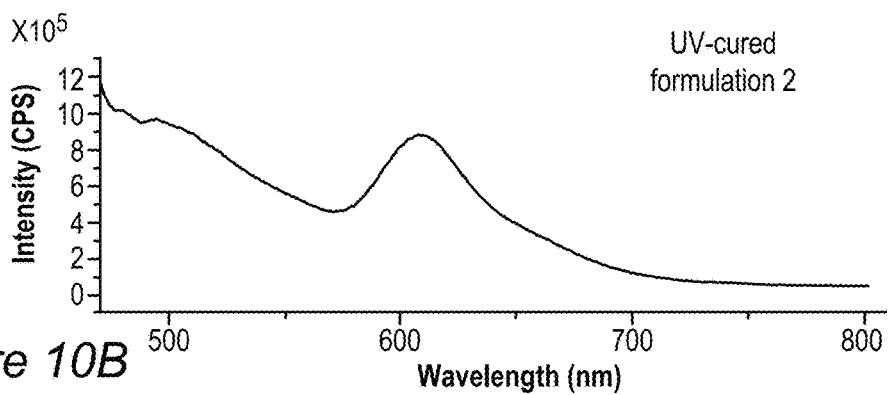
Figure 10C:
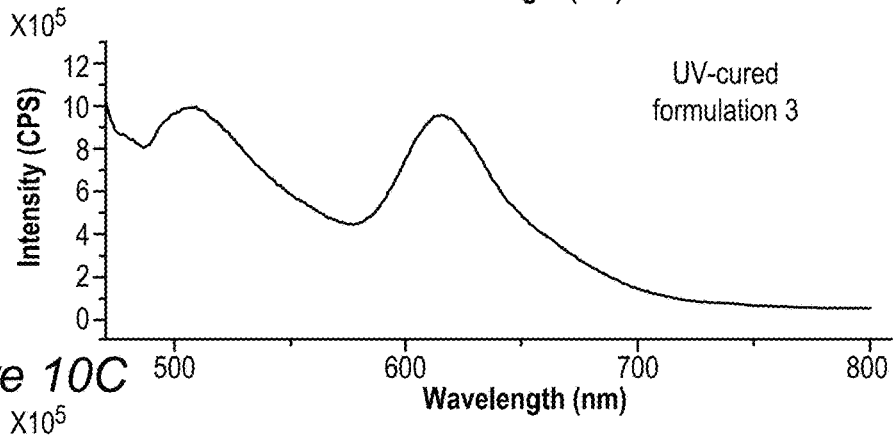
Figure 10D:
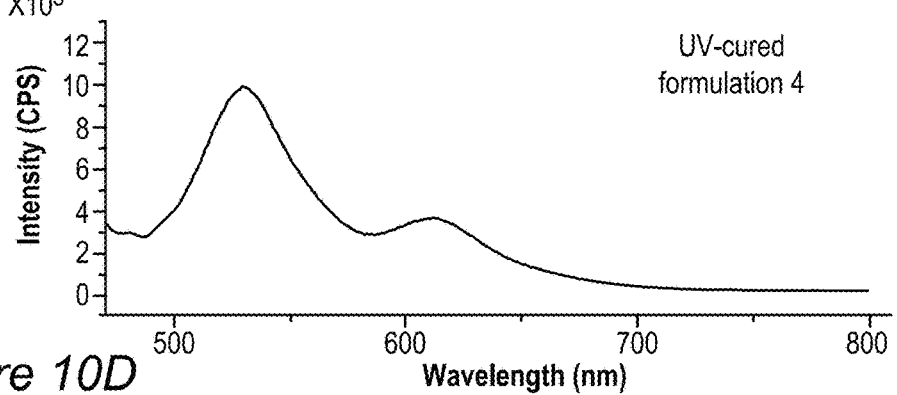

ES-113 and ES-110 were prepared similarly to ES-99, but using higher concentration of the linker 3-methacryloxypropyl trimethoxysilane, namely 50% and 100% linker respectively, compared with 5% in ES-99. FIG. 9 schematically illustrates some embodiments of PMMA cross-linked dyes, according to some embodiments of the invention.

Protective Films

Some embodiments comprise applying a protective film 131 to color conversion film 130 and/or configuring color conversion film 130 to have protective properties which prevent humidity damages and cracking. Any type of color conversion film 130 may be protected and/or enhanced as described in the following, e.g., RBF-compounds-based films 130 as well as films 130 based on other organic or inorganic fluorescent molecules and quantum-dot-based color conversion films 130.

For example, protective film 131 may be formed using zirconium-phenyl siloxane hybrid material (ZPH), a transparent, clear and flexible polymer, based on the description in Kim et al. 2014 ("Sol-gel derived transparent zirconium-phenyl siloxane hybrid for robust high refractive index led encapsulant", ACS Appl. Mater. Interfaces 2014, 6, 3115-3121), with the following modifications, found by the inventors to isolate films 130 from the surroundings, provide the film mechanical support and prevent cracks.

ZPH is a silica based polymer gel, cured in hydrosilylation addition reaction. The polymer comprises two resin components: HZPO (a Si—H functionalized silica) and VZPO (a vinyl functionalized silica). Both components are synthesized in a sol-gel reaction separately and then mixed in the proper ratio into formulation 120 and cured to yield a semi-solid form. HZPO was mixed from 3.2 ml Methyldiethoxysilane (MDES), 6.5 g diphenylsilanediol (DPSD) and 25 mg amberlite IRC76 for 1 hour at 100° C. and then, while stirring, 673 μL zirconium propoxide (ZP) 70% in 1-propanol was added slowly and the reaction continued overnight. VZPO was mixed from 3.1 g vinyltrimethylsilane (VTMS), 4.4 g DPSD and 7.7 mg barium hydroxide monohydrate in 0.86 ml p-xylene at 80° C. and then, while stirring, ZP was added slowly, with the reaction time being four hours. ZPH was prepared by mixing VZPO and HZPO in a ratio of 1:1 mol/mol and 10 ml of a platinum catalyst was added to the viscous liquid, which was then stirred vigorously for one minute and applied on the substrate using a coating rod. Protective film 131 was inserted into the oven in 150° C. for three hours for curing.

Additional examples for protective films 131 include using polymerized MMA (methyl-methacrylate) as protection, by allowing MMA to diffuse into the sol-gel pores. Color conversion films 130 may be coated with additional MMA monomers that penetrate the sol-gel pores and then polymerize inside, thereby improving the life time of film 130. The preparation procedure may be modified to provide such polymerization conditions.

Some embodiments comprise using a trimethoxysilane derivative as coating, e.g., an R-TMOS coating with R being e.g., phenyl, methyl, $CH_2CH_2CF_3$ or other groups, with proper process adaptations which provide the coating conditions for forming protective film 131 and/or protective characteristics of film 130.

Some embodiments comprise using as ESOR layer as protective coating 131, such as ESOR with no dye as protective layer 131 applied on cured film 130. Other protective coatings 131 of film 130 may comprise an acetic anhydride surface treatment derived from acetic acid with ending —OH groups changed to —Ac groups to enhance life time and/or chlorotrimethoxysilane protective layer 131 having endings with —OH groups modified to -trimethylsilane to enhance life time.

In certain embodiments, disclosed protective films 131 may be used in a range of applications for protective respective films from humidity and mechanical damages. For example, disclosed protective films 131 may be used to coat various plastic films (made of e.g., PEI (polyethylenimine), acrylic polymers, polycarbonate, PET, PDMS (polydimethylsiloxane) and related siloxanes, as well as other polymers), glass and metals/metal oxide films or surfaces (e.g., of copper, silicon, silicon oxides, aluminum, titanium and other transition metals and their oxides). Protective films 131 may be configured to have corresponding good adhesion to the respective films.

In some embodiments, protective films 131 may be used to coat diffusers, polarizers, glasses or any other film that needs temperature and humidity protection (e.g., up to 85° C., 95% relative humidity).

In some embodiments, protective films 131 and/or formulations thereof may be used as fillers in porous films.

UV Curing Processes

UV curing processes may be used additionally or in place of sol gel processes to provide the color conversion films. Formulations without and with rhodamine-based fluorescent compounds, films, displays and methods are provided, in which the fluorescent compounds are stabilized and tuned to modify display backlight illumination in a manner that increases the display's efficiency and widens its color gamut. UV cured formulations may be used to provide fluorescent films that may be applied in various ways in the backlight unit and/or in the LCD panel and improve the display's performance. The formulation, curing process and film forming procedures may be optimized and adjusted to provide a high photo stability of the fluorescent compounds and narrow emission peaks of the backlight unit.

In certain embodiments, the sol gel process may be replaced by a UV curing process, with respect to some or all layers of film 130. Similar or different RBF compounds 115 may be used in UV cured layers, such as RBF compounds disclosed above, and films 130 produced by UV curing may replace (or complement) films 130 (or layers 132 and/or 134) produced by the sol gel processes in the configurations of backlight unit 142 and display 140 which are illustrated in FIGS. 2A-2E and the related disclosure. Other organic or inorganic fluorescent dyes as well as quantum dots may be embedded in disclosed UV cured films 130 or modifications thereof as well. Also, configurations of film 130 disclosed above in relation to display configurations, polarizing films and red enhanced films may be implemented with UV cured films 130 or layers 132, 134. In the following, examples for applicable UV processes are presented.

In some embodiments, UV curing is advantageous due to the wide range of UV curable materials, which provide an opportunity to create polymeric matrices which are compatible with the incorporated dyes, such as RBF compounds 115. In order to achieve maximal life time and QY, the structure and the crosslinking density may be optimized and the interaction between the dye and the matrix may be minimized. The use done in UV curing of highly reactive components may significantly reduce the amount of non-crosslinked material even at low UV exposure and short retention time—thereby enabling to minimize damage to the dye molecules while providing required matrices for the dye, e.g., matrices which provide high photostability, narrow FWHM (e.g., 40-60 nm) and high QY in the green and red regions (e.g., due to less occupied vibration levels), for RBF compounds 115 or other fluorescent molecules). The crosslinking degree may be optimized per dye material in order to obtain high QY (too much cross linking may degrade the QY).

Various examples are presented below for formulations 120 which are then UV cured after being applied to transparent PET (polyethylene terephthalate) substrate or diffuser films (PET coated with PMMA coating) by drawing using coating rods for providing films with widths ranging 20-100μ which are then irradiated once under "H" UV lamp at conveyor speed 2-7 m/min. Color conversion films 130 may comprise multiple layers which may be applied one on top of the other. Resulting color conversion films 130 (or protective films 131, see below) may be used as explained above by themselves or in combination with films 130 produced by sol gel processes 200. Formulations 120 for UV cured films 130 may comprise RBF compounds 115 as described above. Life times of fluorescent dyes in UV cured matrix are different for different dyes and depend on the cured formulation and on the curing conditions. Generally, the stability of RBF compounds 115 under continued blue light excitation provides a long life time.

UV cured films 130, in particular UV cured color conversion films 130, may be prepared from formulations 120 comprising 65-70% monomers, 25-30% oligomers, and 1-5% photointiator; as well as color conversion elements such as RBF compounds at low concentration (e.g., 0.005-0.05%), in weight percentages of the total formulation. Following are non-limiting examples for such formulations 120, which are UV cured to yield respective films 130.

Some examples comprise formulations 120 being a mixture of the ingredients listed in Table 2, such as the five specific formulations presented as non-limiting examples. The liquid photoinitiator blend used, in a non-limiting manner, was GENOCURE* LTM liquid photoinitiator blend for UV-curable inks, coatings and adhesives, which has good absorption between 350 and 400 nm.

TABLE 2

UV cured formulations.

| Ingredient | Formulation number and w/w % in the formulation | | | | |
|---|---|---|---|---|---|
| | 1 | 2 | 3 | 4 | 5 |
| Monomers | | | | | |
| DPGDA (dipropylene glycol diacrylate) | | 17.4 | | | |
| Ditrimethylolpropane tetraacrylate | 28.3 | | | 27.6 | 28.3 |
| Dipentaerythritol hexaacrylate | 22.2 | 22.2 | 24.7 | 24.1 | 22.2 |
| Ethoxylated pentaerythritol tetraacrylate | | | 27.8 | | |
| Propoxylated (3) glyceryl acrylate | 16.1 | | 15.6 | 15.7 | 16.2 |
| TMPTA (Trimethylolpropane triacrylate) | | 27.5 | | | |
| Oligomers | | | | | |
| Polyester acrylate | | | | 27.4 | |
| Modified polyester resin diluted with dipropyleneglycol diacrylate | | 27.9 | | | |
| Aliphatic urethane hexaacrylate | 28.4 | | 26.9 | | 28.3 |
| Photoinitiators | | | | | |
| Alpha-hydroxy-cyclohexyl-phenyl-ketone | 4.9 | | | | |
| Difunctional alpha-hydroxy ketone | | 4.9 | | 5.1 | 5.1 |
| Liquid photoinitiator blend | | | 5.1 | | |
| Dyes | | | | | |
| RBF compounds JK-32 or RS56 | 0.036 | | 0.042 | 0.017 | |
| Dye rhodamine 110 | | | | 0.016 | |
| Dye rhodamine 101 inner salt | | 0.029 | | | |
| RBF compound ES-61 | | | | | 0.008 |

Formulations 1 and 2 were prepared by mixing all the ingredients, except the respective dyes, at a temperature of 50° C. and cooling the mixture to room temperature. Mixing of formulation 3 was performed without heating. Then the respective dye was added and sonication was used to dissolve the dye into formulation 120. Formulation 4 was prepared by mixing and sonication of a first part with rhodamine 110 and a second part with JK-32. Each part was prepared like formulations 1 and 2. The samples were applied to transparent PET substrate by drawing using a coating rod to 100 μm and irradiated once under H UV lamp at conveyor speed 2-5 m/min. Formulation 5 was prepared by mixing all the ingredients, except ES-61, at temperature 50° C. and cooling the mixture to room temperature. Then ES-61 was added and the mixture was sonicated until the dye was dissolved. The sample was applied to the back side of diffuser 144 (of backlight unit 142) by drawing using a 80 μm coating rod (indicating a nominal thickness number, the actual coating thickness depends on the chemical properties of the coating compounds such as viscosity), and irradiated once under H UV lamp at conveyor speed of 7 m/min. QY measurements were carried out using an integrating sphere coupled to a fluorimeter (the error margin was about 5%). Resulting QY's were 52% at 616 nm, 55% at 609 nm, 51% at 616 nm, 53% at 529 and 611 nm, and 71% at 624 nm for formulations 1-5, respectively. The FWHM of all formulations ranged between 40-60 nm. FIGS. 10A-10D illustrate the emission spectra of formulations 1-4, respectively, according to some embodiments of the invention.

Figure 11A:
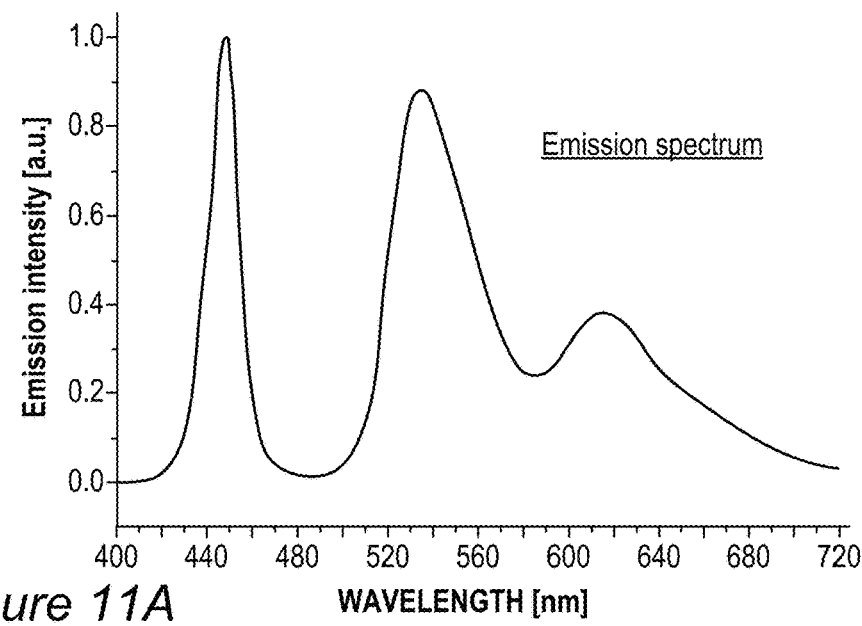
Figure 11B:
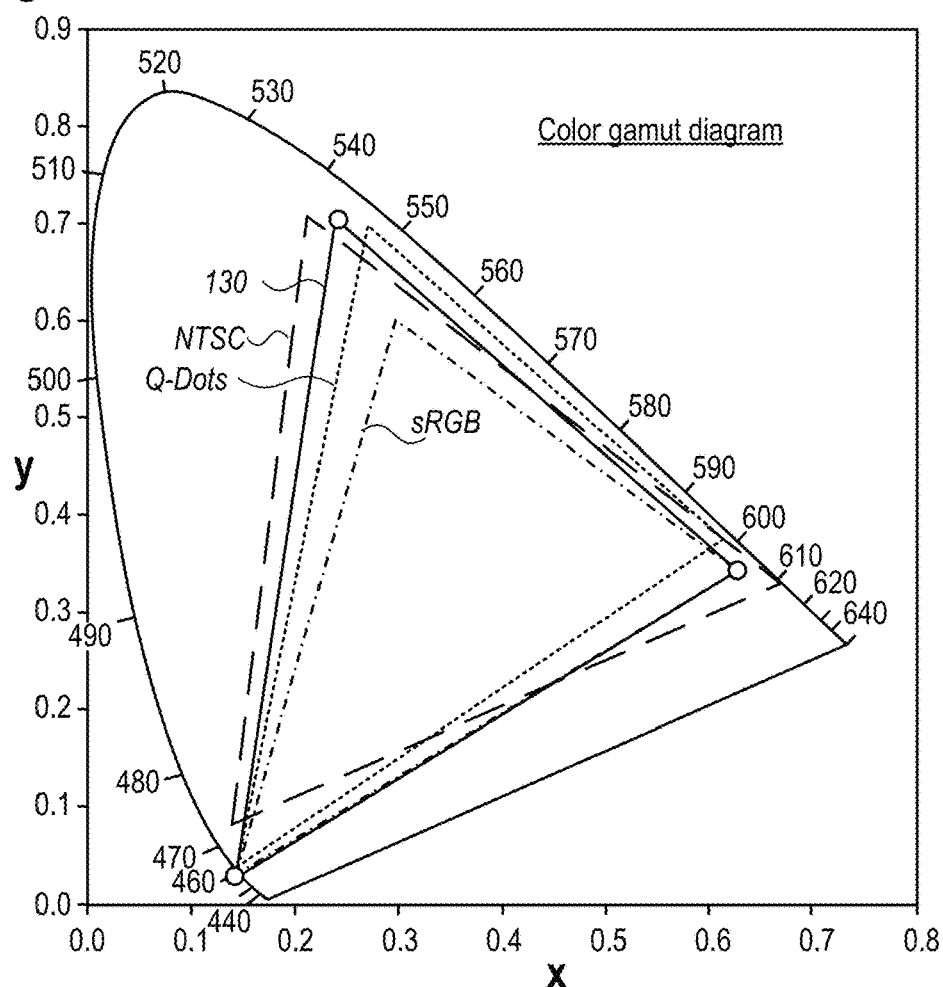

The produced films may be combined and optimized to form film 130, for example a non-limiting example of film 130 was optimized to operate with a blue backlight source 80A of about 10 mW/cm$^2$ of optical power and provided a red emission peak at 616 nm with FWHM of 60 nm and a green emission peak at 535 nm with FWHM of 45 nm, with a white point at (0.30, 0.27) CIE 1931 coordinates (white point adjustment may also be carried out as disclosed above). FIGS. 11A-11B illustrate the emission spectrum of film 130 and its color gamut with respect to sRGB, NTSC and a quantum-dots-based display, according to some embodiments of the invention. The color gamut provided by film 130 is similar to the color gamut defined by NTSC.

Formulations 1-5 are shown with red fluorescent RBF compounds and may be used as red-enhancing films 130 in displays with white light source 80B—as illustrated in FIGS. 5A and 5B which were discuss in detail above.

Figure 12C:
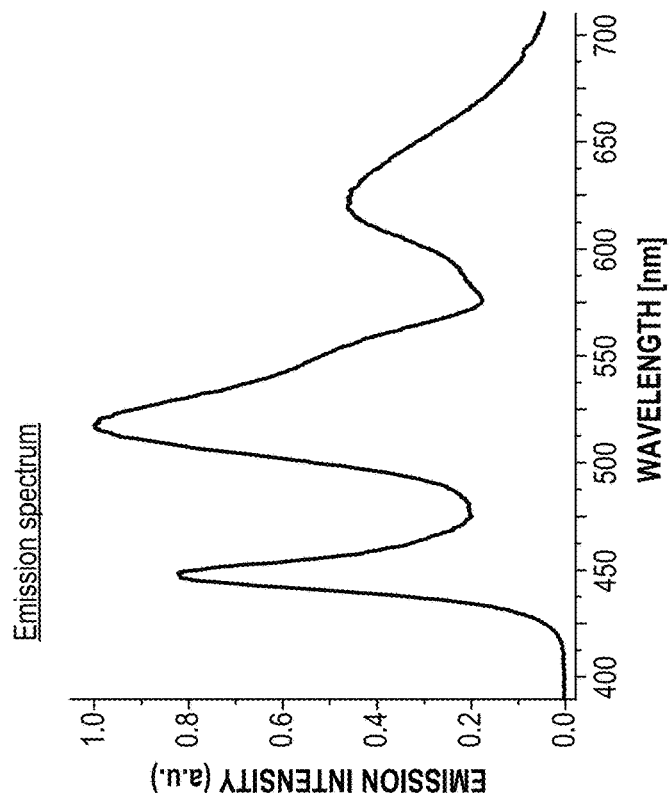
Figure 12A:
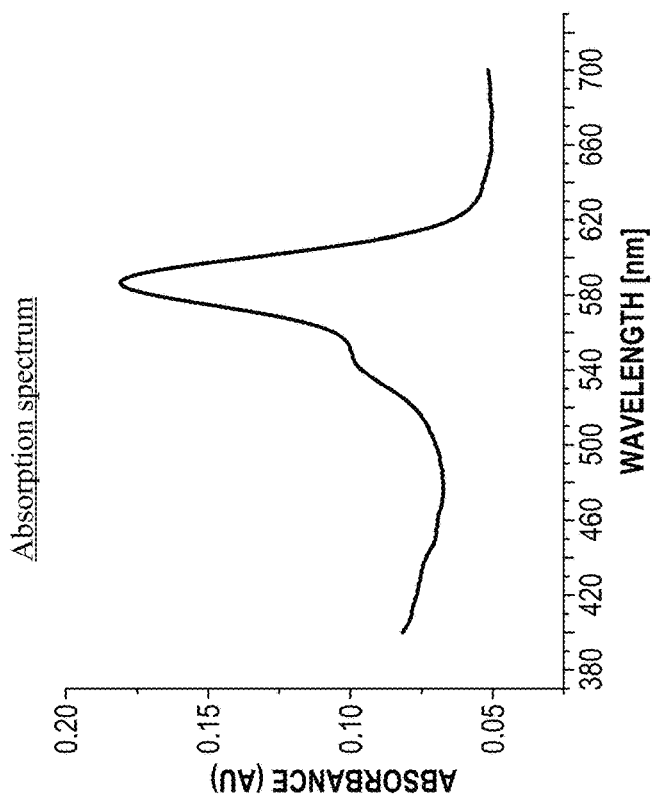

FIGS. 12A and 12C illustrate examples for absorption and emission spectra, respectively, of displays 140 with red-fluorescent RBF compound(s) films 130, according to some embodiments of the invention. Film(s) 130 may be used e.g., to red-enhance white LED displays as disclosed above under the section titles "Red enhancement" and FIGS. 5A and 5B. The absorption spectrum of film(s) 130 with red-fluorescent RBF compound(s) 115 has significant absorption in yellow region 80B-Y (550-600 nm) and the fluorescent spectrum of film(s) 130 with red-fluorescent RBF compound(s) 115, using YAG-based LEDs 80B (YAG—yttrium aluminum garnet, $Y_3Al_5O_{12}$) and measured after an LCD color display, shows the distinct peaks at the transmission regions of the RGB filters.

Figure 12B:
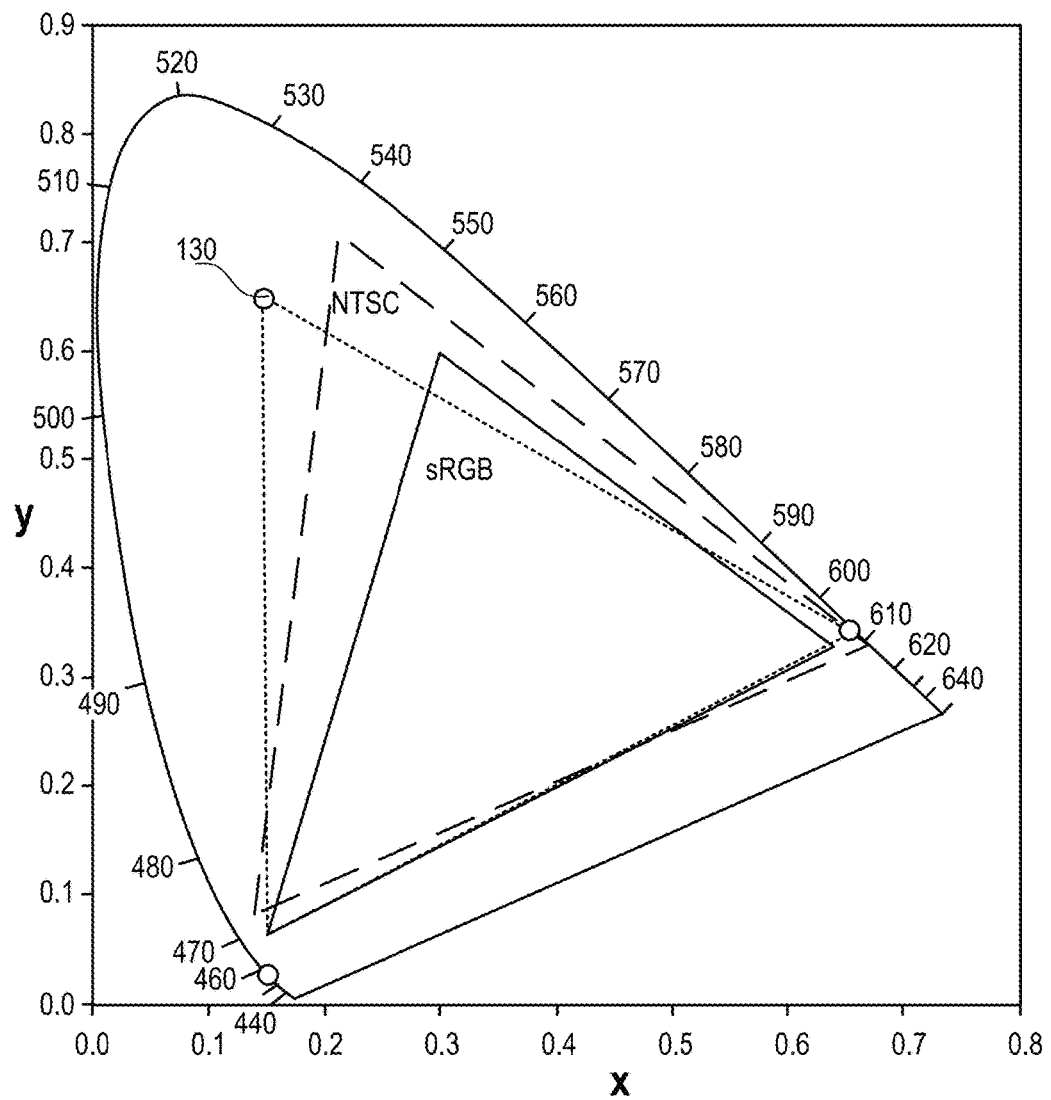
Figure 13A:
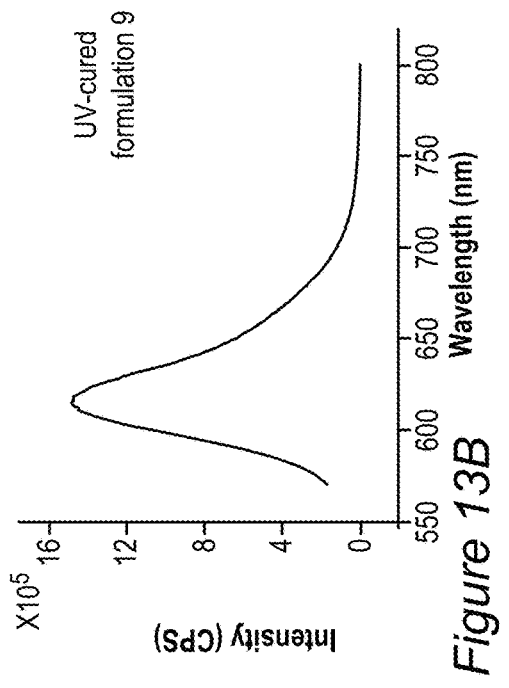
Figure 13B:
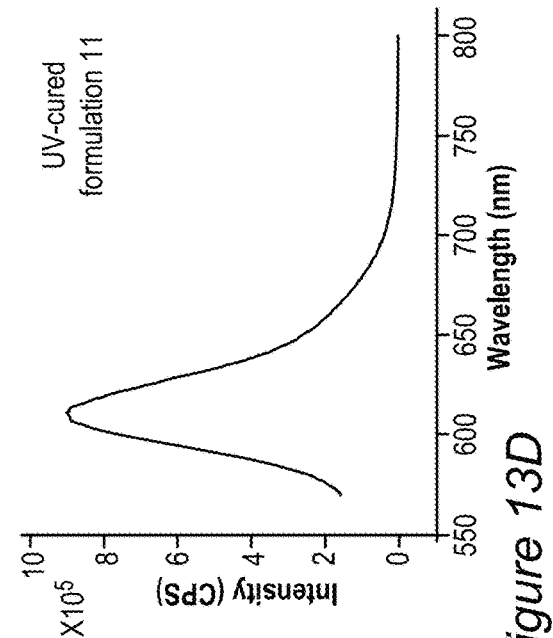
Figure 13C:
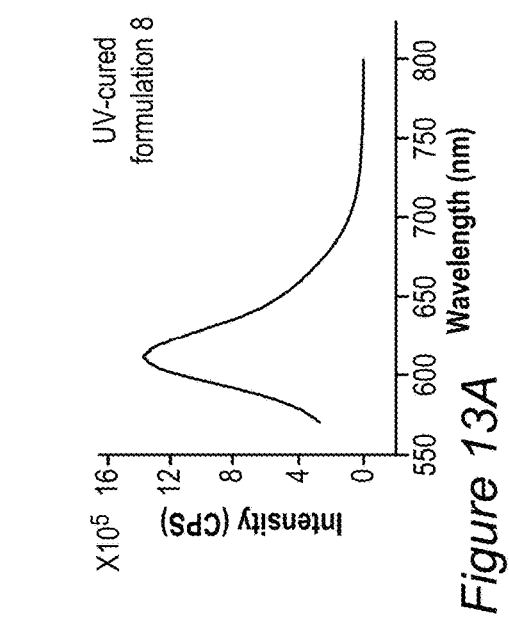
Figure 13D:
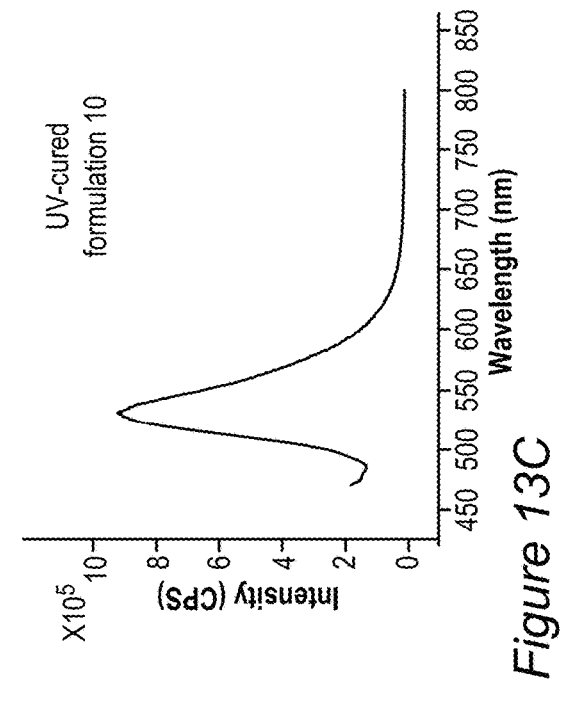

FIG. 12B illustrates an example for a color gamut diagram of displays 140 with red-fluorescent RBF compound(s) films 130, according to some embodiments of the invention. Compared to prior art gamuts such as indicated by sRGB (LCD) and NTSC ("National Television System Committee") standards, the gamut of disclosed display 140 is wider and extends into regions which are not represented by prior art displays, thereby providing better color representation. In particular is the gamut range of disclosed display 140 larger than sRGB in the green and in the red regions. Moreover, as disclosed herein, the tunability of the spectral range of RBF compound(s) 115 in films 130 by controlling the sol gel process (e.g., by adjusting silane precursors 104) may be used to extend the color gamut even further, to the wavelength region beyond 540 nm to 530 nm or over 520 nm, providing even wider gamuts.

In some embodiments, green fluorescent RBF compounds may be added to these formulations or may be applied in separate formulations to form films added to red fluorescent films.

Some additional examples comprise formulations 120 being a mixture of the ingredients listed in Table 3, such as the five specific formulations presented as non-limiting examples.

TABLE 3

UV cured formulations.

| Ingredient | Formulation number and w/w % in the formulation | | | | | |
|---|---|---|---|---|---|---|
| | 6 | 7 | 8 | 9 | 10 | 11 |
| Monomers | | | | | | |
| DPGDA | | 17.0 | | | | |
| Ditrimethylolpropane tetra-acrylate | 28.3 | | 28.3 | 28.3 | 28.3 | |
| Dipentaerythritol hexa-acrylate | 22.2 | 22.2 | 22.0 | 22.2 | 22.2 | 22.2 |
| Ethoxylated pentaerythritol tetraacrylate | | 28.3 | | | | |
| Propoxylated (3) glyceryl acrylate | 16.2 | 16.2 | | 16.2 | 16.2 | 16.2 |
| TMPTA | | | 28.0 | | | |
| Oligomers | | | | | | |
| Polyester acrylate | | | | 28.3 | 28.3 | |
| Modified polyester resin diluted with dipropylene-glycol diacrylate | | 28.0 | | | | |
| Aliphatic urethane hexa-acrylate | 28.3 | 28.3 | | | | 28.3 |

TABLE 3-continued

UV cured formulations.

| Ingredient | Formulation number and w/w % in the formulation | | | | | |
|---|---|---|---|---|---|---|
| | 6 | 7 | 8 | 9 | 10 | 11 |
| Photoinitiators | | | | | | |
| Alpha-hydroxy-cyclohexyl-phenyl-ketone | 5.0 | | | | | 5.0 |
| Difunctional alpha-hydroxy ketone | | | 5.0 | 5.0 | 5.0 | |
| Liquid type 1 photoinitiator blend | | 5.0 | | | | |
| Dyes | | | | | | |
| RBF compound JK-32 | 0.03 | | 0.03 | 0.03 | | |
| RBF compound RS56 | | 0.04 | | | | |
| RBF compound JK-71 | | | | | 0.03 | |
| RBF compound RS-106 | | | | | | 0.02 |

Formulation 6 was prepared by mixing all the ingredients, except JK32, at a temperature of 50° C. and cooling the mixture to room temperature. Then JK32 was added and sonication was used to dissolve it. The samples were applied to the back side of diffuser 144 at a layer 60μ thick using a coating rod and irradiated once under H UV lamp at conveyor speed 2 m/min. Formulation 7 was prepared by mixing all the ingredients, except RS56, at a temperature of 50° C. and cooling the mixture to room temperature. Then RS56 was added and sonication was used to dissolve it. The samples were applied to a transparent PET substrate at a layer 60μ thick using a 80 μm coating rod and irradiated once under H UV lamp at conveyor speed 2 m/min. Formulations 8 and 9 were prepared by mixing all the ingredients, except JK32, at a temperature of 50° C. and cooling the mixture to room temperature. Then JK32 was added and sonication was used to dissolve it. The samples were applied to the back side of diffuser 144 at a layer 60μ thick using a coating rod and irradiated once under H UV lamp at conveyor speed 2 m/min. Formulations 10 and 11 were prepared similarly to formulations 8 and 9, with respect to JK-71 and RS-106, respectively in place of JK-32.

Film 130 made from formulation 6 had a QY of 49%, emission peak at 615 nm and a lifetime prolonging factor of ×5 (see Table 1 for comparison to films 130 prepared by sol-gel processes). Film 130 made from formulation 7 had a QY of 57%, emission peak at 616 nm and a lifetime prolonging factor of ×8. FIGS. 13A-13D illustrate the emission spectra of films 130 produced from formulations 8-11, according to some embodiments of the invention.

Formulations 6-9 and 11 are shown with red fluorescent RBF compounds and may be used as red-enhancing films 130 in displays with white light source 80B. In some embodiments, green fluorescent RBF compounds may be added to these formulations or may be applied in separate formulations to form films added to red fluorescent films.

Formulation 10 is shown with green fluorescent RBF compounds and may be used as green-enhancing films 130. In some embodiments, red fluorescent RBF compounds may be added to this formulation or may be applied in separate formulations to form films added to green fluorescent films.

Protective Films

Some embodiments comprise applying a protective film 131 to color conversion film 130 and/or configuring color conversion film 130 to have protective properties which prevent humidity damages and cracking. Any type of color conversion film 130 may be protected and/or enhanced as described in the following, e.g., RBF-compounds-based films 130 as well as films 130 based on other organic or inorganic fluorescent molecules and quantum-dot-based color conversion films 130.

For example, UV cured protective film 131 may be formed using a mixture of 3,4-epoxycyclohexylmethyl 3,4-epoxycyclohexanecarboxylate, triarylsulfonium hexafluoroantimonate salts, mixed-50 wt % in propylene carbonate, polyether modified polydimethylsiloxane and 3-ethyloxetane-3-methanol, which is UV cured on a conveyor.

In another example, UV cured protective film 131 may be formed by mixing 76.8% 3,4-epoxycyclohexylmethyl 3,4-epoxycyclohexanecarboxylate, 19.2% trimethylolpropane (TMP) oxetane (TMPO), 3.8% triarylsulfonium hexafluoroantimonate salts, mixed-50 wt % in propylene carbonate and 0.2% polyether-modified polydimethylsiloxane (in this order) and stirring the mixture at room temperature. The sample was applied to a sol-gel layer (e.g., color conversion film 130 produced by a sol gel process disclosed above) by drawing using a coating rod to form a 50 μm layer and then irradiated once under H UV lamp at conveyor speed 7 m/min. The sol-gel layer was cleaned with ethanol and air dried before coating.

Figure 14:
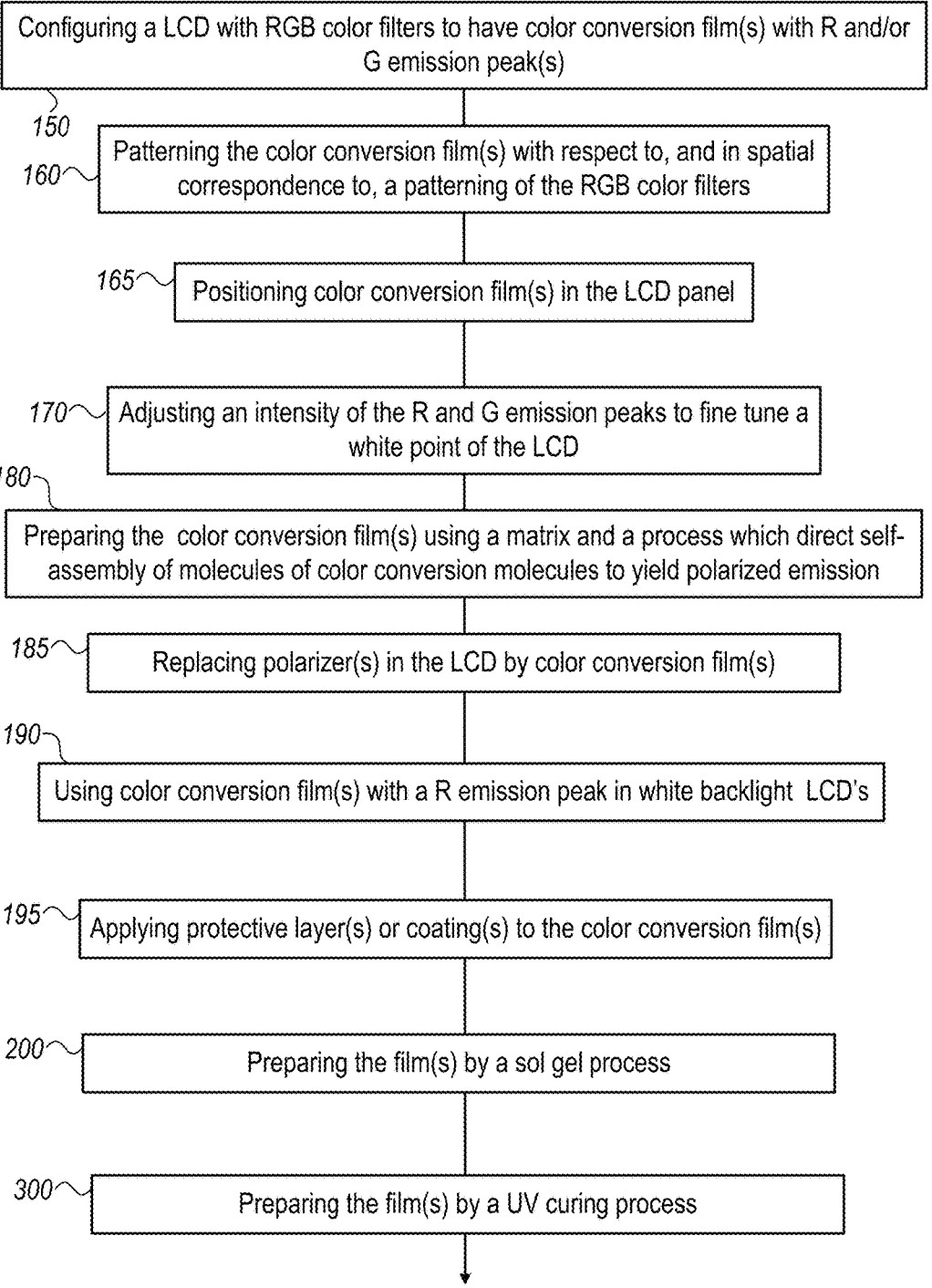
FIG. 14 is a high level flowchart illustrating methods, according to some embodiments of the invention.

FIG. 14 is a high level flowchart illustrating a method 105, according to some embodiments of the invention. The stages of method 105 may be carried out with respect to various aspects of precursors 110, formulations 120, films 130 and displays 140 described above, which may optionally be configured to implement method 105, irrespective of the order of the stages.

In some embodiments, method 105 comprises configuring a LCD with RGB color filters to have at least one color conversion film prepared to have a R emission peak and/or a G emission peak (stage 150), patterning the at least one color conversion film with respect to a patterning of the RGB color filters to yield a spatial correspondence between film regions with R and G emission peaks and respective R and G color filter (stage 160), and positioning the color conversion film in an LCD panel of the LCD (stage 165).

In some embodiments, method 105 comprises configuring a LCD with RGB color filters to have at least one color conversion film prepared to have a R emission peak and a G emission peak (stage 150), and adjusting an intensity of the R and G emission peaks of the at least one color conversion film to fine tune a white point of the LCD to be at a center of an expected line of deterioration of the intensity within given LCD specifications (stage 170).

In some embodiments, method 105 comprises configuring a LCD with RGB color filters to have at least one color conversion film prepared to have a R emission peak and a G emission peak (stage 150), preparing the at least one color conversion film using a matrix and a process which direct self-assembly of molecules of color conversion molecules of the at least one color conversion film to yield polarization of at least part of illumination emitted by the color conversion film (stage 180), and replacing at least one polarizer in the LCD by the at least one color conversion film (stage 185).

In some embodiments, method 105 comprises configuring a LCD with RGB color filters and white backlight illumination to have at least one color conversion film prepared to have a R emission peak (stage 190).

In some embodiments, method 105 further comprises applying a protective layer to the color conversion film (stage 195). For example, method 105 may further comprise any of: preparing the protective layer by a sol gel process with at least one of: zirconium-phenyl siloxane hybrid material (ZPH), methyl methacrylate (MMA), trimethoxysilane derivative and an ESOR; preparing the protective layer by an acetic anhydride surface treatment and/or a trimethylsilane surface treatment; and/or preparing the protective layer by a UV curing process using a mixture of 3,4-epoxycyclohexylmethyl 3,4-epoxycyclohexanecarboxylate and triarylsulfonium hexafluoroantimonate salts, mixed in propylene carbonate.

The at least one color conversion film may comprise at least one RBF compound defined by Formula 1 and/or Formula 2.

In method 105, the at least one color conversion film may be prepared by at least one corresponding sol-gel process (stage and method 200) and/or UV curing process (stage and method 300), which are presented in more detail below.

FIG. 14 is further a high-level flowchart illustrating a method 200 which may be part of method 105, according to some embodiments of the invention. The stages of method 200 may be carried out with respect to various aspects of precursors 110, formulations 120, films 130 and displays 140 described above, which may optionally be configured to implement method 200. Method 200 may comprise stages for producing, preparing and/or using precursors 110, formulations 120, films 130 and displays 140, such as any of the following stages, irrespective of their order.

Method 200 may comprise preparing a hybrid sol-gel precursor formulation from: an ESOR prepared from TEOS, at least one MTMOS or TMOS derivative, and GLYMO; a DURS powder prepared from isocyanate-functionalized silica nanoparticles and ethylene glycol; and a metal(s) alkoxide matrix solution (stage 210), mixing the prepared hybrid sol-gel precursor with at least one RBF compound (stage 220); and spreading the mixture and drying the spread mixture to form a film (stage 230).

Method 200 may comprise comprising evaporating alcohols from the mixture prior to spreading 230 (stage 225). The inventors have found out that using ethylene glycol 108 in the preparation of DURS 109 and evaporating 225 the alcohols prior to spreading improve film properties, and, for example, enable reducing the number of required green-fluorescent RBF layers 132 due to the increased viscosity of formulation 120. Possibly, the number of required green-fluorescent RBF layers 132 may be reduced to one by substantial or complete evaporation of the alcohols in formulation 120 prior to spreading 230.

Preparing 210 of the hybrid sol-gel precursor formulation may be carried out under acidic conditions (stage 212), mixing 220 may comprise adjusting types and amounts of the TMOS derivatives to tune emission wavelengths of the fluorophores (stage 215), spreading and drying 230 may be carried out respectively by bar coating and by at least one of convective heating, evaporating and infrared radiation (stage 240).

As explained above, the RBF compound may be a red-fluorescent RBF compound and the TMOS derivative(s) may comprise for example PhTMOS and/or a TMOS with fluorine substituents; and/or the RBF compound may be a green-fluorescent RBF compound and the TMOS derivative(s) may comprise PhTMOS and/or $F_1$TMOS with the PhTMOS:$F_1$TMOS ratio being adjusted to tune emission properties of the green-fluorescent RBF compound. Other TMOS derivatives may comprise $F_2$TMOS (tridecafluoro-1,1,2,2-tetrahydrooctyl)trimethoxysilane, 1,2-bis(triethoxysilyl)ethane, trimethoxy(propyl)silane, octadecyltrimethoxysilane, fluorotriethoxysilane, and ammonium (propyl)trimethoxysilane.

Method 200 may comprise forming the film from at least one red fluorescent RBF compound and/or from at least one green fluorescent RBF compound (stage 250). The RBF compound(s) may be supramoleculary encapsulated and/or covalently embedded in one or more layers. As non-limiting examples, method 200 may comprise forming the film from at least one red fluorescent RBF compound to enhance a red illumination component in displays using a white light source (stage 280), such as a white-LED-based display. Alternatively or complementarily films may be formed to have both red and green fluorescent RBF compounds and be used for enhancing red and green illumination components in displays using a blue light source (blue LEDs).

Method 200 may comprise associating the film with any of the diffuser, prism film(s) and polarizer film(s) in a display backlight unit (stage 260), e.g. attaching one or more films onto any of the elements in the display backlight unit or possibly replacing one or more of these elements by the formed film(s). For example, method 200 may comprise configuring the film to exhibit polarization properties (stage 270) and using the polarizing film to enhance or replace polarizer film(s) in the display backlight unit.

FIG. 14 is further a high level flowchart illustrating a method 300 which may be part of method 105, according to some embodiments of the invention. The stages of method 300 may be carried out with respect to various aspects of formulations 120, films 130 and displays 140 described above, which may optionally be configured to implement method 300. Method 300 may comprise stages for producing, preparing and/or using formulations 120, films 130 and displays 140, such as any of the following stages, irrespective of their order.

Method 300 may comprise preparing a formulation from 65-70% monomers, 25-30% oligomers, 1-5% photointiator and at least one RBF compound (stage 310), in weight percentages of the total formulation, spreading the formulation to form a film (stage 330), and UV curing the formulation (stage 340). Method 300 may comprise any of: selecting the monomers from: dipropylene glycol diacrylate, ditrimethylolpropane tetraacrylate, dipentaerythritol hexaacrylate, ethoxylated pentaerythritol tetraacrylate, propoxylated (3) glyceryl acrylate and trimethylolpropane triacrylate; selecting the oligomers from: polyester acrylate, modified polyester resin diluted with dipropyleneglycol diacrylate and aliphatic urethane hexaacrylate; and selecting the photointiator from: alpha-hydroxy-cyclohexyl-phenyl-ketone and alpha-hydroxy ketone (possibly difunctional).

Method 300 may further comprise configuring the formulation and the film to yield a color conversion film and determining UV curing parameters to avoid damage to the color conversion elements, such as RBF compound(s) (stage 345). Method 300 may further comprise forming the color conversion film with at least one red fluorescent RBF compound and with at least one green fluorescent RBF compound (stage 350).

In some embodiments, method 300 may comprise configuring the color conversion film to exhibit polarization properties (stage 370), e.g., by directing self-assembly of molecules of the RBF compound(s) into at least partial alignment. Method 300 may further comprise associating the color conversion film with any of: a diffuser, a prism film and a polarizer film in a display backlight unit (stage 360).

In some embodiments, method 300 may comprise forming the color conversion film with at least one red fluorescent RBF compound to enhance a red illumination component in a white-LED-based display (stage 380) by shifting some of the yellow region in the emission spectrum of the white light source into the red region, namely into the R transmission region of the R color filter, to reduce illumination losses in the LCD panel while maintaining the balance between B and R+G regions in the RGB illumination (stage 382).

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. A color conversion film for a LCD (liquid crystal display) having RGB (red, green, blue) color filters, the color conversion film configured to absorb illumination from a backlight source of the LCD and have at least one of a R emission peak and a G emission peak, wherein the color conversion film further comprises a protective coating prepared by a UV curing process;

wherein the conversion film further comprises at least one rhodamine-based fluorescent (RBF) compound selected to absorb illumination from the backlight source of the LCD and have the at least one of a R emission peak and a G emission peak; and wherein the at least one RBF compound is defined by at least one of Formula 1 and Formula 4:

Formula 1

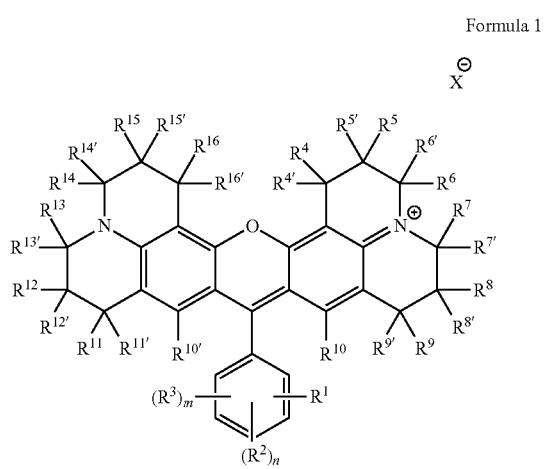

wherein
R¹ is COOR, NO₂, COR, COSR, CO(N-heterocycle), CON(R)₂, or CN;
R² each is independently selected from H, halide, N(R)₂, COR, CN, CON(R)₂, CO(N-heterocycle), NCO, NCS, OR, SR, SO₃H, SO₃M and COOR;
R³ each is independently selected from H, halide, N(R)₂, COR, CN, CON(R)₂, CO(N-heterocycle), NCO, NCS, OR, SR, SO₃H, SO₃M and COOR;
R⁴-R¹⁶ and R⁴'-R¹⁶' are each independently selected from H, CF₃, alkyl, haloalkyl, cycloalkyl, heterocycloalkyl, alkenyl, alkynyl, aryl, benzyl, halide, NO₂, OR, N(R)₂, COR, CN, CON(R)₂, CO(N-Heterocycle) and COOR;
R is H, alkyl, cycloalkyl, heterocycloalkyl, alkenyl, alkynyl, aryl, benzyl, —(CH₂CH₂O)ᵣCH₂CH₂OH, —(CH₂)ₚ OC(O)NH(CH₂)qSi(Oalkyl)₃, —(CH₂)ₚOC(O)CH=CH₂ or —(CH₂)ₚSi(Oalkyl)₃;
n and m are each independently an integer between 1-4;
p and q are each independently an integer between 1-6;
r is an integer between 0-10;
M is a monovalent cation; and
X⁻ is an anion; and:

Formula 4

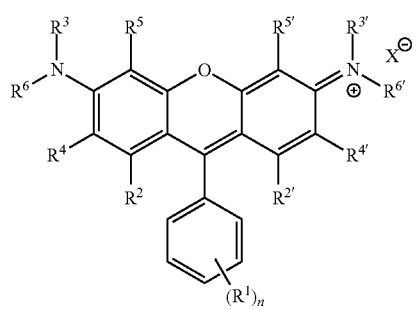

wherein:
R¹ each is independently H, Q¹, OQ¹, CF₃, C(O)OQ¹, C(O)NQ¹Q², NHC(O)Q¹, C(O)Q¹, NQ¹Q², NO₂, CN, SQ¹, —NQ¹Q²CONQ³Q⁴, NCO, NCS, —OC(O)OQ¹, SO₃—, SO₃Q¹, or halide;
n is an integer between 1-5;
R³, R³', R⁶ and R⁶' are each independently selected from H, CF₃, alkyl, alkenyl, alkynyl, haloalkyl, heterocycloalkyl, cycloalkyl, aryl and benzyl;
R², R²', R⁴, R4', R⁵ and R⁵' are each independently selected from H, Q¹, OQ¹, CF₃, NQ¹Q², NO₂, CN, SO₃—, SO₃Q¹ and halide;
Q¹ and Q² are each independently selected from H, substituted or unsubstituted alkyl, substituted or unsubstituted alkenyl, substituted or unsubstituted alkynyl, azide, haloalkyl, heterocycloalkyl, cycloalkyl, aryl, benzyl, —(CH₂)ₚOC(O)NH(CH₂)qSi(Oalkyl)₃, —(CH₂)ₚOC(O)CH=CH₂, —(CH₂)ₚSi(Oalkyl)₃, —OC(O)N(H)Q⁴, —OC(S)N(H)Q⁴, —N(H)C(O)N(Q³)₂ and —N(H)C(S)N(Q³)₂;
Q³ and Q⁴ are each independently selected from H, alkyl, haloalkyl, heterocycloalkyl, cycloalkyl, aryl and benzyl; and
X⁻ is an anion.

2. The color conversion film of claim 1, wherein the UV curing process comprises using a mixture in propylene carbonate of 3,4-epoxycyclohexylmethyl 3,4-epoxycyclohexanecarboxylate and triarylsulfonium hexafluoroantimonate salts; polyether-modified polydimethylsiloxane and 3-ethyloxetane-3-methanol.

3. The color conversion film of claim 1, wherein the protective coating is prepared by an acetic anhydride surface treatment and/or a trimethylsilane surface treatment.

4. The color conversion film of claim 1, wherein the color conversion film is produced by at least one of a sol gel process and a UV curing process.

5. An LCD comprising at least one color conversion film of claim 1, wherein the LCD comprises a backlight unit comprising the backlight source and a LCD panel having the RGB color filters, wherein the at least one color conversion film is positioned in the LCD panel and is patterned with respect to a patterning of the RGB color filters to yield a spatial correspondence between film regions with R and G emission peaks and respective R and G color filter.

6. An LCD comprising at least one color conversion film of claim 1, wherein the LCD comprises a backlight unit comprising the backlight source and a LCD panel having the RGB color filters, wherein an intensity of the R and G emission peaks of the at least one color conversion film are adjusted to fine tune a white point of the LCD to be at a center of an expected line of deterioration of the intensity within given LCD specifications.

7. An LCD comprising at least one color conversion film of claim 1, wherein the LCD comprises a backlight unit comprising the backlight source and a LCD panel having the RGB color filters, wherein the RBF compounds in the film are at least partially self-assembled to at least partially provide polarized emission, and wherein the at least one color conversion film replaces at least one polarizer film in the LCD.

* * * * *